US011495486B2

(12) United States Patent
Avanzino et al.

(10) Patent No.: US 11,495,486 B2
(45) Date of Patent: Nov. 8, 2022

(54) INTEGRATED TOOL LIFT

(71) Applicant: Lam Research Corporation, Fremont, CA (US)

(72) Inventors: Paul Albert Avanzino, San Jose, CA (US); Jerrel K. Antolik, Livermore, CA (US); Daniel Arthur Brown, Pleasanton, CA (US); Jason Lee Treadwell, Gilroy, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/310,751

(22) PCT Filed: Feb. 21, 2020

(86) PCT No.: PCT/US2020/019333
§ 371 (c)(1),
(2) Date: Aug. 20, 2021

(87) PCT Pub. No.: WO2020/180505
PCT Pub. Date: Sep. 10, 2020

(65) Prior Publication Data
US 2022/0044958 A1 Feb. 10, 2022

Related U.S. Application Data

(60) Provisional application No. 62/826,829, filed on Mar. 29, 2019, provisional application No. 62/812,868, filed on Mar. 1, 2019.

(51) Int. Cl.
*H01L 21/68* (2006.01)
*H01L 21/687* (2006.01)
*H01L 21/67* (2006.01)

(52) U.S. Cl.
CPC .. *H01L 21/68742* (2013.01); *H01L 21/67161* (2013.01); *H01L 21/68* (2013.01)

(58) Field of Classification Search
CPC ......... H01L 21/68742; H01L 21/67161; H01L 21/68; H01L 21/6719; H01L 21/68707;
(Continued)

(56) References Cited

U.S. PATENT DOCUMENTS 7,186,314 B2 *   3/2007   Ishii ...................... H01P 5/1022
                                                 315/111.21
10,943,769 B2 *  3/2021   Taskar .............. H01J 37/32935
(Continued)

FOREIGN PATENT DOCUMENTS

JP   2012-012198 A   1/2012
JP   2013-229373 A   11/2013
(Continued)

OTHER PUBLICATIONS

International Search Report and Written Opinion dated Jun. 18, 2020 from PCT/US2020/019333.
(Continued)

*Primary Examiner* — Mohammed Shamsuzzaman
(74) *Attorney, Agent, or Firm* — Weaver Austin Villeneuve & Sampson LLP

(57) ABSTRACT

Semiconductor processing tools are provided that include an upper support framework, a plurality of semiconductor processing chambers arranged along a first axis, a linear guide system fixedly supported by the upper support framework and extending along a second axis substantially parallel to the first axis, and a carriage. Each chamber has a base portion fixedly mounted relative to the upper support framework and a removable top cover with one or more hoisting features. The carriage includes a hoist arm configured to pivot about a vertical axis that is substantially perpendicular
(Continued)

to the second axis, the carriage is configured to movably engage with the linear guide system and translate along the second axis relative to the linear guide system. The carriage and hoist arm are movable such that a hoist feature engagement interface of the hoist arm can be moved engage with hoisting features of any of the removable top covers.

37 Claims, 24 Drawing Sheets

(58) Field of Classification Search
CPC ......... H01L 21/67772; H01L 21/67706; H01L 21/67173; H01L 21/67242; H01L 21/67715; H01L 21/67721; H01L 21/67733; B65G 47/902; B65G 2201/02
See application file for complete search history.

(56) References Cited

U.S. PATENT DOCUMENTS

| | | | |
|---|---|---|---|
| 2006/0285945 A1* | 12/2006 | Hofmeister | H01L 21/67742 414/217 |
| 2007/0183871 A1* | 8/2007 | Hofmeister | H01L 21/67727 414/332 |
| 2012/0199065 A1* | 8/2012 | Wieting | H01L 21/67733 118/704 |
| 2019/0287837 A1* | 9/2019 | Ichinose | G03F 7/20 |

FOREIGN PATENT DOCUMENTS

| | | |
|---|---|---|
| JP | 6206748 B2 | 10/2017 |
| KR | 10-0408161 B1 | 12/2003 |
| KR | 10-1485862 B1 | 1/2015 |
| KR | 20-2015-0004131 U | 11/2015 |
| KR | 10-2016-0035377 A | 3/2016 |

OTHER PUBLICATIONS

International Preliminary Report on Patentability dated Sep. 16, 2021 in PCT/US2020/019333.
Korean Office Action dated Feb. 18, 2022, in Korean Patent Application No. 10-2021-7031616 with English machine translation.
Korean Office Action dated May 9, 2022, in Korean Patent Application No. 10-2021-7031616 with English machine translation.

* cited by examiner

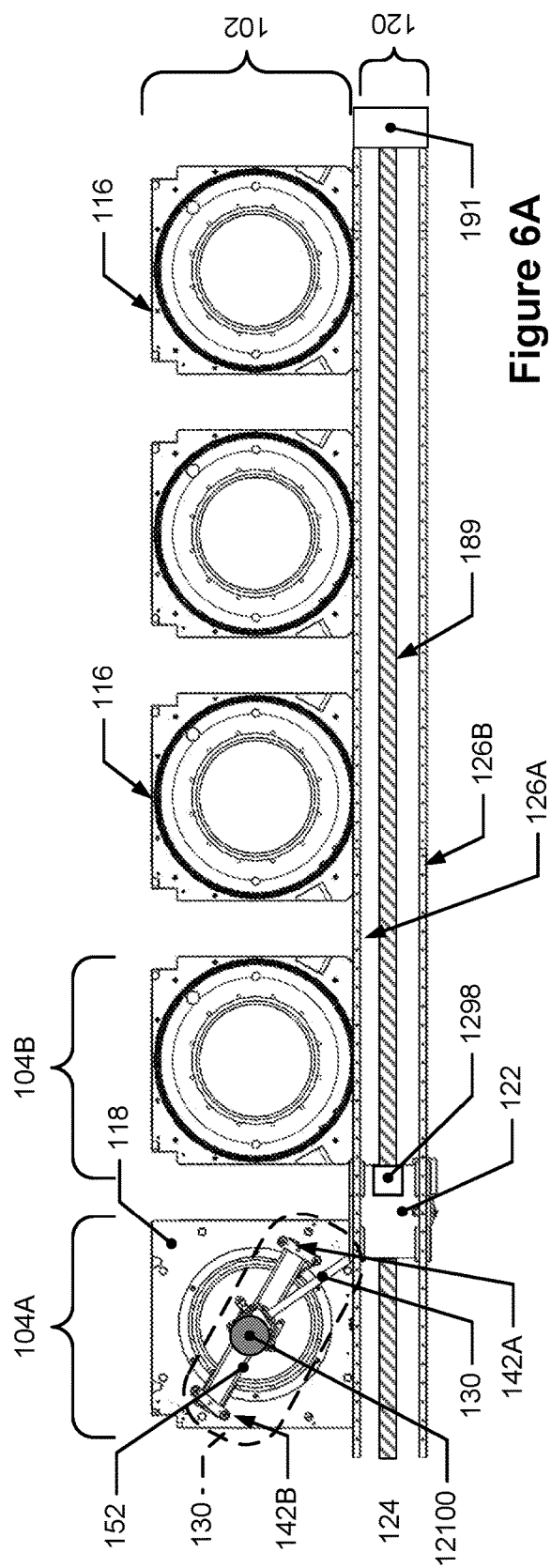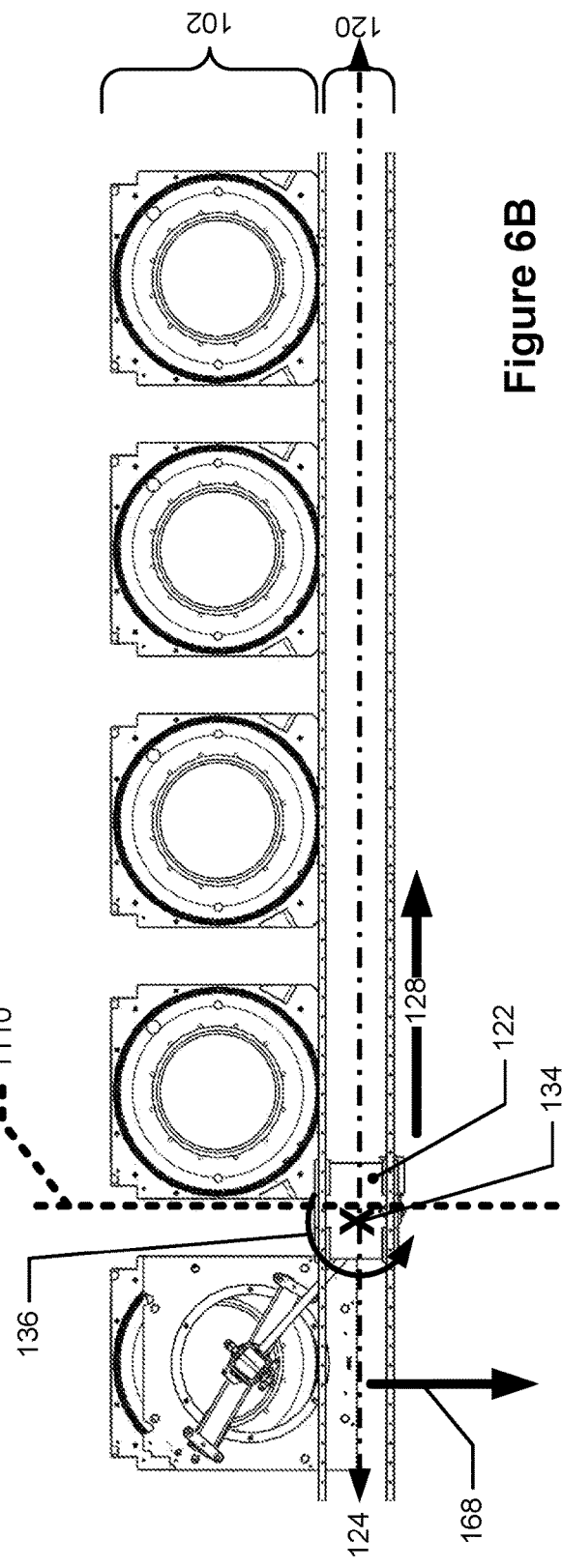

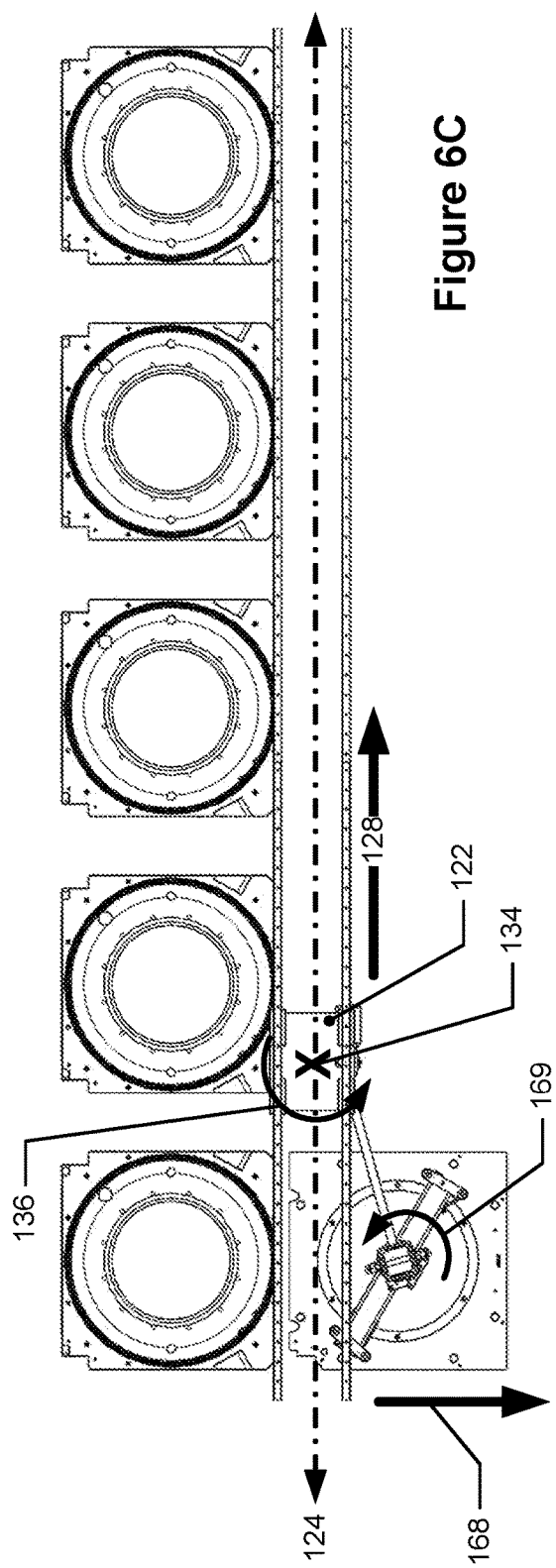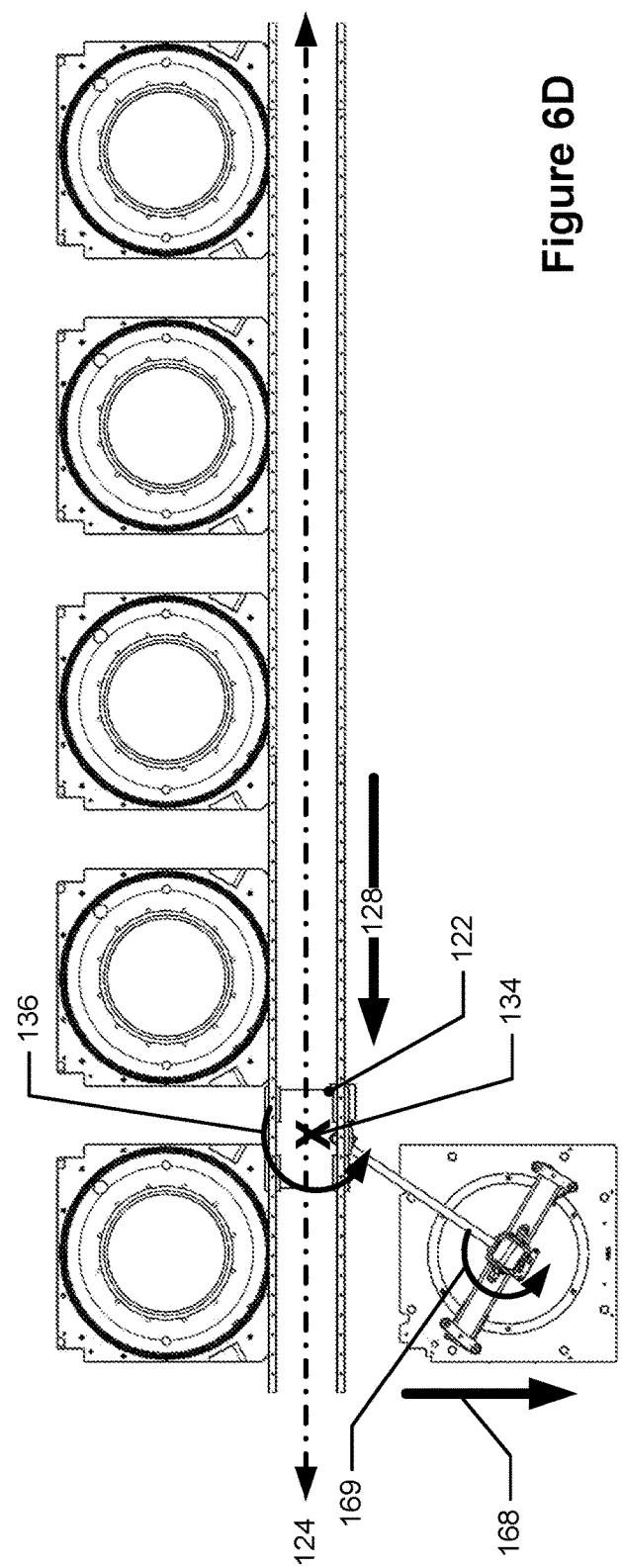

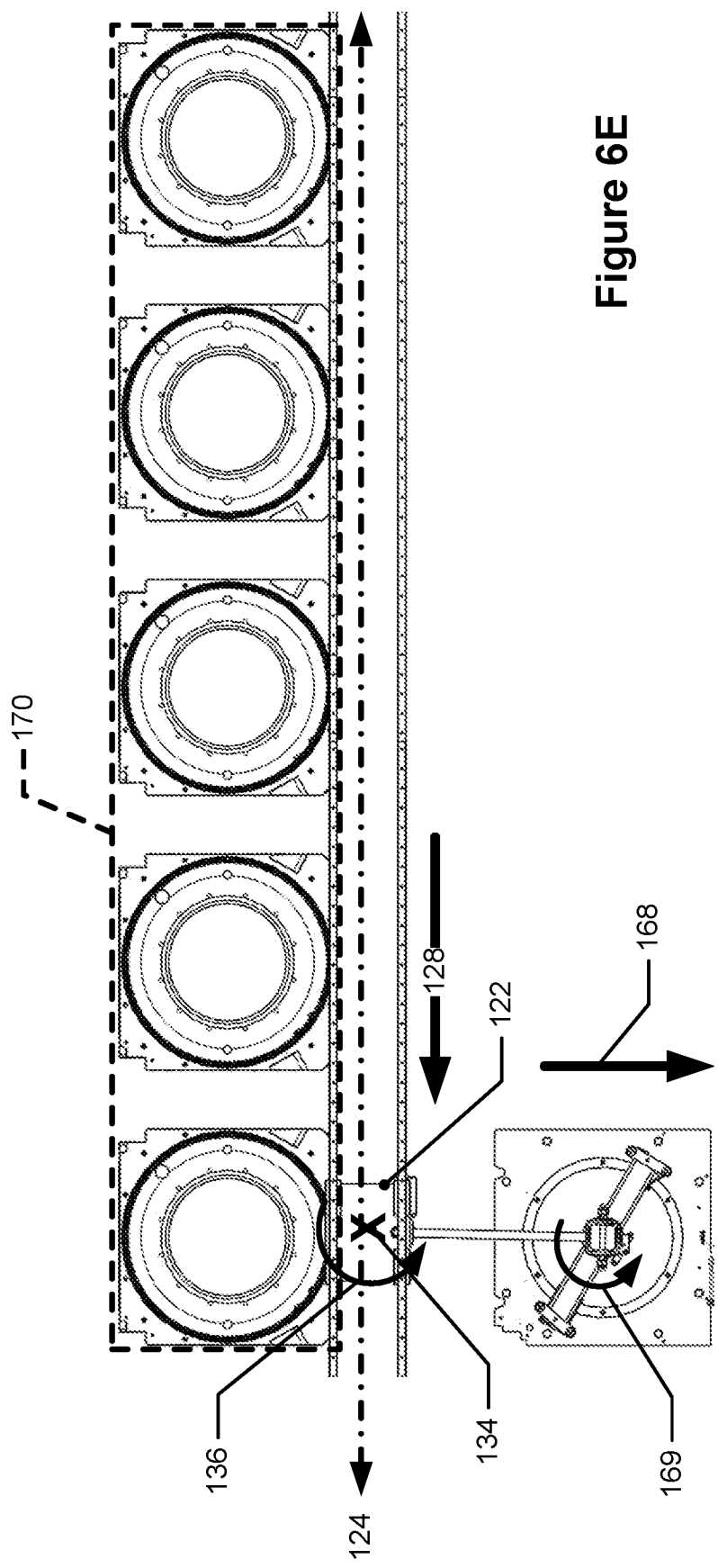

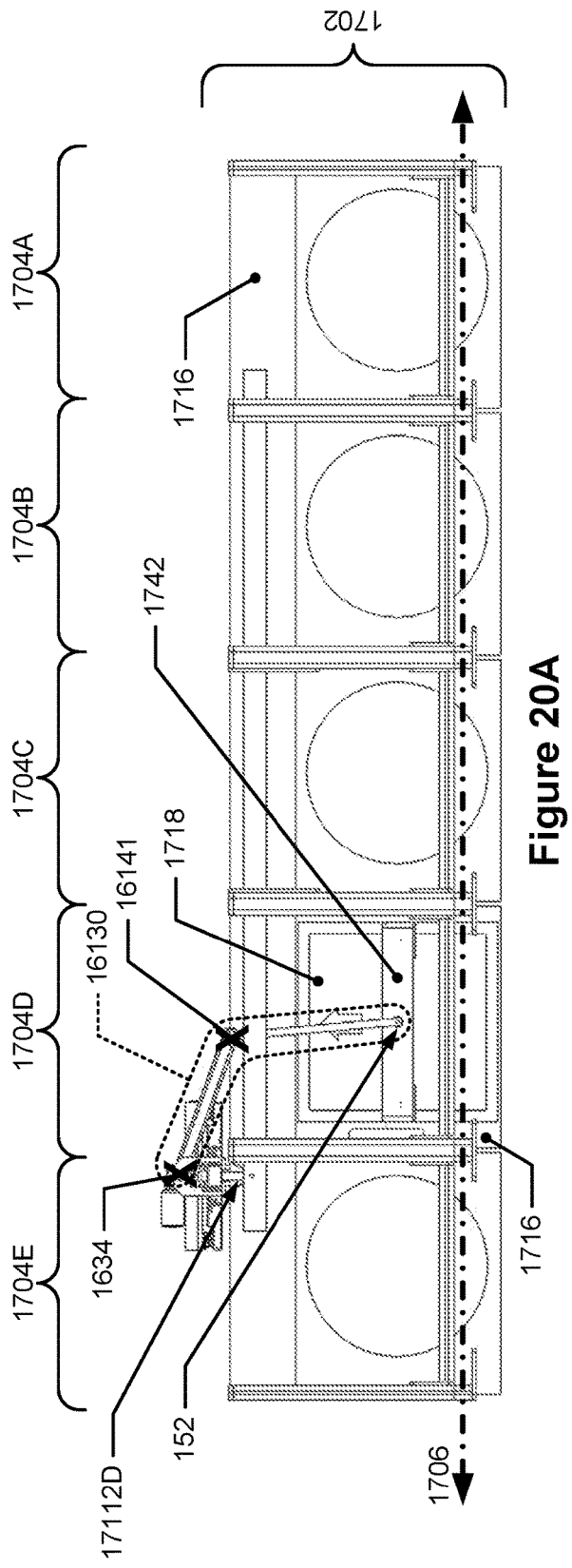
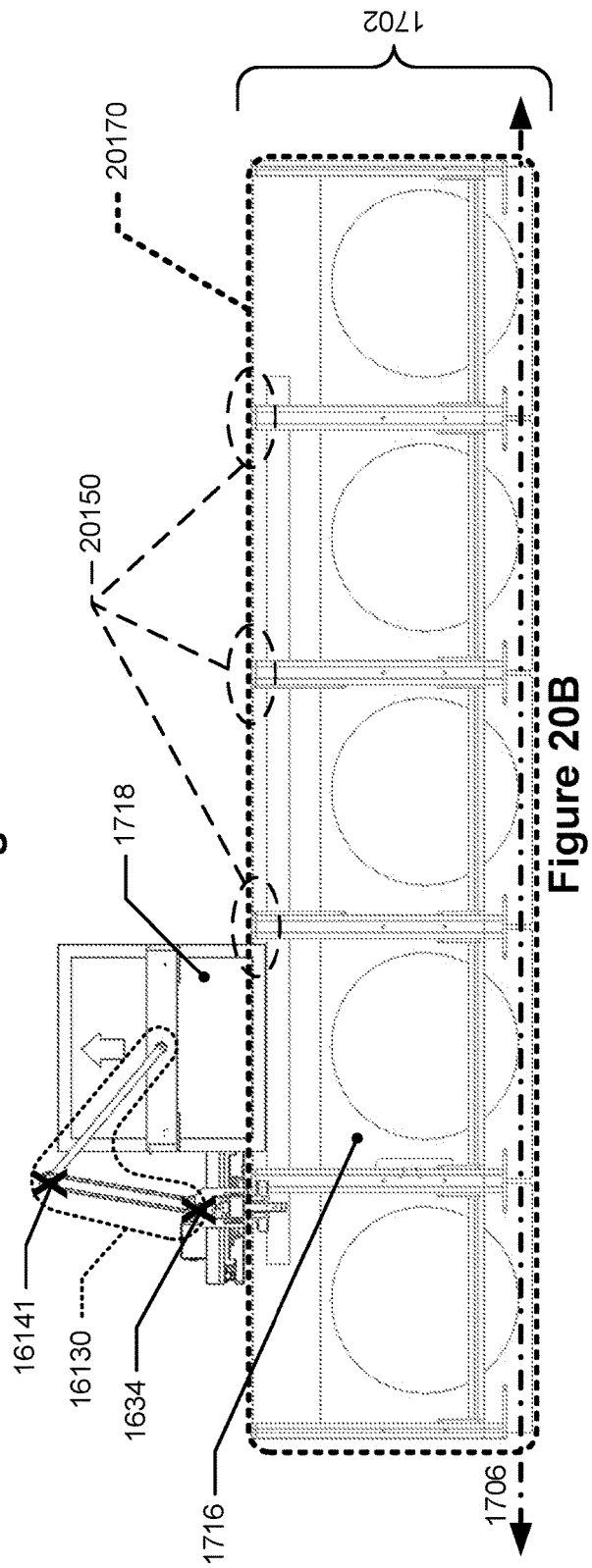

INTEGRATED TOOL LIFT

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Many semiconductor processing tools have large and heavy components that are removed during maintenance, servicing, and repair.

SUMMARY

Described herein are novel apparatuses and systems to move components of a semiconductor processing tool for maintenance, servicing, and repair. These tools may have multiple semiconductor processing chambers that are mounted, directly or indirectly, to a support framework of the tool and that are arranged side by side in a linear array. While many components of semiconductor processing chambers are traditionally lifted and moved using conventional hoisting equipment that is separate from the tool and fully supported by the floor, e.g., a crane or forklift, some tools described herein have hoisting systems for moving removable components that are integrated into the tool itself. In some implementations, hoisting systems may include a linear guide system directly or indirectly mounted to the support framework and extending along the linear array of semiconductor processing chambers. Connected to and supported by the linear guide system may be a moveable carriage that has a moveable hoist arm that can connect with, lift, and move components of any of the semiconductor processing chambers; together, the carriage and its hoist arm can be moved along the linear guide system so that the hoist arm can connect with and move the removable components of any of the semiconductor processing chambers. The hoist arm and the removable components may have complementary connecting features that allow the hoist arm to connect with and lift the removable components. When the carriage lifts the removable component, the weight of that removable component is fully transferred through the hoist arm, the carriage, and the linear guide system to the support framework. In some embodiments, the carriage may hang from the linear guide system, such as below the linear guide system or to the side of the linear guide system.

In some implementations, a person may move the carriage along the linear guide system and also move the hoist arm into position to connect with a removable component. In some such implementations, various aspects of the carriage may be powered by a motor, such as a lifting mechanism on the carriage to raise and lower the hoist arm. In some other embodiments, motors and other movement mechanisms may move the carriage along the linear guide system and/or move the hoist arm horizontally and/or vertically. A controller having a processor and a memory can control the movement of the carriage and hoist arm.

In some alternate embodiments, the tool may have a different hoisting system than the carriage and linear guide system. These alternate embodiments use a detachable hoist system that connects to one or more attachment points which are connected to the support framework. This detachable hoist system is positioned on and supported by the floor and has a vertical member that is connected to an attachment point on the support framework in order to provide lateral support to the vertical member. The detachable hoist system also includes a hoist arm moveably attached to the vertical member that can, once the vertical member is connected to the one or more attachment points, connect with and lift a removable component from one of the semiconductor processing chambers. In some embodiments, the detachable hoist system, except for its hoist arm, is stationary once connected to the one or more attachment points while in some other embodiments, the detachable hoist system and the attachment point to which it is connected are simultaneously moveable along the array of semiconductor processing chambers.

In some embodiments a semiconductor processing tool may be provided. The semiconductor processing tool may include an upper support framework, a first plurality of semiconductor processing chambers arranged along a first axis, a first linear guide system fixedly supported by the upper support framework and extending along a second axis substantially parallel to the first axis, and a first carriage. Each semiconductor processing chamber may have a base portion fixedly mounted relative to the upper support framework and may have a removable top cover with one or more hoisting features, the first carriage may include a first hoist arm with one or more links, the first hoist arm may be configured to pivot about a vertical axis that is substantially perpendicular to the second axis, the first carriage may be configured to movably engage with the first linear guide system and to translate along the second axis relative to the first linear guide system, the first hoist arm may include a hoist feature engagement interface configured to engage with the hoisting features of any of the removable top covers of the first plurality of semiconductor processing chambers, and the first carriage and first hoist arm may be movable such that the hoist feature engagement interface can be moved so as to be engaged with the hoisting features of any of the removable top covers of the first plurality of semiconductor processing chambers.

In some embodiments, the first carriage may further include a first vertical translation system configured to cause the first hoist arm to translate vertically, relative to the first linear guide system, in a direction parallel to the vertical axis.

In some such embodiments, the semiconductor processing tool may further include a power source. The first vertical translation system may include a motor configured to provide a first mechanical input to the first vertical translation system, the first mechanical input may cause the first hoist arm to translate vertically in the direction parallel to the vertical axis, the first carriage may further include an electrical control cable that is connected to the power source, routed along the first hoist arm, and terminated by a connector, each removable top cover may further includes an electrical interface configured to be connectable with the connector, and the electrical control cable may be of a length that the connector and the hoist feature engagement interface of the first hoist arm are only simultaneously engageable with the electrical interface and hoisting features, respectively, of a single one of the semiconductor processing chambers at a time.

In some further such embodiments, the semiconductor processing tool may further include a controller having one or more processors and one or more non-transitory memory devices that store instructions for controlling the one or more processors to receive information regarding an operational status of each semiconductor processing chamber, and cause a first actuation signal to cause the first vertical translation system to operate to be provided by the electrical interface for one of the semiconductor processing chambers only when the information regarding operational status for that semiconductor processing chamber indicates that that semiconductor processing chamber is in a personnel-safe condition.

In some further such embodiments, the semiconductor processing tool may further include a first carriage position sensor configured to generate data about the position of the first carriage along the first linear guide system and a controller comprising one or more processors and one or more non-transitory memory devices that store instructions for controlling the one or more processors to determine, based on the data generated by the first carriage position sensor, the position of the first carriage along the first linear guide system, and cause, based on the determination of the position of the first carriage, only the electrical interface of one semiconductor processing chamber of the first plurality of semiconductor processing chambers at a time to be powered.

In some further embodiments, the semiconductor processing tool may further include an arm position sensor configured to generate data about the position the first hoist arm relative to the semiconductor processing chambers of the first plurality of semiconductor processing chambers, and the one or more non-transitory memory devices stores further instructions for controlling the one or more processors to determine, based on the data generated by the arm position sensor, the position of the first hoist arm with respect to each of the semiconductor processing chambers of the first plurality of semiconductor processing chambers, and cause, based on the determination of the position of the first hoist arm and on the determination of the position of the first carriage, only the electrical interface of the semiconductor processing chamber of the first plurality of semiconductor processing chambers that is closest to the hoist feature engagement interface of the first hoist arm to be powered.

In some further such embodiments, the one or more non-transitory memory devices may store further instructions for controlling the one or more processors to cause the first hoist arm to move only on a first side of a vertical plane that passes through the first carriage, is parallel to the vertical axis, and is perpendicular to the second axis.

In some further such embodiments, the semiconductor processing tool may further include an engagement sensor configured to generate data about whether the hoist feature engagement interface of the first hoist arm is engaged with the hoisting features of one of the removable top covers, and a controller comprising one or more processors and one or more non-transitory memory devices that store instructions for controlling the one or more processors to determine, based on the data generated by the engagement sensor, whether the hoist feature engagement interface of the first hoist arm is engaged with the hoisting features of one of the removable top covers of the first plurality of semiconductor processing chambers, and cause, in response to determining that the hoist feature engagement interface is engaged with the hoisting features of one of the removable top covers of the first plurality of semiconductor processing chambers, only the electrical interface of the semiconductor processing chamber of the first plurality of semiconductor processing chambers that contains that removable top cover to be powered.

In some further such embodiments, the removable top cover may receive power from the power source through the electrical cable.

In some such embodiments, the first carriage may further include a first interlock that is configured to engage with the hoisting features of any of the removable top covers of the first plurality of semiconductor processing chambers, and prevent, when not engaged with the hoisting features of one of the removable top covers of the first plurality of semiconductor processing chambers, the first vertical translation system from causing the first hoist arm to translate vertically.

In some such embodiments, the first vertical translation system may be a linear ball screw actuator, a hydraulic actuator, a rack-and-pinion actuator, and a cable hoist.

In some such embodiments, the semiconductor processing tool may further include a controller comprising one or more processors and one or more non-transitory memory devices. The first linear guide system may further include a carriage translation system that is configured to cause the first carriage to translate along the second axis, the first carriage may further include a hoist arm movement system that is configured to move the first hoist arm in a plane perpendicular to the vertical axis, and the one or more non-transitory memory devices may store instructions for controlling the one or more processors to cause the carriage translation system to move the first carriage along the second axis, cause the hoist arm movement system and the first vertical translation system to move the first hoist arm to engage the hoist feature engagement interface with the hoisting features of one of the removable top covers of the first plurality of semiconductor processing chambers, cause, when the hoist feature engagement interface is engaged with the hoisting features of one of the removable top covers, the first vertical translation system to translate that removable top cover vertically, and cause, when the hoist feature engagement interface is engaged with the hoisting features of one of the removable top covers, the hoist arm movement system to translate that removable top cover in the plane perpendicular to the vertical axis.

In some further such embodiments, the one or more non-transitory memory devices may store further instructions for controlling the one or more processors to cause, when the hoist feature engagement interface is engaged with the hoisting features of one of the removable top covers, the hoist arm movement system and the first vertical translation system to move the first hoist arm to disengage the hoist feature engagement interface from the hoisting features of the that removable top cover.

In some further such embodiments, the one or more non-transitory memory devices may store further instructions for controlling the one or more processors to cause, when the hoist feature engagement interface is engaged with the hoisting features of one of the removable top covers, the carriage translation system and the hoist arm movement system to translate that removable top cover in the plane perpendicular to the vertical axis.

In some embodiments, the semiconductor processing chambers in the first plurality of semiconductor processing chambers may all located within a tool envelope, and the first hoist arm may be movable such that any of the removable top covers of the first plurality of semiconductor processing chambers can be moved outside the tool envelope.

In some embodiments, the first linear guide system may further include a first rail and a second rail that are parallel to each other and offset from each other in a direction parallel to the vertical axis, and the first carriage may be configured to simultaneously engage with the first rail and the second rail, and to translate along the second axis relative to the first linear guide system while simultaneously engaged with the first rail and the second rail.

In some such embodiments, the first carriage may further include a first vertical translation system configured to cause the first hoist arm to translate vertically, relative to the first linear guide system, in a direction parallel to the vertical axis below the first linear guide system and above the base portions of the first plurality of semiconductor processing chambers.

In some further such embodiments, the first vertical translation system may be further configured to cause the first hoist arm to translate vertically above the first linear guide system.

In some embodiments, the first linear guide system may be vertically offset above the first plurality of semiconductor processing chambers in a direction parallel to the vertical axis, and the first carriage may be vertically offset underneath the first linear guide system.

In some embodiments, the hoist feature engagement interface may be connected with a distal end of the first hoist arm using a joint configured to allow the hoist feature engagement interface to rotate about two or more axes that are perpendicular to the vertical axis.

In some such embodiments, the joint may be a spherical joint.

In some such embodiments, the joint may be further configured to allow the hoist feature engagement interface to rotate about an axis parallel to the vertical axis.

In some embodiments, the hoisting feature of each removable top cover may include a pair of saddle posts, each saddle post may include a pair of vertical riser rods and a saddle plate capping, and spanning between, the vertical riser rods, each saddle plate may include a first mechanical interface feature, the saddle posts of each hoisting feature may be positioned such that the first mechanical interface features are spaced apart from each other by a first distance, the hoist feature engagement interface may include a beam with two second mechanical interface features spaced apart by the first distance, and each first mechanical interface feature may be complementary to one of the second mechanical interface features.

In some embodiments, each semiconductor processing chamber of the first plurality of semiconductor processing chambers may include a removable component that may be a radio frequency (RF) generator, a pump, and a cryopump. Each removable component may include one or more second hoisting features, the hoist feature engagement interface of the first hoist arm may be further configured to engage with the second hoisting features of any of the removable components of the first plurality of semiconductor processing chambers, and the first carriage and first hoist arm may be movable such that the hoist feature engagement interface can be moved so as to be engaged with the second hoisting features of any of the removable components of the first plurality of semiconductor processing chambers.

In some embodiments, the first hoist arm may include a linear section that is perpendicular to the vertical axis and that includes the hoist feature engagement interface.

In some such embodiments, the first hoist arm may include a pivot section where the first hoist arm is configured to pivot about the vertical axis, and the first hoist arm may include an angled section that spans between the pivot section and the linear section, and that is oriented at an oblique angle with respect to the vertical axis.

In some embodiments, the first plurality of semiconductor processing chambers may include two semiconductor processing chambers.

In some such embodiments, the first plurality of semiconductor processing chambers may include three semiconductor processing chambers.

In some further such embodiments, the first plurality of semiconductor processing chambers includes five semiconductor processing chambers.

In some embodiments, the semiconductor processing tool may further include a second plurality of semiconductor processing chambers arranged along a third axis substantially parallel to and offset from the first axis, an interior region located in between the first plurality of semiconductor processing chambers and the second plurality of semiconductor processing chambers, a second linear guide system fixedly supported by the upper support framework and extending along a fourth axis substantially parallel to the third axis, and a second carriage. The first linear guide system and the second linear guide system may be positioned outside of the interior region, each semiconductor processing chamber of the second plurality of semiconductor processing chambers may have a second base portion fixedly mounted relative to the upper support framework and has a second removable top cover with one or more second hoisting features, the second carriage may include a second hoist arm with one or more links, the second hoist arm may be configured to pivot about a second vertical axis that is perpendicular to the fourth axis, the second carriage may be configured to moveably engage with the second linear guide system and to translate along the fourth axis relative to the second linear guide system, the second hoist arm may include a second hoist feature engagement interface configured to engage with the second hoisting features of any of the second removable top covers of the semiconductor processing chambers of the second plurality of semiconductor processing chambers, and the second carriage and the second hoist arm may be movable such that the second hoist feature engagement interface can be moved so as to be engaged with the hoisting features of any of the second removable top covers of the semiconductor processing chambers of the second plurality of semiconductor processing chambers.

In some such embodiments, the base portions of the first plurality of semiconductor processing chambers, the second base portions of the second plurality of semiconductor processing chambers, and the interior region may all be located within a second envelope, the first hoist arm may be movable such that the removable top cover of any of the first plurality of semiconductor processing chambers can be moved outside the second envelope, and the second hoist arm may be movable such that the second removable top cover of any of the second plurality of semiconductor processing chambers can be moved outside the second envelope.

In some such embodiments, the second removable top covers may be of the same type as the removable top covers, the second hoist feature engagement interface may be of the same type as the hoist feature engagement interface, and the second hoisting features may be of the same type as the hoisting features.

In some embodiments, the semiconductor processing tool may further include a bellows that creates a seal at an interface of the first carriage and the first linear guide system when the first carriage is engaged with the first linear guide system.

In some embodiments, the semiconductor processing tool may further include a second carriage. The second carriage may include a second hoist arm with one or more links, and the second hoist arm is configured to pivot about a second vertical axis that is perpendicular to the second axis, the second carriage may be configured to movably engage with the first linear guide system and to translate along the second axis relative to the first linear guide system, the second hoist arm may include a second hoist feature engagement interface configured to engage with the hoisting features of any of the removable top covers of the first plurality of semiconductor processing chambers, the second carriage and the second hoist arm may be movable such that the second hoist feature engagement interface of the second hoist arm can be moved so as to be engaged with the hoisting features of any of the removable top covers of the first plurality of semiconductor processing chambers, and the first linear guide system may be further configured so that the first carriage and the second carriage can be simultaneously engaged to the first linear guide system and moveable along the second axis.

In some embodiments, the removable top cover may not be a substrate.

In some embodiments, the first hoist arm may not be configured to support a substrate.

In some such embodiments, the hoist feature engagement interface may not be configured to support a substrate.

In some embodiments, a semiconductor processing tool may be provided. The semiconductor processing tool may include a support framework, a first plurality of semiconductor processing chambers arranged along a first axis, a first attachment point connected to the support framework, and a first detachable hoist system. Each semiconductor processing chamber may have a base portion fixedly mounted relative to the support framework and has a removable top cover with one or more hoisting features, the first detachable hoist system may include a vertical member with a top end having a complementary attachment point and with a bottom end having a movement mechanism, the complementary attachment point may be detachably connected to first attachment point, the movement mechanism may be supported by a floor, the first detachable hoist system may further include a hoist arm connected to the vertical member and having one or more links, the hoist arm may be configured to pivot about a vertical axis that is substantially perpendicular to the first axis, and the hoist arm may include a hoist feature engagement interface configured to engage with the hoisting features of any of the removable top covers of the first plurality of semiconductor processing chambers.

In some embodiments, the first detachable hoist system may further include a vertical translation system configured to cause the hoist arm to translate vertically, relative to the support framework, in a direction parallel to the vertical axis.

In some such embodiments, the first vertical translation system may include a motor configured to provide a first mechanical input to the first vertical translation system, wherein the first mechanical input causes the hoist arm to translate along the vertical member.

In some such embodiments, the first vertical translation system may be configured to move, as a unit and together with the hoist arm, along the vertical member.

In some embodiments, the movement mechanism may include collapsible wheels.

In some embodiments, a semiconductor processing tool may be provided. The semiconductor processing tool may include a support framework having an upper attachment point, a lower attachment point vertically offset below the upper attachment point, a first plurality of semiconductor processing chambers arranged along a first axis, and a detachable hoist system. Each semiconductor processing chamber may have a base portion fixedly mounted relative to the support framework and has a removable component with one or more hoisting features, the detachable hoist system may include a vertical member with a top end having an elevated attachment point, a bottom end having a bottom attachment point, and a movement mechanism, the elevated attachment point may be detachably connected to upper attachment point, the bottom attachment point may be detachably connected to the lower attachment point, the detachable hoist system may further include a hoist arm having one or more links and that is configured to pivot about a vertical axis that is substantially perpendicular to the first axis, and a vertical translation system configured to cause the hoist arm to translate vertically, relative to the support framework, in a direction parallel to the vertical axis. The hoist arm may include a hoist feature engagement interface configured to engage with the hoisting features of any of the removable components of the first plurality of semiconductor processing chambers.

In some embodiments, the vertical translation system may include a motor configured to provide a first mechanical input to the first vertical translation system, wherein the first mechanical input causes the hoist arm to translate in the direction parallel to the vertical axis.

In some such embodiments, the semiconductor processing tool may further include a power source. The detachable hoist system may further include an electrical control cable that is connected to the power source, routed along the hoist arm, and terminated by a connector, each removable component may further include an electrical interface configured to be connectable with the connector, and the electrical control cable may be of a length that the connector and the hoist feature engagement interface of the hoist arm are only simultaneously engageable with the electrical interface and hoisting features, respectively, of a single one of the semiconductor processing chambers at a time.

In some further such embodiments, the semiconductor processing tool may further include a controller comprising one or more processors and one or more non-transitory memory devices that store instructions for controlling the one or more processors to receive information regarding an operational status of each semiconductor processing chamber, and cause a first actuation signal to cause the vertical translation system to operate to be provided by the electrical interface for one of the semiconductor processing chambers only when the information regarding operational status for that semiconductor processing chamber indicates that that semiconductor processing chamber is in a personnel-safe condition.

In some further such embodiments, the removable component may receive power from the power source through the electrical cable.

In some such embodiments, the vertical translation system may be a linear ball screw actuator, a hydraulic actuator, a rack-and-pinion actuator, and a cable hoist.

In some embodiments, the detachable hoist system may further includes a first interlock that is configured to engage with the hoisting features of any of the removable components of the first plurality of semiconductor processing chambers, and prevent, when not engaged with the hoisting features of one of the removable top covers of the first plurality of semiconductor processing chambers, the first vertical translation system from causing the first hoist arm to translate vertically.

In some embodiments, the movement mechanism may include four wheels.

In some embodiments, the movement mechanism may include a collapsible set of wheels.

In some embodiments, the first vertical translation system may be configured to move, as a unit and together with the hoist arm, along the vertical member.

In some such embodiments, the vertical member may further include a slide rail along which the first vertical translation system is configured to move.

In some embodiments, the movement mechanism may be not be supported by a floor when connected to the lower attachment point and the upper attachment point.

In some embodiments, the movement mechanism may be supported by a floor when connected to the lower attachment point and the upper attachment point.

In some embodiments, the lower attachment point may be vertically offset below the base portions of the plurality of processing chambers.

In some embodiments, the support framework may further include a plurality of upper attachment points, the tool may further include a plurality of lower attachment points offset below the plurality of upper attachment points, the plurality of semiconductor processing chambers may include N processing chambers, the plurality of upper attachment points may include N–1 upper attachment points, and the plurality of lower attachment points may include N–1 lower attachment points.

In some embodiments, the hoist arm may further include three or more links, a double shoulder joint, and a double elbow joint.

In some embodiments, the removable component may not be a substrate.

In some embodiments, the hoist arm may not be configured to support a substrate.

In some such embodiments, the hoist feature engagement interface may not be configured to support a substrate.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIGS. 6A-6E depict a movement sequence of an example removable component of the first example portion of the example semiconductor tool of FIG. 2.

FIGS. 20A and 20B depict a movement sequence of an example removable component by the second example detachable hoist system.

DETAILED DESCRIPTION

Figure 1:
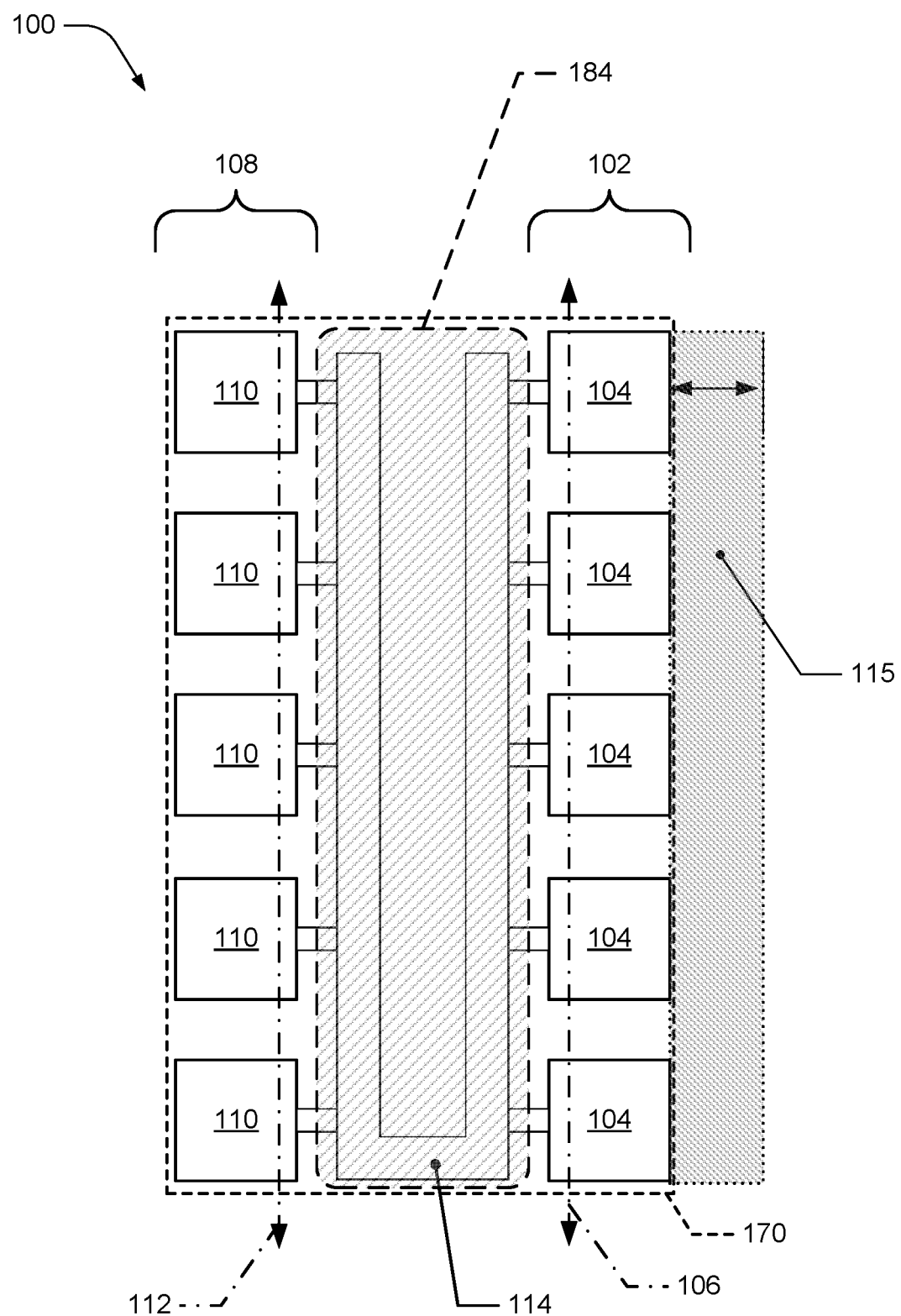
FIG. 1 depicts a top view schematic of an example semiconductor processing tool that includes two pluralities of semiconductor processing chambers.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor processing tools typically have at least one processing chamber in which the processing of one or more substrates occurs, along with other component parts that enable this processing. Example substrate processing includes the deposition of material onto the substrate using chemical vapor deposition (CVD), plasma enhanced chemical vapor deposition (PECVD), and atomic layer deposition (ALD), as well as the patterning and etching of various materials, including conductors, semiconductors, and dielectrics using, for instance, atomic layer etching (ALE). In this application, the terms "semiconductor wafer," "wafer," "substrate," "wafer substrate," and "partially fabricated integrated circuit" are used interchangeably. For example, operations for depositing films on semiconductor substrates may be performed in a substrate processing apparatus that has a processing chamber with a single substrate holder in an interior volume which may be maintained under vacuum by a vacuum pump. The substrate holder, e.g., pedestal, may have a heating element which may heat the pedestal and substrate. Also fluidically coupled to the chamber for the delivery of (for example) film precursors, carrier and/or purge and/or process gases, secondary reactants, etc. is a gas delivery system and a showerhead. Equipment for generating a plasma within the processing chamber may also be included in the apparatus, such as an RF power supply and matching network for powering a plasma. The plasma energy may be controlled (e.g., via a system controller having appropriate machine-readable instructions) by controlling one or more of a process station pressure, a gas concentration, an RF source power, an RF source frequency, and a plasma power pulse timing. The RF power supply may provide RF power of any suitable frequency and may be configured to control high- and low-frequency RF power sources independently of one another and may include frequencies between 50 kHz and 500 kHz and between 1.8 MHz and 2.45 GHz.

While many substrate processing apparatuses use a single processing chamber, when time-consuming film deposition operations are involved, it may be advantageous to increase substrate processing throughput by performing multiple substrate operations in parallel on multiple substrates. For this purpose, a multi-station substrate processing apparatus may have a single substrate processing chamber with multiple substrate process stations within a single interior volume defined by the walls of the processing chamber. Some other multi-station substrate processing apparatuses may have multiple processing chambers, sometimes referred to as a "cluster tool". Cluster tools may have processing chambers with multiple stations, such as 2, 3 or 4 stations in each processing chamber. Similarly, a cluster tool may have 2, 3, 4, 5, 6, 7, 8, 9, 10, 11, 12, 13, 14, 15, or 16, or more processing chambers.

Various efficiencies may also be achieved by using a tool that includes multiple chambers, i.e., a cluster tool, with respect to equipment cost and operational expenses. For instance, a single vacuum pump may be used to create a single high-vacuum environment for two or more processing chambers and it may also be used to evacuate spent process gases, etc. with respect to the two or more chambers. Depending on the embodiment, the processing chambers may share the same gas delivery system and certain elements of the plasma generator equipment may be shared amongst processing chambers (e.g., power supplies). In some cluster tools, multiple processing chambers are connected to a wafer transport system as well as to other components for performing deposition, etching, or other operations, such as the vacuum pumps and gas delivery systems. The wafer transport systems may include a robot arm with one or more end effectors configured to pick up and transport a wafer within the tool, including into and out of the processing chambers and into and out of a wafer container, such as a cassette or a Front Opening Unified Pod ("FOUP"). A single cluster tool may be able to simultaneously perform multiple processes in multiple chambers while sharing some of the operational systems, such as the gas delivery system or power generators.

Various efficiencies, such as space and throughput, may also be gained by using a cluster tool. Generally speaking, multiple cluster tools are positioned on a floor of a semiconductor Fabrication Plant or Facility ("Fab"). However, the positioning of the tools on the floor relative to each other is subject to numerous constraints, such as electrical clearance areas and service areas between the tools. Service areas for a tool may include the area required to remove an element of a tool (e.g., a pump, a top cover of a processing chamber), perform maintenance on the tool, add or replace parts of the tool, access areas of the tool, inspect the tool, and may be defined, at least in part, according to ergonomic or other industry standards, such as to meet OSHA (Occupational Safety and Health Administration) requirements; the electrical clearance area may include the area required for the safety of persons or equipment, and the area required to prevent electrical interference between one or more elements of neighboring tools.

The multiple chambers of each cluster tool may also be arranged to maximize the number of chambers positioned on a Fab floor which in turn may enable higher throughput of processed substrates. For instance, cluster tools may be tightly packed such that their components are positioned closely to each other which results in limited space and clearance between components. Tightly packaging the components of cluster tools presents challenges for performing tool maintenance and servicing, such as limiting the ability to access and move components of the tool which may be required for numerous maintenance and servicing operations. For many tightly packed tools, the positioning and arrangement of the tool components prevents traditional lifting mechanisms from accessing and moving the components. For example, this access may be blocked by components closely mounted side-by-side, by components stacked and mounted above each other, and by support components of the tool such as a support frame. The tighter the arrangement, the more limited the space is for access to, and movement of, a tool's components. In some instances, one or more components of the tool must be moved in order to allow the traditional lifting mechanisms access and clearance to connect with, lift, and move one component of the tool. For instance, removing a top cover of a processing chamber is generally required to inspect, service, clean, repair, and maintain internal elements of that processing chamber. For some tightly packed tools, some traditional lift mechanisms are unable to reach the top cover without the removal of other components surrounding the top cover, such as a heavy RF generator mounted above the top cover. Even if there is some access to the top cover, a support frame may further block traditional lifting mechanisms from reaching the top cover.

Similarly, the tool may not have sufficient space over, below, or within the tool to allow traditional lifting mechanisms access to components of the tool. For example, some traditional lift mechanisms are supported on the floor by long horizontal support legs that may slide under the semiconductor processing tool (similar to how a pallet jack may slide under a shipping pallet) and hoist using a lift arm or arms, but some tightly packed tools may not have sufficient space to receive the support legs or lift arms of such a mechanism that is necessary for such a mechanism to access and move the removable component.

Furthermore, the footprint of some traditional lifting mechanisms may adversely impact how close tools can be positioned to each other, i.e., the separation distance between tools. For example, some tools may be required to be separated by a first minimum distance which provides for all of the sufficient clearance areas and thus enables them to be positioned as close as possible and maximize the Fab floor space. But some traditional lifting mechanisms that are moved on and supported by the floor may have a footprint area which may be larger than the first minimum distance. In these instances, the tools may have to be separated by a distance larger than the first minimum distance in order to allow these traditional lifting mechanisms to move and operate, thereby decreasing the spacing efficiency of the tools on the Fab floor.

These traditional lifting mechanisms may also require additional time and labor to access and move a tool's components, assuming that they can even access and move a tool's components at all. Additionally, when other components need to be move out of the way to access a component, the moving, uninstalling, and reinstalling of these other components may require additional realignment and recalibration of those components. This additional time and labor for regular and necessary maintenance and servicing causes undesirable downtime of the tool. Accordingly, it is desirable to have a tool with a lifting mechanism that can easily, quickly, and efficiently access components of the tool without requiring an undesirable amount of time, labor, and tool downtime.

Described herein are novel apparatuses and systems to move components of a semiconductor processing tool, or cluster tool, all of which may be referred to herein as a tool. In some embodiments, features configured to move components of the tool are integrated into the tool itself. FIG. 1 depicts a top view schematic of an example semiconductor processing tool that includes two pluralities of semiconductor processing chambers. As can be seen in FIG. 1, tool 100 includes a first plurality 102 of semiconductor processing chambers that has five semiconductor processing chambers 104 which are arranged along a first axis 106, and a second plurality 108 of semiconductor processing chambers includes five processing chambers 110 that are also arranged along an axis 112 that is substantially parallel to the first axis 106. "Substantially" is used herein because, in practice, axes or other elements may not be exactly aligned; in this instance substantially means that these axes may be exactly parallel to each other, but may also be within +/−10 degrees, +/−5 degrees, or +/−1 degree of parallel to each other, for instance. Although each plurality of semiconductor processing chambers includes five processing chambers, each plurality of semiconductor processing chambers may have two, three, four, five, six, or more processing chambers, for instance. The tool 100 also includes an upper support framework 114 to which a portion of each of the semiconductor processing chambers 104 and 110 may be fixedly mounted. When one item is "fixedly mounted" to another item, this means that the item is mounted to the other item in a fixed position relative to the other item, either directly or through one or more intervening components, e.g., support brackets. For example, a portion of each of the semiconductor processing chambers 104 and 110 are fixedly mounted to the upper support framework 114 such that these portions are fixed in their respective positions relative to the upper support framework 114. Other portions of the semiconductor processing chambers 104 may be intended to be removable/movable relative to the upper support framework 114 during normal servicing operations, as will be discussed further below.

As described above, the tool 100 has a service area 115 around its footprint in which portions of other tool are not to be positioned; a similar service area may exist on the opposite side of the tool 100 as well (although this is not shown). This service area 115 may also be considered a separation distance between other tools which enables personnel and equipment to be moved between tools. Some embodiments of the tools described herein cause little to no increase of the tool's static footprint.

The tool 100 may also include a linear guide system and a carriage that are configured to facilitate and enable the removal and movement of removable components of the semiconductor processing chambers. As discussed in more detail below, in some implementations the linear guide system may be fixedly connected to the support framework, the carriage may be movably connected to the linear guide system and configured to movably connect with removable components of the semiconductor processing chambers, which enables the carriage to translate along the linear guide system to access, connect with, and move the removable components of the semiconductor processing chambers.

Figure 2:
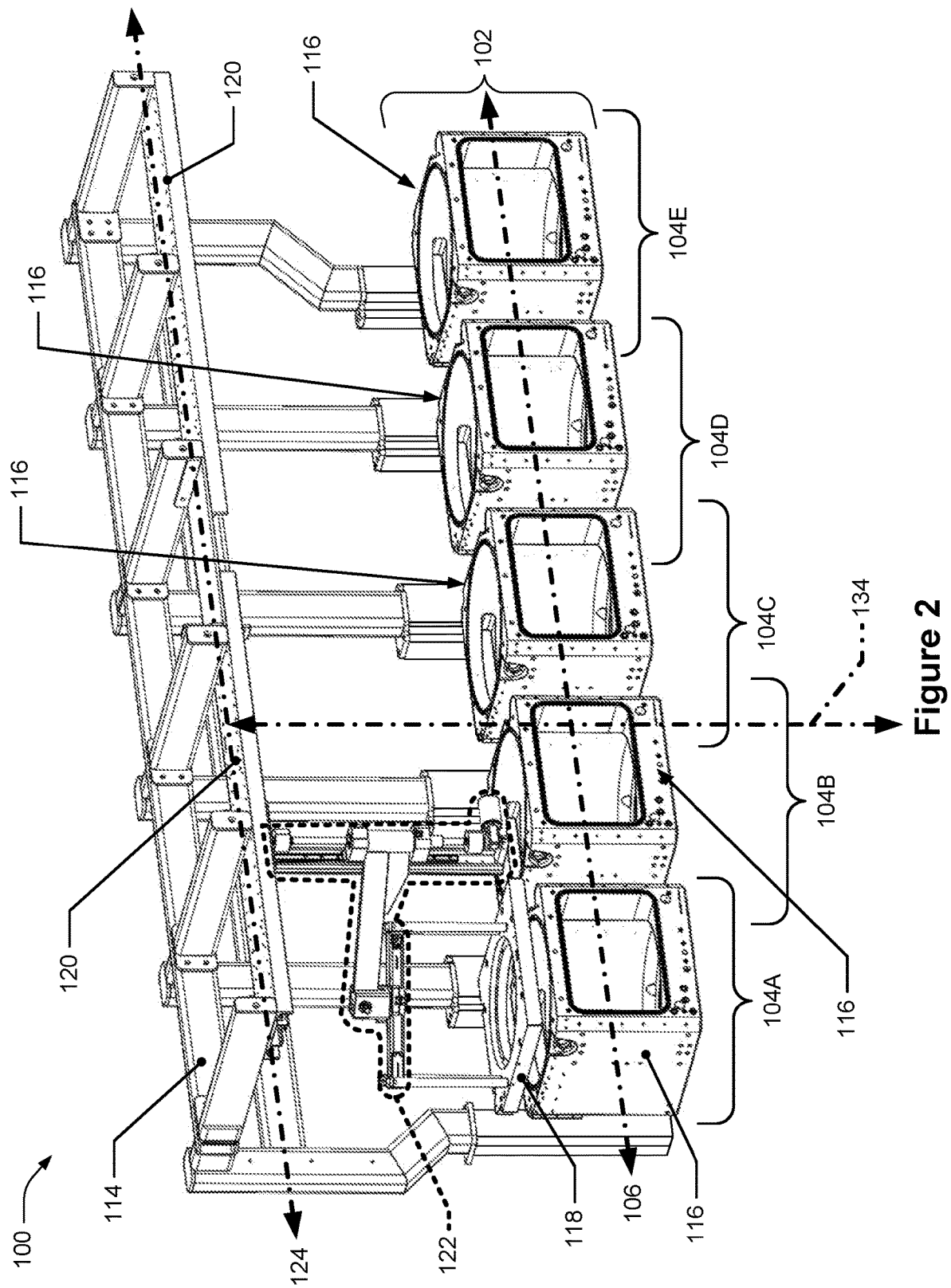
FIG. 2 depicts a perspective view of a first example portion of the example semiconductor processing tool of FIG. 1.

FIG. 2 depicts a perspective view of a first example portion of the example semiconductor processing tool of FIG. 1. Here, the first plurality of semiconductor processing chambers 102 are identified, but for illustration purposes only a base portion 116 of each of the five semiconductor processing chambers 104 is shown, along with a removable top cover 118 of one semiconductor processing chamber 104A shown in a removed state (the remaining top covers for the other semiconductor processing chambers 104 are not shown). Each base portion 116 of the semiconductor processing chambers 104 may be fixedly mounted directly or indirectly to the upper support framework 114, although the interface between each base portion 116 and the upper support framework 114 is not visible. The base portion 116 may be fixedly mounted to the upper support framework 114 by any known means, such as bolts, welds, clamps, or pins, for instance.

FIG. 2 also depicts a first linear guide system 120 and a first carriage 122, which are further depicted in FIG. 3 and discussed below. The first carriage 122 is encompassed by a dotted line for illustration purposes. The first linear guide system 120 may be fixedly supported by, or mounted to, the upper support framework 114; this may include affixing or connecting the first linear guide system 120 directly or indirectly to the upper support framework 114 such that the first linear guide system 120 is fixed in a position relative to the upper support framework 114. The first linear guide system 120 may also be arranged such that it extends along a second axis 124 that is substantially parallel to the first axis 106 (substantially means that these axes may be exactly parallel to each other or within +/−10 degrees, +/−5 degrees, or +/−1 degree of parallel to each other, for instance).

The first carriage 122 is configured to movably engage with the first linear guide system 120 such that the first carriage 122 can translate along the second axis 124. This configuration may include the first linear guide system 120 supporting the first carriage 122 and having features that enable the first carriage 122 to move within and along the first linear guide system 120. For instance, the first carriage 122 may have wheels or bearings that can be received by one or more rails or slots of the first linear guide system 120 which in turn causes the first linear guide system 120 to support the first carriage 122 and enables the first carriage 122 to move, such as by rolling or sliding, along the first linear guide system 120 and the second axis 124. In some embodiments, the moveable engagement between first carriage 122 and the first linear guide system 120 may be passive such that a person can manually move the first carriage 122 along the first linear guide system 120. In other embodiments described below, this moveable engagement may be powered by a carriage translation system that can propel the first carriage 122 along the first linear guide system 120.

Figure 3:
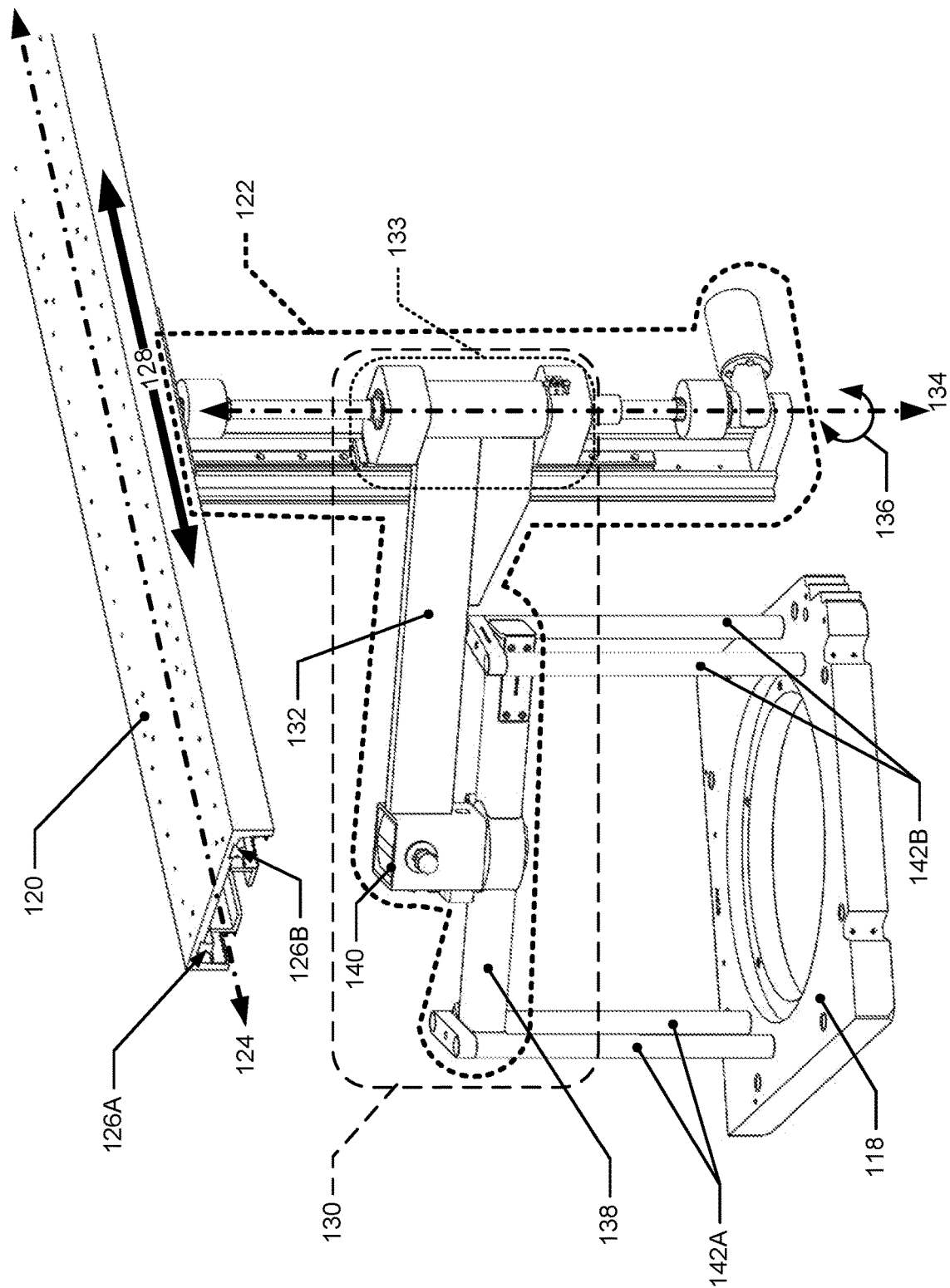
FIG. 3 depicts a detail perspective view of a portion of the example semiconductor tool of FIG. 2.

FIG. 3 depicts a detail perspective view of a portion of the example semiconductor tool of FIG. 2. Here, a partial section of the first linear guide system 120, the first carriage 122, and the removable top cover 118 are seen. The first linear guide system 120 is seen extending along the second axis 124 and including two rails 126A and 126B in which wheels or bearings of the first carriage 122 are moveably engaged such that the first linear guide system 120 supports the first carriage 122 and the first carriage 122 can move along the second axis 124 as indicated by a double-sided arrow 128.

Additional features of the first carriage 122 will now be discussed. In some implementations, the first carriage may include a first hoist arm that has one or more links and may be configured to pivot about a vertical axis. In FIG. 3, the first carriage 122 includes the first hoist arm 130 that has a single link 132. The first hoist arm 130 is configured to pivot, for instance, relative to the first linear guide system 120 or the upper support framework 114, around a vertical axis 134 as indicated by arrow 136; the vertical axis 134 is substantially perpendicular to the second axis 124 (substantially perpendicular here means that these axes are actually perpendicular or within, for instance, at least +/−10 degrees, +/−5 degrees, or +/−1 degrees of normal to each other). The ability of the first hoist arm 130 to pivot enables it, at least in part, to be moved into multiple positions in order to engage with components of the semiconductor processing chambers so that these components may be moved. The first hoist arm 130 is also connected to the first carriage 122 such that the first hoist arm 130 moves together with the first carriage 122.

The first hoist arm and the removable components are configured to connect with each other so that the removable components can be lifted and lowered by the first carriage, and moved while supported by the first carriage. In some implementations, this configuration includes the first hoist arm having a hoist feature engagement interface that is configured to engage with hoisting features of the removable components; this engagement between the hoist feature engagement interface and the hoisting features creates a connection between the first hoist arm and the removable components and allows the removable components to be lifted, lowered, and supported by the first hoist arm and first carriage.

Some examples of suitable hoist feature engagement interface and the hoisting features, and their physical connection to each other (i.e., engagement to each other), may be conventional lifting and connecting elements, such as lifting hooks or holes; hoist rings; shackles; threaded connections between elements; pins and holes; rotary latches; and cables, straps, or chains. For instance, the hoisting features of the removable component may be lifting hooks connected to the removable component, the hoist feature engagement interface may be cables connected to the first hoist arm, and the engagement between these may be the cables and the lifting hooks connected together (e.g, by bolts or screws). This connects the first hoist arm to the removable component which in turn enables the first hoist arm to raise, lower, and move the removable component.

In some embodiments, the hoist feature engagement interface may have a first structure that is connected to an end of the first hoist arm and that is configured to engage with hoisting features that are second structures of the removable component. For example, as depicted in FIG. 3, the first hoist arm 130 includes a hoist feature engagement interface which is a first structure 138, i.e., a beam 138, connected to the end 140 of the first hoist arm 130; the hoisting features of the removable component or removable top end, removable top cover 118 (which may also be considered a removable top plate or removable top end in some embodiments), are second structures 142A and 142B. The first structure 138 may engage with the second structures 142A and 142B in various ways, such as being pinned, bolted, clamped, or screwed together.

Figure 4A:
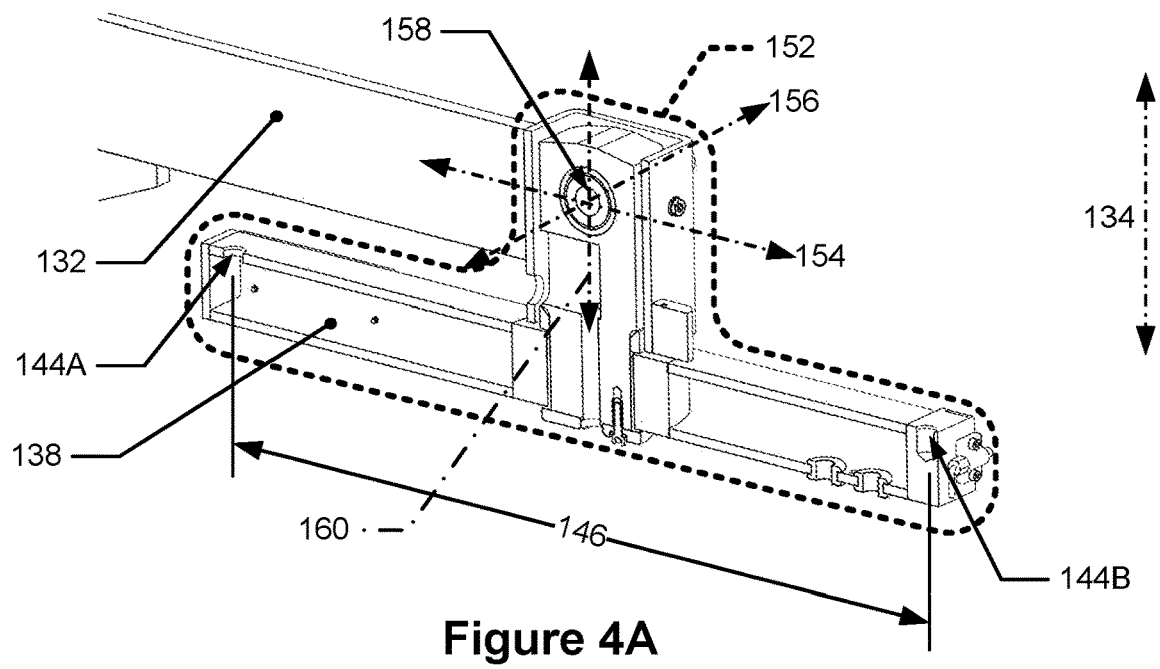
FIG. 4A depicts a cross-sectional view of a part of an example first hoist arm of FIG. 3
Figure 4B:
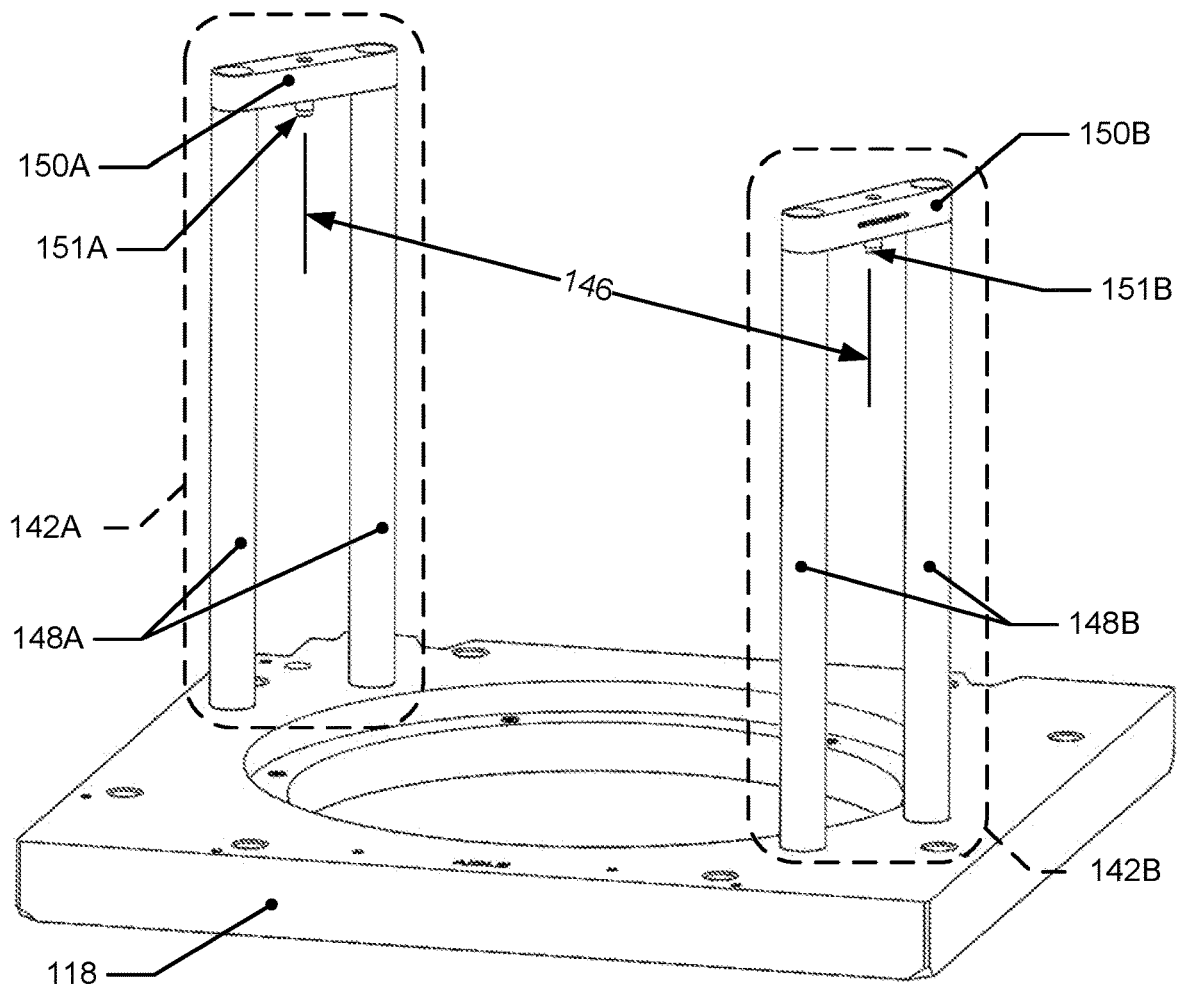
FIG. 4B depicts an off-angle view of an example removable top cover of FIG. 3.

In some implementations, the hoist feature engagement interface may have mechanical features that are configured to engage with complementary mechanical features of the hoisting features. For example, FIG. 4A depicts a cross-sectional view of a part of an example first hoist arm of FIG. 3 and FIG. 4B depicts an off-angle view of an example removable top cover of FIG. 3. In FIG. 4A, the beam, i.e., first structure 138 of the hoist feature engagement interface, includes two first mechanical interface features, which are depicted as holes 144A and 144B, that are spaced apart by a first distance 146. These first mechanical interface features are complementary to second mechanical interface features of the hoisting features of removable top cover 118. In FIG. 4B, the hoisting features of the removable top cover 118, i.e., second structures 142A and 142B, which may be referred to herein as saddle posts, are encompassed in dashed shapes. Each second structure includes a pair of vertical riser rods 148A and 148B and a saddle plate 150A and 150B that caps and spans between each pair of vertical riser rods 148A and 148B. Each saddle plate 150A and 150B may also include a second mechanical interface feature 151A and 151B, depicted as a pin, and these second mechanical interface features 152 may be separated by the first distance 146. Based on the configurations of these features, the second mechanical interface features 151A and 151B can be inserted into the first mechanical features of the hoist feature engagement interface, i.e., holes 144A and 144B of the beam 138, which may be considered the engagement between the hoist feature engagement interface and the hoisting features of the removable component. Alternatively, the pin may be located on the hoist beam and the hole located on the saddle plate.

In some embodiments, the first structure 138 of the hoist feature engagement interface may include both a beam and posts perpendicular to the beam, similar to one of the vertical riser rods 148A, that can connect to the removable component using hooks, clamps, bolts, or the like. In some such implementations, the hoisting features may be holes, threaded holes, or other connecting features that can connect with the hoist feature engagement interface.

The first carriage and the first hoist arm are also moveable so that the hoist feature engagement interface can be moved and engaged with the hoisting features of any of the removable components. This movability includes, referring back to FIG. 2, the movability of the first carriage 122 along the second axis 124 so that it can be near, or adjacent to, any one of the semiconductor processing chambers 104, and includes, referring back to FIG. 3, the ability of the first hoist arm 130 to rotate around vertical axis 134. The rotation of the first hoist arm 130 about the vertical axis 134 enables the first hoist arm 130 to move within a plane perpendicular to the vertical axis 134, as discussed in more detail below.

Figure 5:
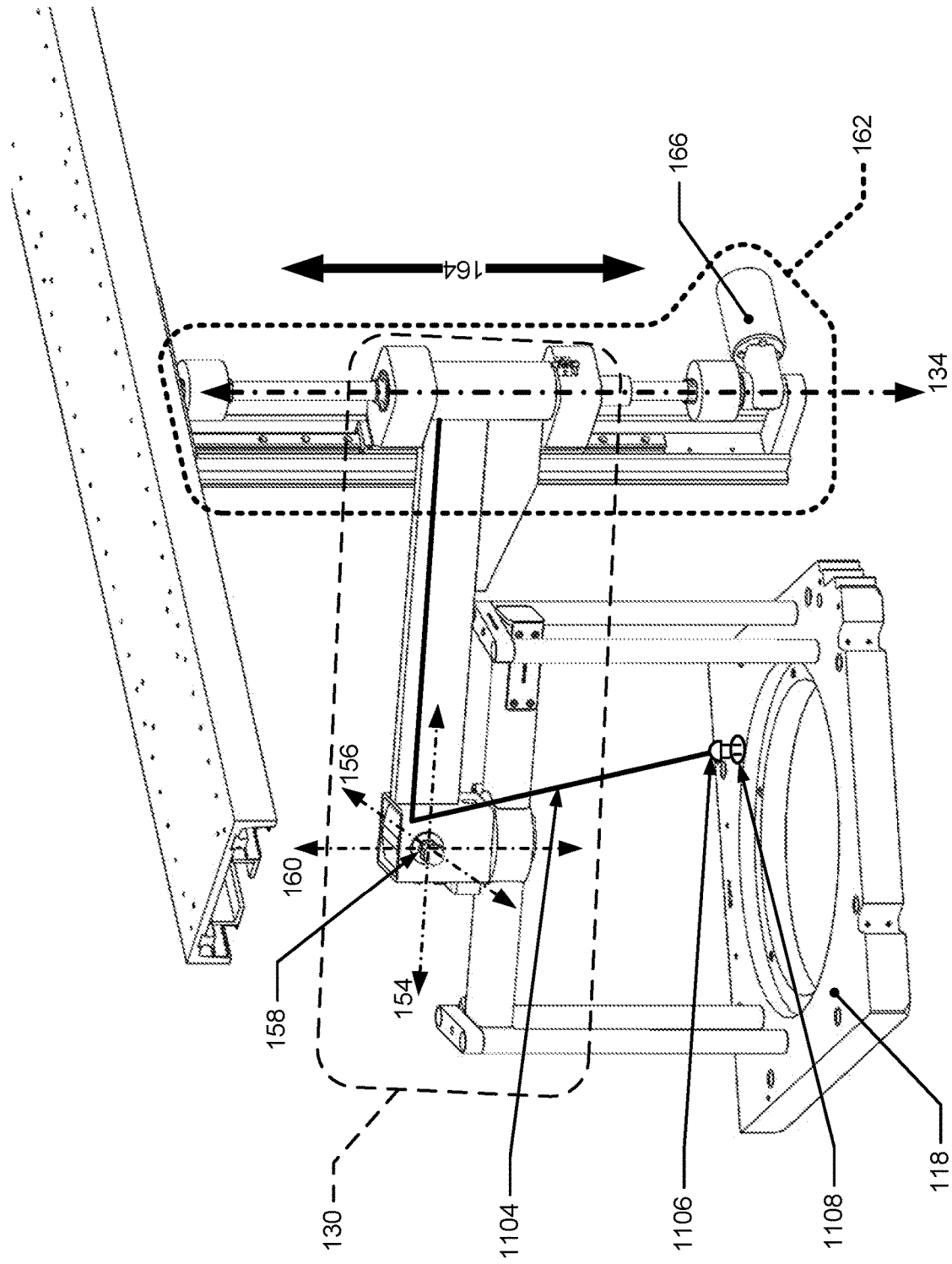
FIG. 5 depicts the same detail perspective view of the portion of the tool of FIG. 3.

The movability of the first hoist arm 130 may also include the movability of the hoist feature engagement interface. The hoist feature engagement interface may be rotatable about one or more axes. Referring back to FIG. 4A, the hoist feature engagement interface is encompassed by dotted shape 152 and is connected with the single link 132 of the first hoist arm 130 at a joint 158. The vertical axis 134, an axis 160 parallel to the vertical axis, and two other axis 154 and 156 perpendicular to the axis 160 are depicted in FIGS. 4A and 5. The joint 158 where the hoist feature engagement interface 152 is connected to the link 132 of the first hoist arm 130 may be configured to allow the hoist feature engagement interface 152 to rotate, with respect to the first link 132, about one or more of these axes, including, in this specific example, the vertical axis 134 and the other two axes 154 and 156. For instance, the hoist feature engagement interface 152 may rotate, with respect to the link 132, about axis 156 at the joint 158 and may also rotate, with respect to the link 132, about an axis 160 parallel to the vertical axis 134. In some instances, the joint where the hoist feature engagement interface 152 is connected to the link 132 of the first hoist arm 130 may be a spherical joint. This spherical joint may allow partial gimbling about an axis parallel to the vertical axis which may facilitate planar alignment. This spherical joint may be advantageous because it enables alignment of the chamber lid to the chamber if the two are misaligned. In some instances, some axes of movement may be lockable to prevent movement about the locked axis, such as with spring plungers, pins, screws, or clamps.

In some embodiments, the first carriage may include a vertical translation system that is configured to cause the hoist arm to translate vertically relative to the first linear guide system or the upper support framework. This vertical movement of the hoist arm may further enable the first carriage to engage with, lift, and lower the removable components of the semiconductor processing chambers. In FIG. 5, which depicts the same detail perspective view of the portion of the tool of FIG. 3, the vertical translation system 162 is encompassed by the dotted shape. The vertical translation system 162 is configured to cause the first hoist arm 130 to translate vertically along a second vertical axis parallel to the vertical axis 134, such translation is illustrated using double arrow 164. Referring back to FIGS. 4A and 4B, the vertical translation system 162 may enable the hoist feature engagement interface 152 to be positioned underneath the second mechanical interface features 151A and 151B, i.e., the pins, and then moved vertically upwards so that the second mechanical interface features 151A and 151B are inserted into the first mechanical interface features, i.e., holes 144A and 144B, respectively, thereby engaging the hoist feature engagement interface 152 with the hoisting features of the removable top cover 118. Once these are engaged, the removable top cover may be lifted and lowered by the vertical translation system 162 without risking disengagement of the hoist engagement interface 152.

The vertical translation system 162 may utilize various mechanisms to cause the first hoist arm 130 to translate vertically. For instance, the vertical translation system 162 may be a linear ball screw actuator, a hydraulic actuator, a screw actuator, a rack-and-pinion actuator, or a cable hoist. The vertical translation system 162 may also include a motor 166 that is configured to provide a mechanical input to the vertical translation system 162. For example, the motor 166 may provide the mechanical drive force for any of the actuators, such as the linear ball screw actuator.

In some embodiments, the tool may include one or more bellows to seal off some portions of the linear guide system and first carriage to prevent contamination by particulates and other matter that are generated by these moveable features; these contaminants could be harmful to substrates and other aspects of the tool. The interface between the linear guide system and the first carriage may be one of these moveable components that can generate contaminants and it may be advantageous to include a bellows around this interface between the linear guide system and the first carriage such that a seal is created at this interface. The vertical translation system may also have a bellows because this system may generate contaminants.

The first carriage, the first hoist arm, or both, may also be moveable so that a removable component engaged with the first hoist arm may be moved. As mentioned above, once the hoist feature engagement interface of the first hoist arm is engaged with the hoisting features of a removable component, the first carriage may be configured to translate the removable component vertically in a direction parallel to the vertical axis 134, as illustrated in FIG. 5. Additionally, the first carriage may be configured such that the removable component engaged with the first hoist arm can be moved horizontally, or in one or more directions within a plane perpendicular to the vertical axis 134. FIGS. 6A-6E depict a movement sequence of an example removable component of the first example portion of the example semiconductor tool of FIG. 2. These Figures are a simplified top view of the tool of FIG. 2 without the upper support framework for illustration purposes; they are viewed at an angle parallel to the vertical axis of FIGS. 3 and 5 such that the vertical axis is perpendicular to and extends into the page. Here, the first linear guide system 120 includes two rails 126A and 126B and extends along the second axis 124. The first carriage 122 is movably engaged with the first linear guide system 120 so that the first carriage 122 can translate along the second axis 124. The first plurality of semiconductor processing chambers 102 is also seen, along with the base portions 116 of these semiconductor processing chambers, the first hoist arm 130, the link 132, and the first hoist feature engagement interface 152 engaged with the hoisting features, i.e., second structures 142A and 142B, of the removable top cover 118.

As shown in FIGS. 6A-6E, the first hoist arm 130, the link 132, the first hoist feature engagement interface 152, the first carriage 122, and the removable top cover 118 are movable within the plane perpendicular to the vertical axis. FIG. 6A may be considered the starting position after engagement between the hoisting features of the removable top cover 118 and the hoist feature engagement interface 152 of the first hoist arm 130. In FIG. 6B, the first carriage 122 has translated along the second axis 124 in the direction of arrow 128 and the removable top cover 118 has been moved in a horizontal direction 168 that is perpendicular to the second axis 124. This movement of the removable top cover 118 may be considered movement within the plane perpendicular to the vertical axis. This movement of the top cover 118 has also been enabled by the rotation of the first hoist arm 130 about the vertical axis (going into the page and represented by the "X" labeled 134) as indicated by arrow 136, by the rotation of the hoist feature engagement interface 152 with respect to the link 132 as indicated by arrow 169, and by the linear translation of the carriage 122 along the second axis 124. Additional movement of the removable top cover 118 in the horizontal direction 168, along with the corresponding movements and rotations of the first hoist arm 130, the hoist feature engagement interface 152, the link 132, and the first carriage 122 is seen further in FIGS. 6C-6E.

The removable component may be moved in ways other than depicted in FIGS. 6A-6E. For instance, the carriage 122 may remain in a fixed position on the second axis 124 while one or more of the first hoist arm 130, the hoist feature engagement interface 152, the link 132, and the removable top cover 118 are rotated about axes parallel to the vertical axis 134. In some examples, only the first hoist arm 130 may rotate about an axis parallel to the vertical axis 134, as indicated by arrow 136, while the other aspects of the first carriage remain stationary. The movability of the removable component engaged to the first carriage is also not limited to linear motion in the horizontal direction 168 or along the second axis 124. In some embodiments, the removable component may be moved such that the motion has vector components within the horizontal direction 168 and the second axis 124, and has rotational components about the axis parallel to the vertical axis, like indicated by arrow 136, and about an axis perpendicular to the first axis and within the horizontal plane including, but not limited to, the horizontal direction 168 and the second axis 124 as described above.

The movability of the first carriage, the first hoist arm, or both also enables a removable component engaged with the first hoist arm to be moved outside an envelope of the tool. In some embodiments, referring to FIG. 6E for instance, the base portions of the first plurality of semiconductor processing chambers may be located within an envelope 170 and the aforementioned movements of the first carriage 122 enable the removable top cover 118 to be moved outside of the envelope 170. In some instances, the removable top cover 118 may be moved outside of the envelope 170 and into the service area surrounding the tool 100, as illustrated in FIG. 1. The envelope 170 may be considered to encompass all of the base portions of the semiconductor processing chambers of the tool.

Figure 7:
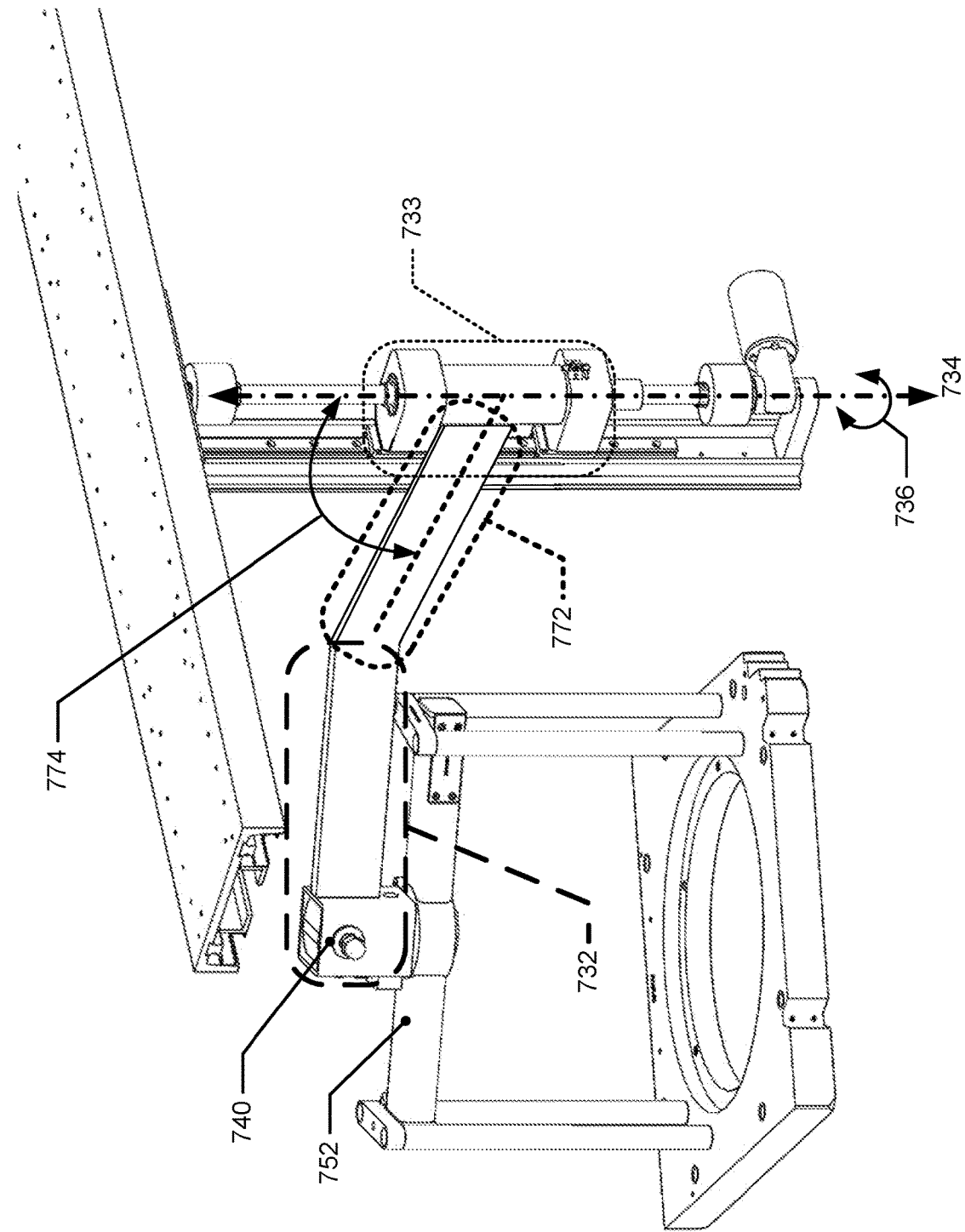
FIG. 7 depicts an example hoist arm.

In some embodiments, the first hoist arm may have a linear section, like depicted in FIG. 3. This linear section may be the same as the link 132 which extends between a pivot section 133, which is the portion of the first hoist arm 130 that pivots or rotates about the vertical axis 134 as indicated by arrow 136, and the end 140 of the first hoist arm 130 where the hoist feature engagement interface is connected. In some such embodiments, the first hoist arm may have a linear section and an angled section. FIG. 7 depicts an example hoist arm. Here, the example hoist arm includes linear section 732 which has the end 740 where the hoist feature engagement interface 752 is connected and also includes an angled section 772 that spans between the pivot section 733 and the linear section 732. The angled section 772 is oriented at an oblique angle 774 with respect to the vertical axis 134, which may be an acute angle, as depicted in FIG. 7, or an obtuse angle. This angle may range from between about 15 to 75 degrees, about 30 to 60 degrees, including about 45 degrees. This angled hoist arm may be advantageous because it enables a different vertical stroke than the hoist arm with only a linear section. In some embodiments, the hoist arm may include two or more links and multiple joints, such as an elbow joint and a double elbow joint.

The positioning and arrangement of the first linear guide system and the first carriage may vary, which in turn affects the movability of the first carriage and the first hoist arm. In some embodiments, the first linear guide system may be positioned above the first plurality of semiconductor processing chambers. For instance, referring back to FIG. 2, the first linear guide system 120 is seen positioned above, or vertically offset above, the first plurality of semiconductor processing chambers 102 in the direction parallel to the vertical axis 134. In some implementations, the first carriage 122 may be vertically offset, in the direction parallel to the vertical axis 134 below the first linear guide system 120, as seen in FIG. 2. In some embodiments, when viewed along a direction parallel to the second axis 124, the first carriage 122 may be considered vertically interposed between the first linear guide system 120 and a part of the first plurality of semiconductor processing chambers 102, such as the base portions 116.

The first hoist arm 130 is able to engage with various removable components of semiconductor processing chambers 110 of the first plurality of semiconductor processing chambers 102 that may be connected to or surrounding the based portions 116. These removable components may include the removable top cover 118, a Radio Frequency (RF) generator, a pump, or a cryopump, for instance. It may be desirable to remove these components from the semiconductor processing chamber for maintenance or servicing of the removable component or another part of the semiconductor processing chamber. Each of these removable components may include some of the hoisting features discussed above to enable the hoist feature engagement interface to engage with these removable components so that the removable components can be lifted, lowered, and moved. For example, any of the removable components may have the hoisting features described with respect to FIG. 4B above or they may have conventional hoisting features, such as lifting holes, lifting hooks, and the like. Regardless of the type of hoisting features arranged on the removable components, the first carriage and first hoist arm may be movable such that the hoist feature engagement interface can be moved so as to be engaged with these hoisting features of the removable components.

In some other embodiments, the linear guide system and the first carriage may be arranged and positioned so that the first carriage can access other aspects of the tool. It may be advantageous to have different configurations of the linear guide system and carriage to account for tools with different component configurations. For instance, the first example portion of the tool of FIG. 2 has components arranged in a particular manner which may be sufficient for the positioning of the linear guide and first carriage described above. In other instances, the tool may have removable components arranged such that the linear guide and first carriage described above may not be able to reach such components. In these instances, the toll may be configured differently than described above.

Figure 8:
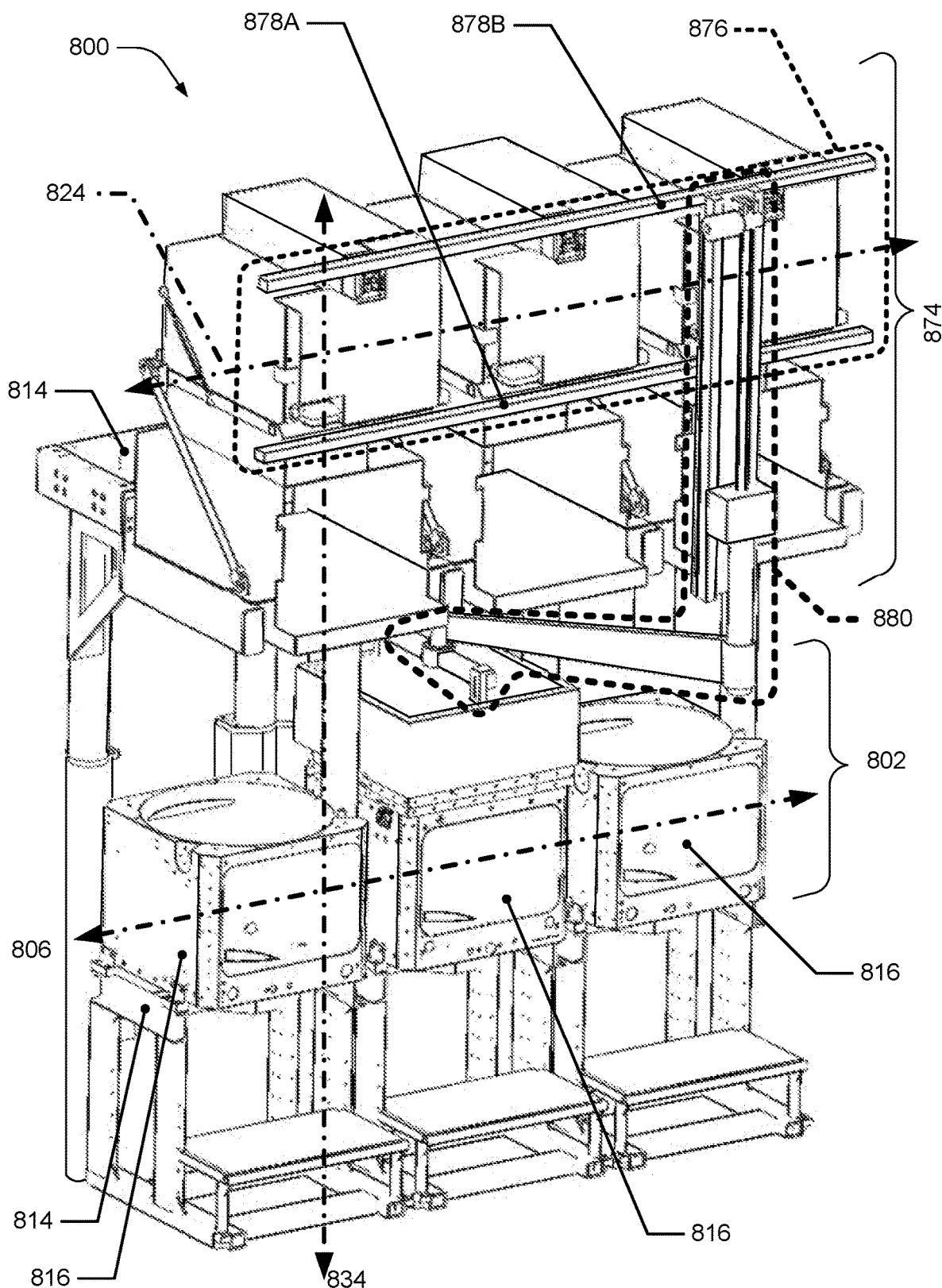
FIG. 8 depicts a perspective view of a second, alternate example portion of the tool schematic of FIG. 1.

FIG. 8 depicts a perspective view of a second, alternate example portion of the tool schematic of FIG. 1. The arrangement of the tool 800 components is similar to but different than that of tool 100 described above. Here in FIG. 8, like in FIG. 2, the first plurality 802 of semiconductor processing chambers, which includes three semiconductor processing chambers in this example, are arranged along the first axis 806 and each semiconductor processing chamber includes base portions 816 that are fixedly mounted to the upper support framework 814. As seen further in FIG. 8, the tool 800 includes components 874, some of which may be removable, above the first plurality 802 of semiconductor processing chambers. These components 874 are positioned and arranged such that it may be advantageous to use a different linear guide system, first carriage, or both, than described above with respect to FIG. 2, for example.

Figure 9:
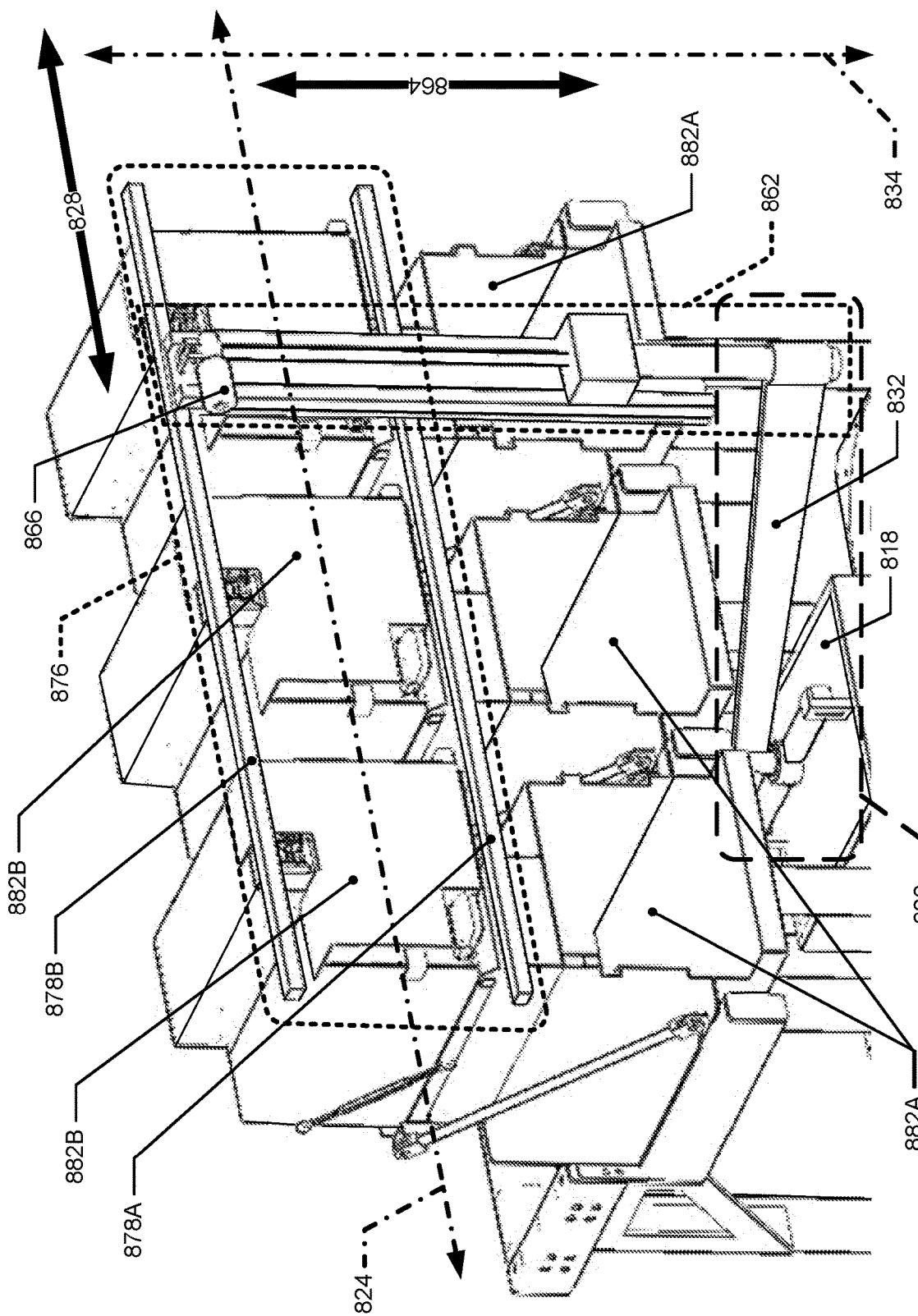
FIG. 9 depicts a magnified portion of FIG. 8.

Tool 800 includes a second linear guide system 876 that is arranged along the second axis 824 that is substantially parallel to the first axis 806, like described above, and that includes a first rail 878A and a second rail 878B. These two rails are parallel to each other and vertically offset from each other along the vertical axis 834, which is perpendicular to the second axis 824, like described above. The second linear guide system 876 is also fixedly supported by the upper support framework 814, either directly or indirectly; FIG. 8 depicts the second linear guide system 876 fixedly mounted directly to the upper support framework 814. A second carriage 880 is also depicted within a dotted shape and seen in greater detail in FIG. 9 which depicts a magnified portion of FIG. 8. In FIG. 9, the second carriage 880 is moveably engaged with the second linear guide system 876, such that it is simultaneously movably engaged with both the first rail 878A and the second rail 878B which enables it to translate along the second axis 824, like described above, in the direction of arrow 828. It will be understood that reference to the "second" linear guide system and carriage is not intended to suggest that there is necessarily a "first" instance of each in the same semiconductor processing tool; the ordinal indicators are simply used to differentiate this linear guide system and carriage from examples discussed earlier.

The second carriage 880 also includes the first hoist arm 830 which may be the same as described above with respect to the first hoist arm 130, including its elements, its ability to rotate about an axis parallel to the vertical axis 834, and its inclusion of the hoist feature engagement interfaces configured to engage with the hoisting features of removable components. In some instances, link 832 may be longer or shorter than that of FIG. 2 in order to reach other components of the tool 800. Also like above, the second carriage 880 may include the first vertical translation system 862 that is configured to translate the second hoist arm 830 in a direction parallel to the vertical axis 834 as indicated by arrow 864. The first vertical translation system 862 includes motor 866 which is configured to drive the vertical translation, like described above, which may be using pulleys and cables or a screw actuator.

In some embodiments, the configuration of the second linear guide system and the second carriage enable the second hoist arm to translate below, in-between, and above the second linear guide system. For example, in FIG. 8, the first hoist arm 830 is able to translate below the second linear guide system 876 and in-between the first rail 878A and the second rail 878B of the second linear guide system 876; in some implementations, the vertical translation system may even extend above the second rail 878B, allowing translation of the second hoist arm to locations above the second rail 878B. This vertical translation range enables the hoist feature engagement interface of the first hoist arm 830 to access and move removable components below the second linear guide system 876, such as removable top cover 818 and removable components 882A, and removable components in between the first rail 878A and the second rail 878B (or above the second rail 878B), such as removable components 882B. In some embodiments, the first carriage may be configured such that the first hoist arm 830 can access and move removable components that are above the bottom of the second linear guide system 876.

Figure 10:
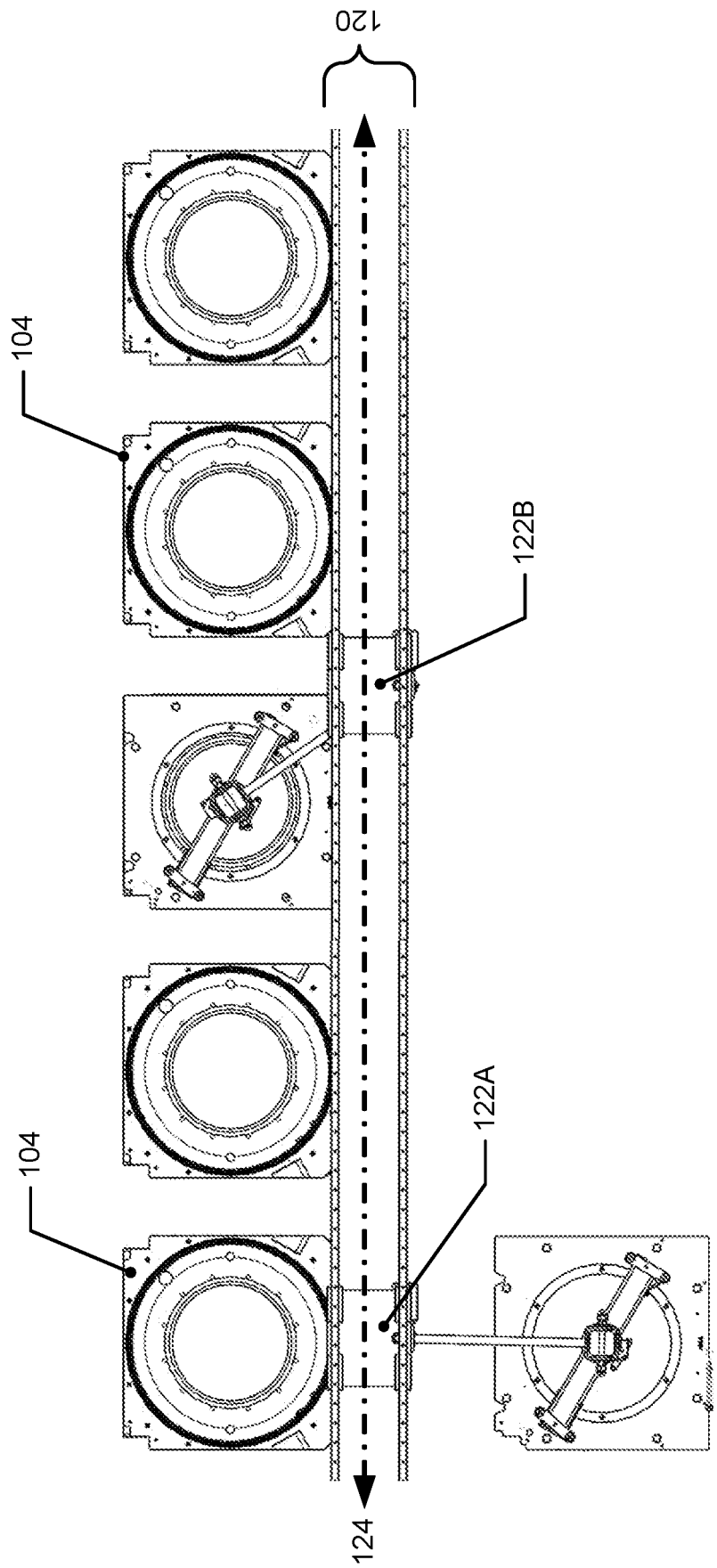
FIG. 10 depicts an example tool like in FIGS. 6A-6E that has two first carriages engaged with one linear guide system.

Some embodiments of the tool may have two or more carriages simultaneously moveably engaged to the same linear guide system. For instance, the first linear guide system 120 of FIGS. 2 and 3 may have two first carriages 122 simultaneously and moveably engaged with it. These two first carriages 122 may be, in some implementations, duplicates of each other. For example, FIG. 10 FIG. 10 depicts a tool like in FIGS. 6A-6E that has two first carriages engaged with one linear guide system. Here, first carriage 122A and first carriage 122B (which may be considered a second carriage) are both simultaneously moveably engaged with the first linear guide system 120 such that they can both translate along the second axis 124. In these embodiments, the first carriage 122A and the first carriage 122B are duplicates and configured like with the first carriage 122 described above. This enables removable components of multiple semiconductor processing chambers 104 to be accessed and moved which may increase efficiency and decrease time of servicing and maintenance.

Referring back to FIG. 1, the tool 100 may have two pluralities of semiconductor processing chambers, the first plurality 102 and the second plurality 108. The second plurality of semiconductor processing chambers 108 may be arranged along a third axis, which may be considered the same as the axis 112, which is offset from and substantially parallel to the first axis 106. In FIG. 1, the second plurality of semiconductor processing chambers 108 is offset, in another direction perpendicular to the first axis, from the first plurality of semiconductor processing chambers 102 such that the tool has an interior region 184, represented as a dashed figure with semi-transparent cross-hatching, in between the pluralities of semiconductor processing chambers. The interior region may contain parts of the upper support framework 114 as well as components used for semiconductor processing, such as gas boxes, manifolds, gas sources, electronics, conduits, and the like. This interior region 184 may also include one or more substrate handling robots that are configured to transport one or more substrates into or out of processing chambers or other aspects of the tool. As discussed herein, these substrate handling robots are different than the disclosed carriages. For example, substrate handling robots are typically located in the interior region since this allows such a robot to efficiently transfer wafers in between the different processing chambers while still keeping the wafer in a controlled environment, e.g., within a vacuum transfer module, for example.

Figure 11:
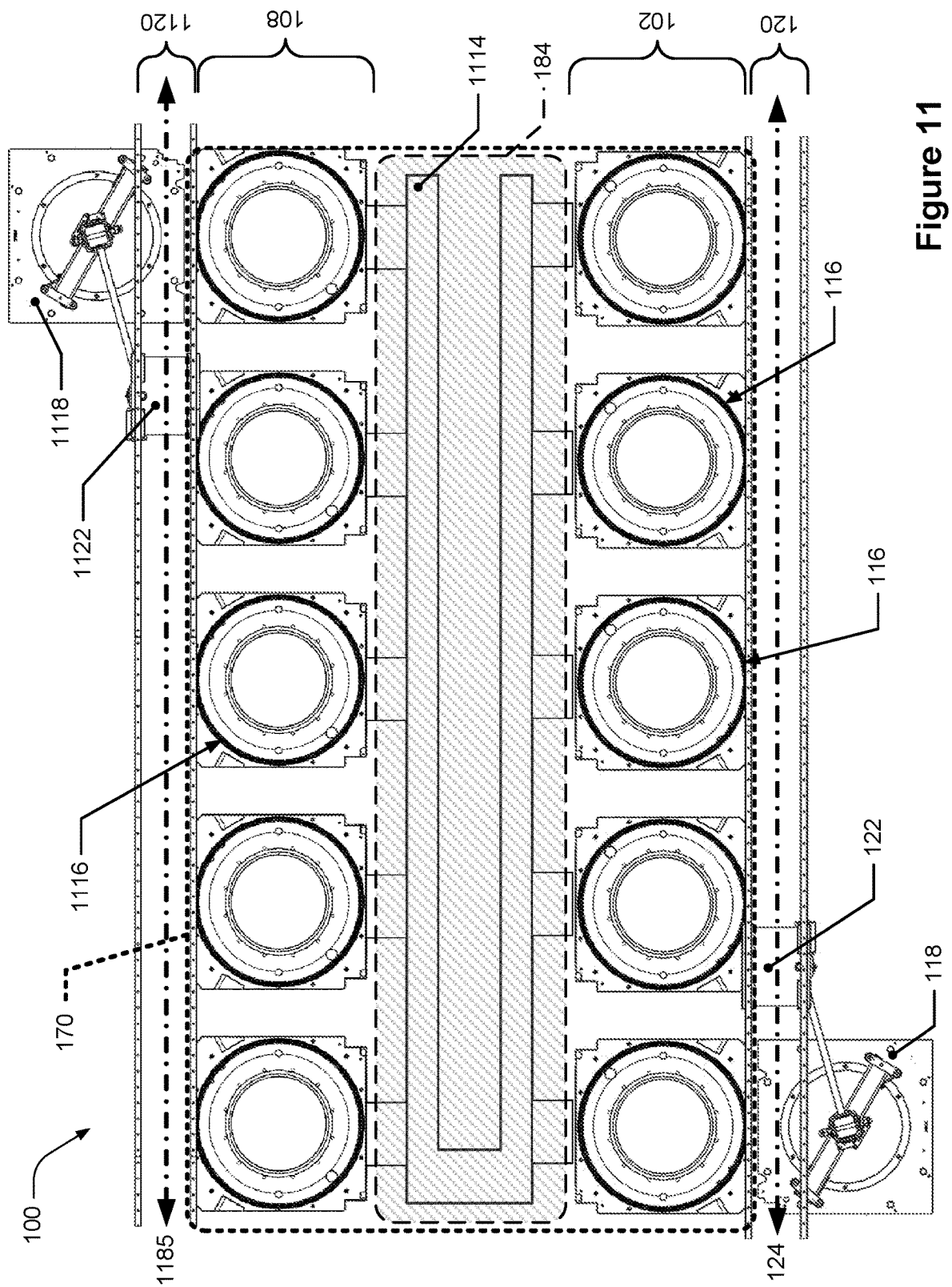
FIG. 11 depicts a top view of an example semiconductor processing tool similar to that shown in the tool schematic of FIG. 1 but with additional details and features shown.

The tool 100 with multiple pluralities of semiconductor processing chambers may have a linear guide system and carriage for each plurality of semiconductor processing chambers. FIG. 11 depicts a top view of an example semiconductor processing tool similar to that shown in the tool schematic of FIG. 1 but with additional details and features shown. The first plurality 102 of semiconductor processing chambers may be similar those described in FIGS. 2-7. These semiconductor processing chambers may be arranged along the second axis 124 and their base portions 116 may be fixedly mounted to the upper support framework 114. Like described above in FIGS. 2-7, the first linear guide system 120 and the first carriage 122 may be positioned and configured to access and move removable components, such as the removable top cover 118, of only the first plurality 102 of semiconductor processing chambers.

Additionally, the second plurality 108 of semiconductor processing chambers may be arranged along the third axis. A second linear guide system 1120 may be positioned along a fourth axis 1185 that is substantially parallel to the third axis 112 (seen in FIG. 1). A second carriage 1122 may be moveably engaged with the second linear guide system 1120 and configured to access and move removable components of only the second plurality 108 of semiconductor processing chambers. The second carriage 1122 may be configured to engage with hoisting features of the removable components, such as removable top cover 1118, of the second plurality 108 of semiconductor processing chambers like described above for the first carriage 122. In some embodiments, the second linear guide system 1120 may be a duplicate of the first linear guide system 120, the second carriage 1122 may be a duplicate of the first carriage 122, and the removable components of the first and second pluralities of semiconductor processing chambers may all be the same or a similar design. In some other embodiments, the first linear guide system 120 may be different than the second linear guide system 1120, and the first carriage 122 may be different than the second carriage 1122, but each first carriage and second carriage may still be configured to engage with the hoisting features of the removable components of their respective semiconductor processing chambers.

In some embodiments, the first plurality 102 of semiconductor processing chambers, the second plurality 108 of semiconductor processing chambers, and the interior region may be located within the envelope 170. In some instances, at least a portion of the first carriage and/or the linear guide system is positioned outside of the envelope 170. The first carriage 122 and the second carriage 1122, including their respective first and second hoist arms, may be moveable so that removable components from each plurality of semiconductor processing chambers can be moved outside of the envelope. This is illustrated in FIG. 11 with removable top cover 118 and 1118 moved and positioned outside the envelope 170.

The hoisting aspects described herein, e.g., the linear guide system and the first carriage, may include varying degrees of powered and non-powered features. For example, in some implementations of the tool, the movement of the first carriage 122 along the second axis 124 and the horizontal and rotational movement of the first hoist arm may be unpowered such that human power, not motors, electrical, or mechanical power, is used to move the first carriage 122 and move the first hoist arm horizontally and rotationally. In some examples, mechanical power, such as motors or hydraulics, may vertically move one or more aspects of the first carriage 122 and the first hoist arm 130, such as a motor causing the first hoist arm 130 to move vertically. In some other implementations, movement of the first carriage along the linear guide system, and horizontal and rotational movement of the first hoist arm may be powered movement, such as by motors, pumps, hydraulics, or the like.

Some embodiments of the tools described herein may also include a controller that controls various aspects of the tool. In some implementations, the controller may be part of a processing chamber or chambers, a platform or platforms for processing, and/or specific processing components (a wafer pedestal, a gas flow system, etc.). These tools may be integrated with electronics for controlling their operation before, during, and after processing of a semiconductor wafer or substrate. The electronics may be referred to as the "controller," which may control various components or subparts of the tool. The controller, depending on the processing requirements and/or the type of tool, may be programmed to control any of the processes disclosed herein, including, for example, controlling when power may be supplied to the hoist systems disclosed herein and monitoring the operational status of the semiconductor processing chamber for maintenance-safe conditions. The controller may also control other aspects of tool operation, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system, etc.

Broadly speaking, the controller may be defined as electronics having various integrated circuits, logic, memory (including non-transitory media), and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the tool, otherwise networked to the tool, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example tools may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, or a track chamber or module. Tools may have multiple chambers or modules.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 12:
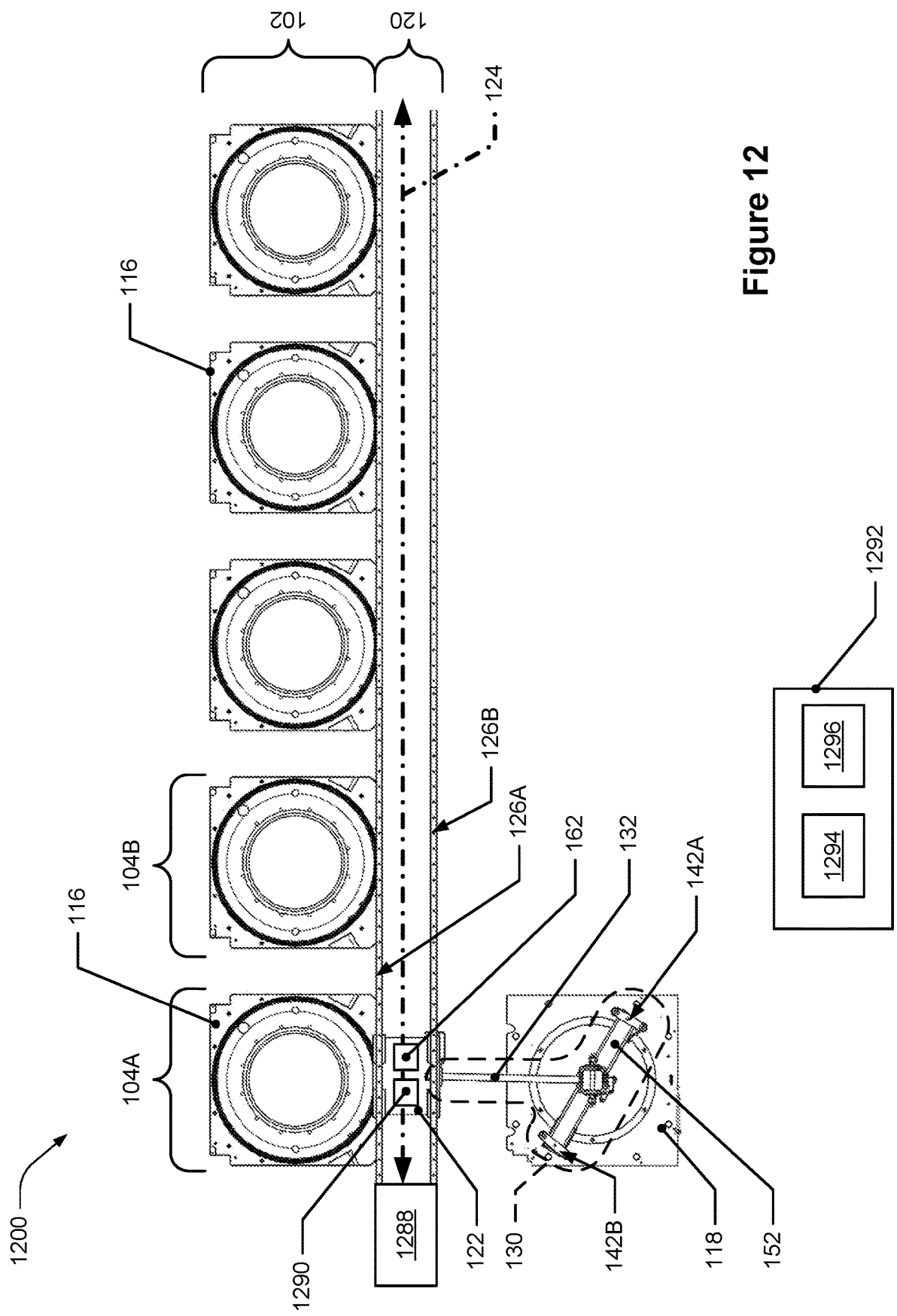
FIG. 12 depicts the top view of the example semiconductor processing tool of FIG. 6E, but with additional features shown.

In some embodiments, various hoisting aspects of the tool may be powered and the controller may be configured to control drive systems that control movement of the carriage relative to the linear guide system and/or movement of the arm link(s) relative to the carriage. FIG. 12 depicts the top view of the example semiconductor processing tool of FIG. 6E, but with additional features shown. For instance, the tool 1200 may has a first linear guide system 120 that includes a carriage translation system 1288 that is configured to cause the first carriage 122 to translate along the first axis 124. The carriage translation system 1288 may include a movement mechanism (such as a motor) that can propel the first carriage 122 along the first linear guide system 120. For example, the first carriage 122 may have one or more motors that power one or more wheels and cause the first carriage 122 to move along the first linear guide system 120. In another instance, such as is depicted in FIG. 6A, the first linear guide system 120 may have a linear ball screw actuator with a motor 191 configured to turn a linear ball screw 189 that is connected to the first carriage 122 such that when the linear ball screw 189 is actuated by motor 191, it causes the first carriage 122 to move along first linear guide system 120.

The tool 1200 may, in some implementations, have a first carriage that further includes a hoist arm movement system, represented by box 1290, that is configured to move the first hoist arm 130 in the plane perpendicular to the vertical axis as described above. This configuration may include the ability to rotationally drive, about a direction parallel to the vertical axis, one or more pivot points of the first hoist arm. For instance, the first carriage 122 may include a motor connected to the first link 132 at the pivot section 133 that can cause the first link 132 to rotate about the vertical axis 134 in the direction of the arrow 136. The first carriage 122 may also include another motor connected directly, or indirectly, to the hoist feature engagement interface 152 that can cause the hoist feature engagement interface 152 to rotate about axis 160 as seen in FIG. 4A and illustrated above in FIGS. 6C-E with 169. This other motor, pneumatic system, or hydraulic system may be located on the first hoist arm or it may be located within the first carriage 122 and connected to the hoist feature engagement interface 152 through pulleys, belts, drive chains, drive screws, gears, linkages, or the like. In some implementations, the hoist arm movement system may also be able to rotate the hoist feature engagement interface 152 about one or more axes perpendicular to the vertical axis, e.g., such as about an axis parallel to the first axis, as described above. The tool 1200 also includes the vertical translation system 162 described above which is configured to cause the first hoist arm 130 to translate along the vertical axis 134.

Tool 1200 also includes a controller 1292, similar, for example, to those described above, employed to control the carriage translation system and the hoist arm movement mechanism. Controller 1292 may include one or more non-transitory memory devices 1294 and one or more processors 1296. Processors 1296 may include one or more CPUs, ASICs, general-purpose computer(s) and/or specific purpose computer(s), one or more analog and/or digital input/output connection(s), one or more stepper motor controller board(s), etc.

Figure 13:
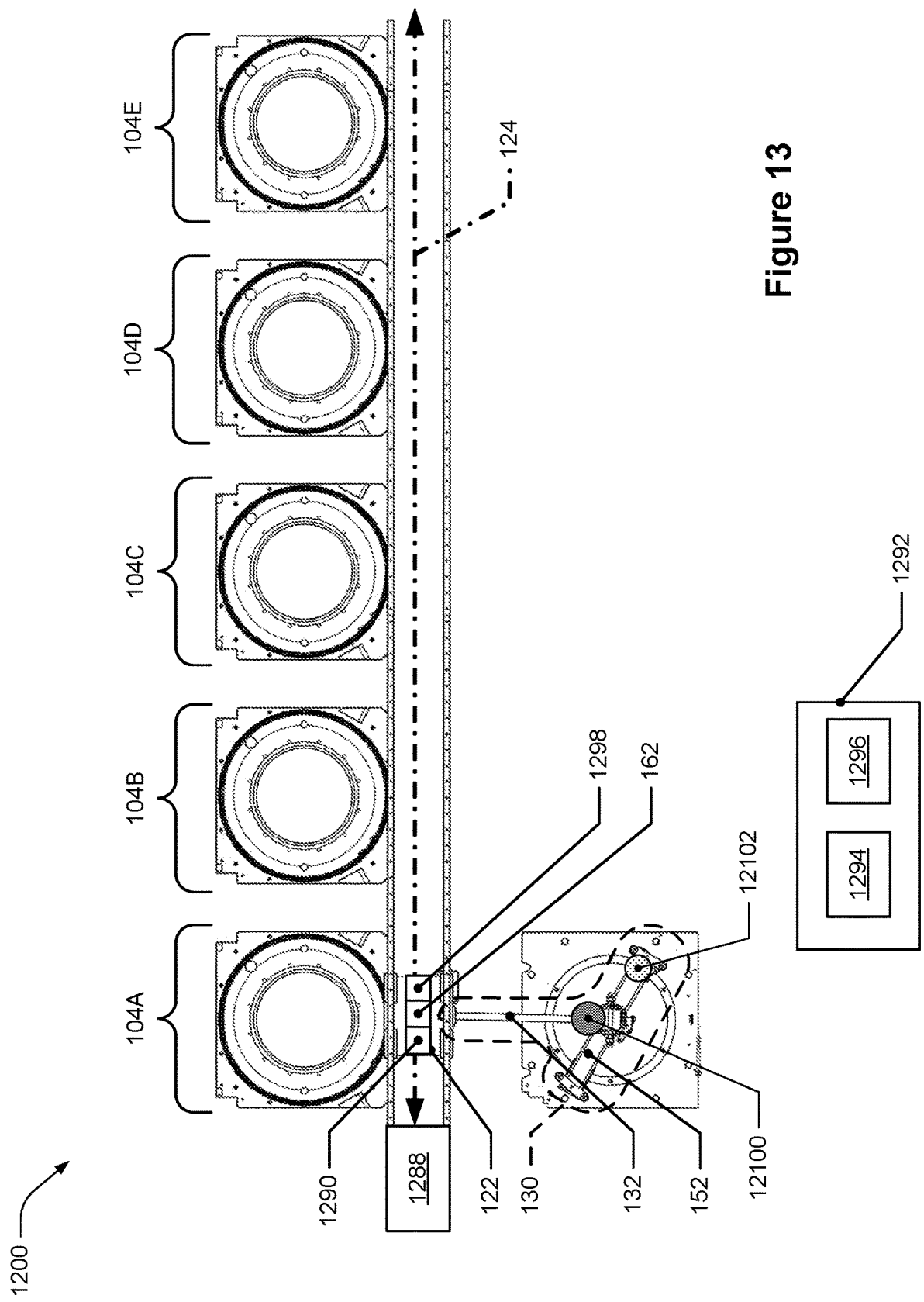
FIG. 13 depicts a block diagram of a part of the example semiconductor processing tool 1200.

The controller 1292 may be communicatively connected to the carriage translation system 1288, the hoist arm movement system 1290, and the vertical translation system 162. FIG. 13 depicts a block diagram of a part of the example semiconductor processing tool 1200 and as can be seen, the controller 1292 is communicatively connected to each semiconductor processing chamber 104 of the first plurality 102 of semiconductor processing chamber, the carriage translation system 1288, the hoist arm movement system 1290, and the vertical translation system 162. The controller 1292 also stores instructions on the non-transitory memory 1294 for controlling the one or more processors 1296 to cause the first carriage 122, including the first hoist arm 130, to move. This includes causing the carriage translation system 1288 to move the first carriage 122 along the second axis 124, causing the vertical translation system 162 to move the first hoist arm 130, including the first link 132 and the hoist feature engagement interface 152, in the vertical direction, like described above, and causing the hoist arm movement system 1290 to move the first hoist arm 130 within the plane perpendicular to the vertical axis 134, as described above.

In some implementations, the controller 1292 also stores instructions on the non-transitory memory 1294 for controlling the one or more processors 1296 to cause the hoist feature engagement interface 152 to engage with the hoisting features of a removable component of one of the semiconductor processing chambers 104. These instructions may cause various movements of the first carriage 122, such as linear translation along the second axis 124, vertical movement of the first hoist arm 130, and horizontal movement of the first hoist arm 130, i.e., within the plane perpendicular to the vertical axis. For example, referring back to FIGS. 4A and 4B, the instructions may cause the vertical translation system 162 to move the first hoist arm 130 in the direction parallel to the vertical axis 134 such that the hoist feature engagement interface 152, including holes 144A and 144B, is below the second mechanical interface features 151A and 151B of the hoisting features, i.e. second structures 142A and 142B. The instructions may also cause the first hoist arm 130, which may include the hoist feature engagement interface 152, to move rotationally, linearly, or both within the plane perpendicular to the vertical axis so that the second mechanical interface features 151A and 151B are aligned, respectively, with the holes 144A and 144B. Once these features are aligned (which may, for example, be determined based on the output of various sensors configured to detect such alignment), the instructions may cause, or allow with manual user inputs, the vertical translation system 162 to move the first hoist arm 130 upwards in the direction parallel to the vertical axis 134 such that the second mechanical interface features 151A and 151B are inserted into the holes 144A and 144B, respectively, and in some embodiments, the saddle plates 150A and 150B are contacting the hoist feature engagement interface 152.

Once the hoisting features of the removable component and the hoist feature engagement interface of the first hoist arm are engaged with each other, the instructions may control the one or more processors to cause the removable component to be lifted and/or lowered in the direction parallel to the vertical axis; similarly, the instructions may cause the removable component to be moved within the plane perpendicular to the vertical axis by causing the hoist arm movement system, the carriage translation system, or both to move the first hoist arm as described above. For example, the controller 1292 may include instructions that cause the sequences of movement described with respect to FIGS. 6A-6E.

In some implementations, the instructions may cause only the hoist arm movement system to move the first hoist arm while the first carriage remains stationary. In some embodiments, the instructions may cause both the hoist arm movement system and the carriage translation system to move the first hoist arm, like described above with respect to FIGS. 6A-FFE, e.g., rotation of one or more hoist arm links coupled with simultaneous translation of the carriage such that the removable component travels along a generally linear axis perpendicular to the translation axis of the carriage. In other instances, the instructions may cause only the carriage translation system to move the first hoist arm while the hoist arm movement system is not causing the first hoist arm to move. In an illustrative example, referring to FIG. 12, the hoist feature engagement interface 152 is engaged with the hoisting features of the removable top cover 1218 and the carriage translation system 1288 may cause the first carriage 122, and therefore the removable top cover 1218, to translate along the second axis 124. During this movement, the hoist arm movement mechanism 1290 and first vertical translation system 162 may not be causing the first hoist arm 130 to move.

The instructions may also cause the disengagement of the hoisting features of the removable component and the hoist feature engagement interface of the first hoist arm, e.g., after the removable component has been returned to its original location and reinstalled. In FIGS. 4A and 4B, this may include lowering the first hoist arm 130 such that the second mechanical interface features 151A and 151B are removed from the holes 144A and 144B.

In some embodiments, the tool may also include a first carriage position sensor that is configured to generate data about the position of the first carriage along the first linear guide system. Referring back to FIG. 13, the first carriage position sensor 1298 is seen positioned on the first carriage 122 and it is communicatively connected, through a wired or wireless connection, to the controller 1292 such that the controller 1292 can receive data generated by the first carriage position sensor 1298. The controller 1292 can also interpret and determine from this data the position of the first carriage 122 along the first linear guide system 120, including data regarding which of the semiconductor processing chambers 104 is closest to the first carriage 122 and which are immediately adjacent to, or next to, the first carriage 122. For example, in FIG. 13, the first carriage position sensor 1298 may generate data that indicates that the first carriage 122 is closest to semiconductor processing chamber 104A and adjacent to semiconductor processing chamber 104B. The carriage position may allow for a determination as to which semiconductor processing chamber can be accessed by the hoist arm. For instance, in FIG. 6A, the carriage position sensor 1298 may indicate that given the first carriage 122 is next to both semiconductor processing chambers 104A and 104B, the first hoist arm may be able to access the removable component of both of these processing chambers.

In some implementations, the tool may also include a first arm position sensor that is configured to generate data about the position of the first hoist arm relative to the semiconductor processing chambers. In FIG. 13, the first arm position sensor 12100 is positioned on the first hoist arm 130 and is communicatively connected, through a wired or wireless connection, to the controller 1292 such that the controller 1292 can receive data generated by the first arm position sensor 12100. The controller 1292 can also interpret and determine from the carriage position data and/or the arm position data the position of the first hoist arm 130 relative to each semiconductor processing chamber 104, including which hoisting features can be engaged by the first hoist arm 130 given the position of the first carriage 122, which processing chamber(s) 104 are immediately adjacent to, or next to, the first hoist arm 130, the position of the pivot section (i.e., shoulder) of the first hoist arm 130 relative to each semiconductor processing chamber 104, the positioning of the first hoist arm 130 relative to the hoisting features of each removable component on each semiconductor processing chamber 104, and the position of the first hoist arm 130 along the vertical axis (e.g., determining the vertical position of the first hoist arm and of the hoist feature engagement interface relative to the hoisting features of the removable components). The data may also include distances of aspects of the first hoist arm 130 from various features of the tool (this may be through the use of proximity sensors, for example). In some embodiments, the tool may also include an arm position sensor that is configured to generate data about the position of the hoist arm rotated about the vertical axis. The controller may determine from this data, for example, whether the arm is properly positioned such that when translating vertically known obstructions will be avoided or that hoisting features will be engaged. The controller may also include instructions to prevent the vertical translation system from causing the arm to translate, or not translate, vertically above or below a certain elevation.

For instance, the first arm position sensor 12100 may generate data that indicates the position of the first hoist arm, including the horizontal and vertical position of its hoist feature engagement interface relative to the hoisting features of the semiconductor processing chambers; this position data can be used to determine which hoisting features can be engaged by the first hoist arm 130. In FIG. 6A, for instance, the first arm position sensor 12100 may generate data that can be used by the controller to determine the hoist feature engagement interface can engage with the hoisting features of semiconductor processing chamber 104A. As noted above, the controller may determine the position of the first arm 130 along the vertical axis and further determine this positioning relative to the hoisting features of the removable components. In some embodiments, the tool may have two or more arm position sensors that all generate data about the position of the first hoist arm relative to the processing chamber(s).

In some embodiments, the tool may also include an engagement sensor that is configured to generate data about whether the hoist feature engagement interface is engaged with the hoisting features of any of the semiconductor processing chambers. In FIG. 13, the engagement sensor 12102 is positioned on the first hoist arm 130 and it is communicatively connected, through a wired or wireless connection, to the controller 1292 such that the controller 1292 can receive data generated by the engagement sensor 12102. The controller 1292 can also interpret and determine from this data whether the hoist feature engagement interface is engaged with any of the hoisting features. For example, the engagement sensor 12102 may be an electrically conductive surface that is configured to electrically contact another electrically conductive surface on the hoisting features such that electrical continuity is created between these electrically conductive surfaces when the hoist feature engagement interface is engaged with the hoisting features. Referring back to FIGS. 4A and 4B for instance, a first electrically conductive surface may be positioned on a top surface of the first structure 138 which can contact a second electrically conductive surface on the underside of a saddle plate 150A or 150B when the hoist feature engagement interface 152 is engaged with the hoisting features 142A and 142B. The controller 1292 may detect whether electrical community exists between these two surfaces and determine engagement between the hoist feature engagement interface and the hoisting features. The engagement sensor may be other types of sensors, such as proximity sensors, contact switches, visual sensors, and the like. In some implementations, the controller 1292 may include instructions that prevent the vertical translation system from causing the first arm to translate vertically, or not translate above a certain level (thus allowing for sufficient vertical translation to cause engagement of the hoist feature engagement interface with the hoisting features, but preventing further translation that would act to actually exert a lifting load on the removable component), when the hoist feature engagement interface is not engaged with any of the hoisting features.

In some embodiments, the tool may also include an alignment sensor that is configured to generate data about whether the hoist feature engagement interface is aligned with the hoisting features of any of the semiconductor processing chambers. This data may be used, in some instances, to determine whether vertical movement of the first hoist arm 130 will cause engagement between the hoisting features and the hoist feature engagement interface. The alignment sensor may be positioned on the first hoist arm 130, the removable components, or both, and communicatively connected, through a wired or wireless connection, to the controller 1292 such that the controller 1292 can receive data generated by the alignment sensor. The controller 1292 can therefore interpret and determine from this data whether the hoist feature engagement interface is properly aligned with the hoisting features of any removable component such that vertical movement of the first hoist arm will engage these items. For example, referring back to FIGS. 4A and 4B, the alignment sensor may be able to generate data such that the controller 1292 can determine whether the holes 144A and 144B are underneath and aligned with the second mechanical interface features 151A and 151B such that upwards movement of the first hoist arm 130 will cause the second mechanical interface features 151A and 151B to be inserted into the holes 144A and 144B. Such alignment sensors may be visual, magnetic, or proximity sensors, for instance.

The controller may utilize the data from any of the above-referenced sensors to perform the movements of the first carriage and removable components as described above. For example, referring to FIG. 13, the controller 1292 may first determine the positioning and engagement of the first carriage 122; as shown in FIG. 13, these determinations are that the first carriage 122 is positioned closest to semiconductor processing chamber 104B, that the first hoist arm 130 is closest to semiconductor processing chamber 104C, and that the hoist feature engagement interface is not engaged with any hoisting features. If the removable component of semiconductor processing chamber 104A is desired to be moved, the controller 1292 may then use these determinations and data to move the first carriage 122 and/or the first hoist arm 130 so that the first hoist arm 130 can engage with the hoisting features of this semiconductor processing chamber 104A. This movement may include instructing the carriage translation system 1288 to move the first carriage 122 closer to semiconductor processing chamber 104A and rotating the first hoist arm 130 so that it is closer to semiconductor processing chamber 104A than is depicted in FIG. 13, e.g., clockwise by approximately 180 degrees.

In some embodiments, the tool may have various safety features. For instance, the controller may be configured to receive information regarding an operational state of each semiconductor processing chamber. This operational state may be whether the semiconductor processing chamber is actively processing a substrate and whether the semiconductor processing chamber is in a personnel-safe state for a person to access the chamber, such as the chamber being unpowered, the pressure being at ambient pressure, and the volatile chemicals having been removed from the chamber. If the controller receives information, or determines, that one of the semiconductor processing chambers is in a personnel-safe condition, then the controller may permit the carriage translation system, the hoist arm movement system, and/or the vertical translation system to operate and move the removable component of that semiconductor processing chamber. Similarly, if the controller receives information or determines that one of the semiconductor processing chambers is not in a personnel-safe condition, then the controller may prevent the carriage translation system, the hoist arm movement system, and/or the vertical translation system from operating in a way that would cause the removable component of that semiconductor processing chamber to be moved (although it may allow for movement of movable components of other chambers on the tool that are in a safe condition for such activities).

In some embodiments, each semiconductor processing chamber may have an electrical interface, such as an electrical outlet, that is configured to be connectable with an electrical cable of the first carriage; such an electrical interface may be located on the removable portion thereof. This electrical cable may be electrically connected with a power supply on the first carriage or with another power supply on the tool such as a system power distribution box of the tool (SPDB). Power may be routed from the SPDB along the linear guide to the first carriage, terminated to the hoist mechanism, and also routed by the electrical cable along the first hoist arm. The electrical cable may be terminated by a connector that is configured to connect with the electrical interface of any of the removable components, and may be configured to supply power to such components if powered and the connector is connected. Providing power to the removable components may allow for servicing tasks to be performed on a removed removable component, such as driving motors located on the removable top cover during calibration, and keeping equipment powered and warm (such as manometers) that are located on the removable top cover to expedite servicing recovery time.

In some embodiments, the electrical interface may be used as part of a safety interlock. For instance, the controller may include instructions for determining the electrical continuity between the electrical cable and the electrical interface. If this electrical continuity is determined to exist, then the controller may permit the vertical translation or other movement mechanism on the first carriage to operate. Additionally, the controller may be able to determine whether a chamber is at atmosphere and permit the movement of a removable component, like the top plate, if the chamber is at atmosphere. In some embodiments, an atmosphere signal is generated by the chamber and relayed through the electrical interface and electrical cable which can be detected by the controller. The atmosphere signal may indicate that the chamber is and is not at atmosphere.

In some embodiments, the electrical cable may be routed along the first hoist arm and be of a length such that the connector and the hoist feature engagement interface of the first hoist arm are only simultaneously engageable with the electrical interface and hoisting features, respectively, of a single one of the semiconductor processing chambers at a time. For example, referring back to FIG. 5, the first carriage 122 includes the electrical cable 1104 that is routed along the first hoist arm 130 and of a length such that the connector 1106 is connectable to the electrical interface 1108 of the removable top cover 118. Also, the length of the electrical cable 1104 simultaneously allows the connector 1106 to connect with the electrical interface 1108 of that semiconductor processing chamber and the hoist feature engagement interface to engage with the hoisting features of the removable top cover 118 thereof, like as described in FIGS. 4A and 4B, but prevents the connector 1106 from being connected to a similar electrical interface of any other removable top cover while the first hoist arm is engaged with the hoisting features of the depicted removable top cover 118. For example, referring to FIG. 12, the length of the electrical cable 1104 prevents the connector 1106 from simultaneously connecting with the electrical interface 1108 of the removable top cover 118 of semiconductor processing chamber 104B when the hoist feature engagement interface is engaged with the hoisting features of the removable top cover 118 of semiconductor processing chamber 104A.

In some other embodiments, the electrical interface may provide power to components on the carriage. The electrical interface may be positioned on a fixed location of each semiconductor processing chamber or may be positioned on a removable component, The electrical cable may be connected with one or more of the motors of the first carriage, such as the motor of the vertical translation system and the motor of the hoist arm movement system (if present), and terminated by a connector that is configured to connect with the electrical interface of any of the removable components, and may be configured to supply power to such components if powered and the connector is connected.

In some implementations, the controller may also include instructions for powering the electrical interface of semiconductor processing chambers based on data from one or more of the above-referenced sensors. For example, in some implementations, the controller may cause, based on the determination of the position of the first carriage, only the electrical interface of one semiconductor processing chamber of the first plurality of semiconductor processing chambers at a time to be powered, and only when it is determined that the operational state of that semiconductor processing chamber is in a condition where removal of the cop cover is safe. If multiple carriages/hoists are included for a single plurality of semiconductor processing chambers, then such functionality may expand to only allow the electrical interface of particular semiconductor processing chambers to be powered when one of the carriages/hoist arms is determined to be located in a position suitable for removing the removable component from that semiconductor processing chamber and also only when that semiconductor processing chamber is determined to be in an operationally safe state. Referring to FIG. 13 for instance, the controller 1292 receives data regarding the position of the first carriage 122 from the first carriage position sensor 1298, determines the position of the first carriage based on this data, and then may only power the electrical interface of semiconductor processing chamber 104B (after that chamber is determined to be in a "safe" state) because the hoisting features of the first arm 130 can only reach the removable component of semiconductor processing chamber 104A1. As noted above, this "safe" state may be when a person can safely access the chamber, such as when the chamber is unpowered, the chamber pressure is at ambient pressure, at a low enough temperature for personnel to handle the removable component, and any volatile or hazardous chemicals have been removed from the chamber and the removable component is unlatched or unbolted from the chamber.

Similarly, the controller 1292 may include instructions that control the processor 1296 to cause, based on the determination of the position of the first hoist arm 130 and the first carriage 122, only the electrical interface 1108 of the semiconductor processing chamber of the first plurality of semiconductor processing chambers that has hoisting features engageable by the hoist feature engagement interface 152 of the first hoist arm 130 to be powered. Again, in FIG. 13 for example, these determinations may indicate that the hoisting features of the removable component of semiconductor processing chamber 104A are engageable by the hoist feature engagement interface of the first hoist arm 130 and the controller 1292 may then, because of this, power the electrical interface 1108 of semiconductor processing chamber 104C.

Additionally or alternatively, the controller may cause, in response to determining that the hoist feature engagement interface is engaged with the hoisting features of one of the removable top covers of the first plurality of semiconductor processing chambers, like described above, only the electrical interface of the semiconductor processing chamber of the first plurality of semiconductor processing chambers that contains that removable top cover to be powered. In FIG. 13 for instance, it may be determined, based on the data generated by the engagement sensor 12104, the first arm position sensor 12100, and the carriage position sensor 1298, that the hoist feature engagement interface of the first hoist arm 130 is engaged with the hoisting features of the removable component of semiconductor processing chamber 104C and based on that determination, the controller 1292 may only power the electrical interface of semiconductor processing chamber 104C.

In some embodiments, the engagement sensor may be considered a first interlock sensor that is configured to generate data about whether the hoisting features are engaged with the hoist feature engagement interface. The instructions may cause the controller to control the processor to determine, based on the data generated by the first interlock sensor, whether the hoist feature engagement interface is engaged with the hoisting features of one of the removable components of the first plurality of semiconductor processing chambers. The instructions may also cause, in response to both receiving a first input signal to cause the vertical translation system to operate and determining that the hoist feature engagement interface is engaged with the hoisting features of one of the removable top covers, the vertical translation system to translate the first hoist arm vertically. The instructions may further prevent, in response to both receiving the first input signal to cause the vertical translation system to operate and determining that the hoist feature engagement interface is not engaged with the hoisting features of one of the removable top covers, the vertical translation system from causing the first hoist arm to translate vertically.

In some embodiments, another safety feature that may be included is that the movement of the first hoist arm may be restricted to a sector less than 360 degrees, such as within a sector of substantially 180 degrees or 270 degrees, for instance (substantially means within +/−10 degrees). This restriction may be provided through the use of a physical hardstop or hardstops, such as a pin or pins, that prevents the first hoist arm from rotating to locations outside of the sector or it may be provided by instructions within the controller, if present, that prevent the motor from causing the first arm from rotating to positions outside of that sector. In some instances, the first hoist arm restricted so as to be movable only on a first side of a vertical plane that passes through the first carriage, is parallel to the vertical axis and is perpendicular to the second axis. Referring to FIG. 6B for example, the vertical plane 1110 is shown and is substantially perpendicular (e.g., within +/−5 degrees of normal) to the second axis 124, substantially parallel (e.g., within in +/−5 degrees of parallel) to the vertical axis 134, and passes through the first carriage 122. Here, the first hoist arm 130 is only rotatable to positions located on the left side of the vertical plane 1110. As stated above, the instructions may control the one or more processors to cause the first hoist arm 130 to move only on the first side, or the left side, of this vertical plane 1110. Alternatively, such rotational limit features may operate to restrict rotational motion of the hoist arm only to positions on the right side.

To avoid any potential confusion, it should be noted that the carriages and hoist arms discussed herein are not equivalent to robotic arms or end effectors that are intended or configured to transport substrates. Furthermore, the removable component of the semiconductor processing chambers described herein are not to be viewed as substrates, the hoist arms described herein are not configured or intended to support a substrate, and the hoist feature engagement interface is not configured or intended to support a substrate.

In some implementations, instead of using a carriage and hoist arm system that is intended to be permanently mounted to the semiconductor processing tool and is entirely supported by the linear guide system to which it is attached, a hoist system may be used that is detachable from the semiconductor processing tool. In such alternate systems, a hoist arm may be attached to a removable vertical member that is equipped with a vertical translation system (it is to be understood that references to "vertical" in this implementation refer to the orientation of components when the hoist system is installed on a semiconductor processing tool; clearly if such a hoist system is removed from the semiconductor processing tool, rotated 90°, and laid flat on the floor, then parts that were previously describable as "vertical" would technically be horizontal, and vice versa—for the purposes of this disclosure, such components would still be potentially describable as "vertical"). The removable vertical member may include one or more mechanical interfaces that allow the removable vertical member to be connected with corresponding attachment points located at various locations on the semiconductor processing tool, such as the upper support framework or other lower portions of the tool, like a lower framework. The bottom of the vertical member may be equipped with rollers or wheels to allow it to be wheeled about in a semiconductor processing facility and positioned so as to be positioned in locations that allow it be interfaced with different semiconductor processing tools. The vertical member itself may have one or more arm links that are supported by a vertical translation system that is mounted to the vertical member. Once the vertical member is attached to the upper support framework for a semiconductor processing tool, the vertical translation system may be used to drive the one or more arm links up and down vertically.

Such a hoist system may be designed such that it is not able to be freestanding and/or not able to support a removable component without being attached to some form of support on the tool, e.g., via the attachment points on the upper support framework. Thus, for example, in some embodiments the hoist system may lack support legs (as discussed earlier in this disclosure) that extend to locations generally underneath the hoist arm and that would act to keep the hoist system from falling over due to the weight of the hoist arm (and whatever it is lifting). In another example, the hoist system may have a light-weight support system that can only support the weight of the hoist system itself, but not the weight of a removable component. Existing free-standing hoist systems include legs or equivalent structure that extends to locations generally underneath the hoist arm. In contrast, the removable hoist systems discussed herein are not capable of supporting the weight of the hoist arm and/or the removable component without some form of external support.

When such a hoist system is attached to a semiconductor processing tool via one or more of the attachment points, the attachment points may serve to take primarily lateral loads, whereas axial (vertical) loads may instead be routed through the length of the removable vertical member and out through the bottom of the removable vertical member and into the facility floor (perhaps, for example, through the wheels that may, in some instances, be located at the base of the removable vertical member. Thus, any torque that results from vertical loads applied off of the centerline of the removable vertical member may be countered by resistive forces exerted by the attachment point(s) to which the hoist system is attached. In some instances, the attachment points may take the lateral loads and some or all of the vertical loads. Here, the tool may include upper and lower attachment points that can support lateral and some or all of the vertical loads of the hoist system. The above-mentioned torque can be countered by these multiple attachment points at the ends of the hoist system's vertical member. The vertical loads can also be routed to the vertical member, to the upper attachment points and the upper support frame, as well as to the lower attachment points, and ultimately to the floor as opposed to through the wheels of the hoist system. This may enable the vertical member and its movement mechanism to be lighter weight and have less load-bearing structure.

Because such hoist systems do not need to be self-supporting, they may have a very small footprint and lower weight than free-standing hoist systems. This permits them to be more easily handled by personnel and allows them to be used in more cramped locations.

The present disclosure therefore includes additional, alternate embodiments of another example semiconductor processing tool that does not have the linear guide system and carriage described above, but rather has a detachable hoist system. In these alternate hoist system embodiments, the tool may still include the upper support framework, the pluralities of semiconductor processing chambers arranged along a first axis, and base portions fixedly attached to the upper support framework. In some such implementations, the semiconductor chambers may be arranged other than along a linear axis, e.g., in a circular arrangement.

In some of these alternate embodiments, the detachable hoist system is supported by the floor of the Fab, connectable to the support frame at an elevated attachment point, and has a hoist arm. The detachable hoist system is portable such that it can be moved on the floor of the Fab within the service area to a position alongside the tool and then secured to the upper support framework at an attachment point on the upper support framework. Once in position and connected to the upper support framework, the hoist arm and a vertical translation system are used to lift, lower, and move one or more removable components of the semiconductor processing tools. As discussed in greater detail below, the hoist arm and the vertical translation system may be the same or similar to the hoist arm and vertical translation systems described above.

Figure 14:
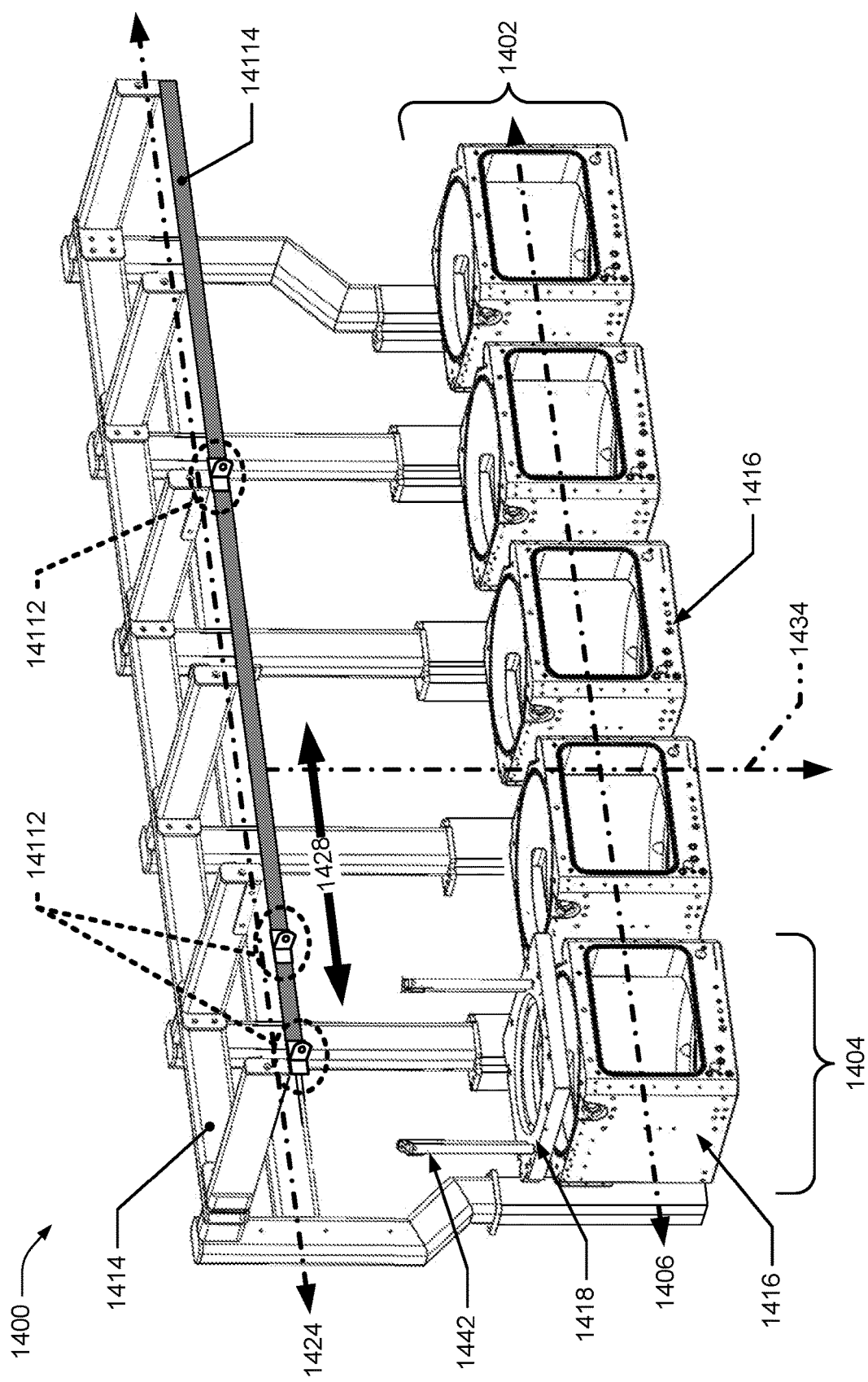
FIG. 14 depicts another example semiconductor processing tool.

FIG. 14 depicts another example semiconductor processing tool; this Figure is similar to FIG. 2, but with noted differences. In these embodiments, the other example tool 1400, like described above, includes the upper support framework 1414, the first plurality 1402 of semiconductor processing chambers 1404 arranged along the first axis 1406, base portions 1416 fixedly attached to the upper support framework 1414, as well as removable components, such as removable top cover 1418, with hoisting features, such as second structures 1442, as described above.

In contrast to tool 100, the other tool 1400 includes an attachment system that may include one or more attachment points 14112 fixedly supported by the upper support framework 1414. In some embodiments, two or more of the attachment points 14112 may be connected to the upper support framework 1414 in fixed positions, with respect to the upper support framework 1414, along the second axis 1424. In some other embodiments, the attachment system may include a guide rail to which one or more attachment points are movably connected. For example, guide rail 14114, highlighted with shading, is depicted in FIG. 14 extends along the second axis 1424, similar to the first linear guide system described above, and the one or more attachment points 14112 are moveably connected to the guide rail 14114 such that the one or more attachment points 14112 can translate along the second axis 1424 as indicated by arrow 1428. In some such implementations, the attachment points may be able to be tightened or loosened so as to be fixed in space with respect to the guide rail when tightened or slideable along the guide rail when loosened, which may permit re-adjustment of the locations of the attachment points to accommodate new tool configurations or modifications to maintenance procedures. As discussed below, the one or more attachment points 14112 of the attachment system serve as locations, i.e., the elevated connection points, where the detachable hoist system can be attached and connected to the upper support framework 1414.

Figure 15B:
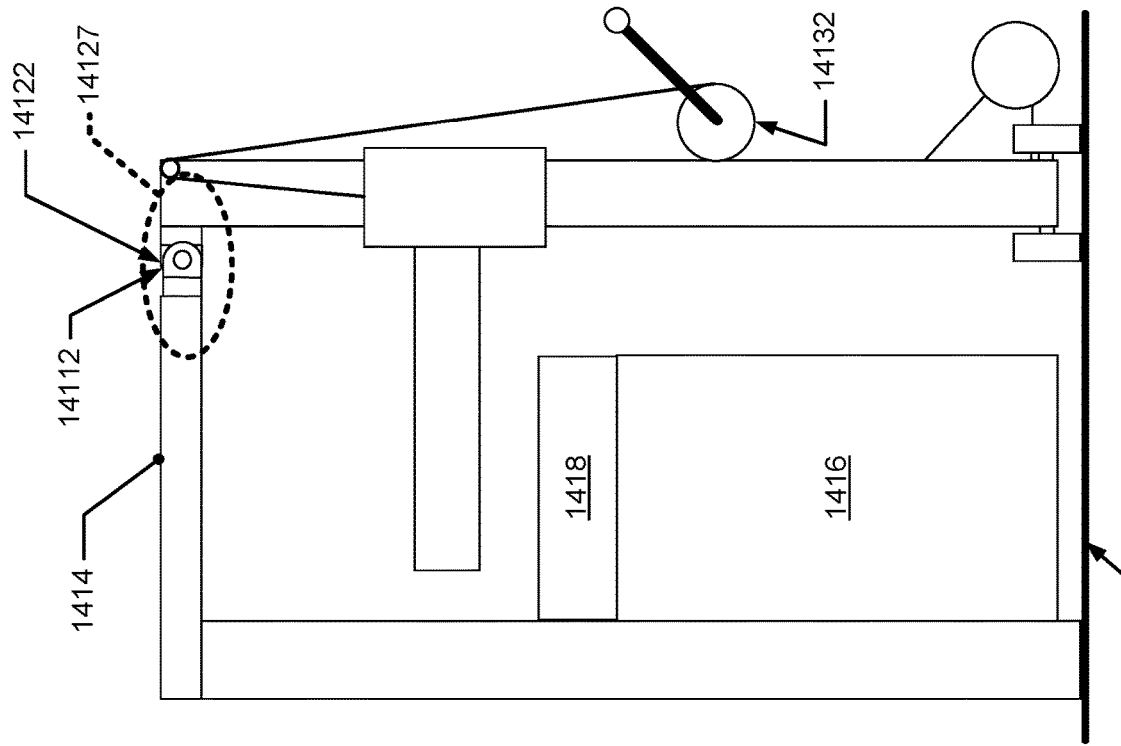
FIGS. 15A and 15B depict side views of the other example semiconductor processing tool of FIG. 14 and a first example detachable hoist system.
Figure 15A:
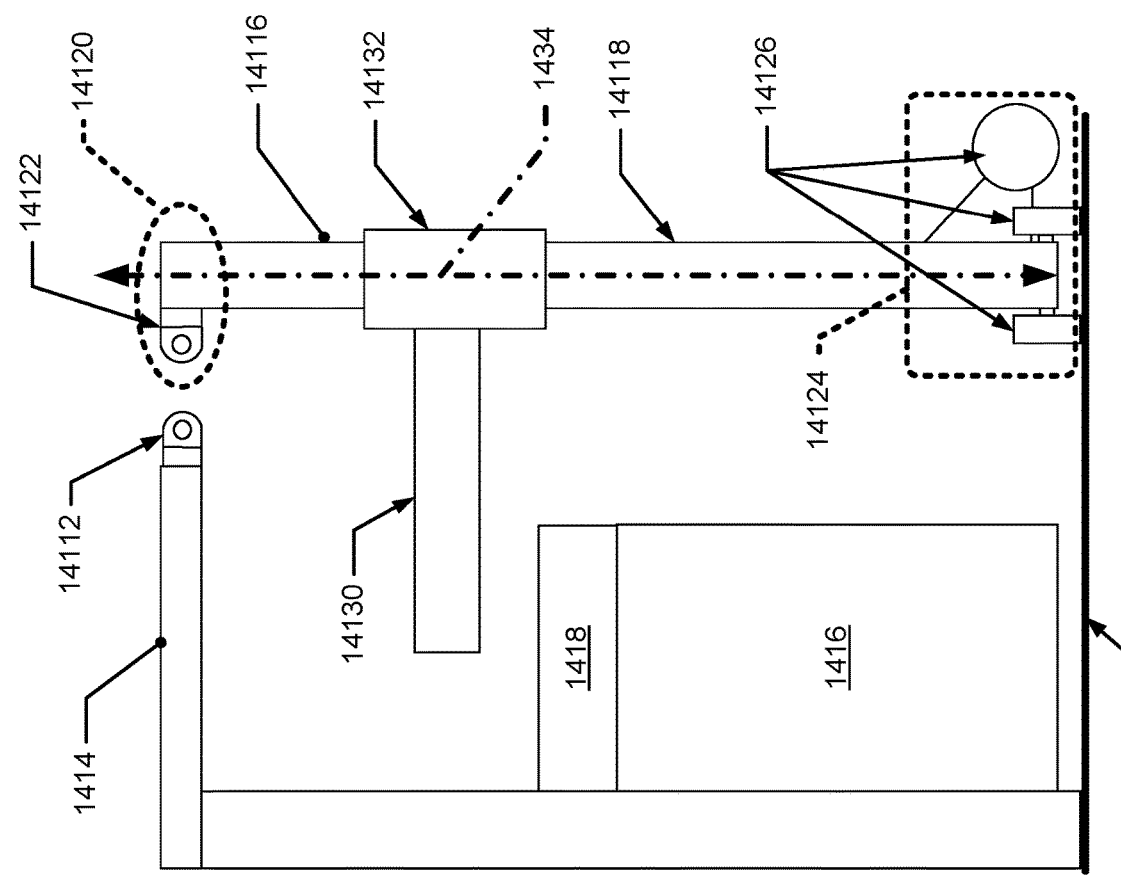

FIGS. 15A and 15B depict side views of the other example semiconductor processing tool of FIG. 14 and a first example detachable hoist system. In FIG. 15A, one base portion 1416 is seen attached to the upper support framework 1414 and has a removable component 1418. One attachment point 14112 is also seen connected to the upper support framework 1414; this may be a moveable or a fixed connection point as discussed above. The first example detachable hoist system 14116 is also seen and includes a vertical member 14118 having a top end 14120 to which a complementary attachment point 14122 is attached, and a bottom end 14124 to which a movement mechanism 14126, such as wheels or tracks, is attached. The movement mechanism 14126 may be positioned on and supported by the Fab floor 14128 and allows the first example detachable hoist system 14116 to be moved about the Fab floor in various directions. The complementary attachment point 14122 is configured to be connected or attached to the attachment point 14112 of the attachment system as illustrated in FIG. 15B; when they are connected as illustrated with identifier 14127, the first example detachable hoist system 14116 is attached to the upper support framework 1414. This attachment provides lateral support to the first example detachable hoist system 14116 that enables it to have a relatively small footprint that can fit within the service area 1415 and in close proximity to the tool 1400 and enables the first example detachable hoist system 14116 to lift, lower, and support heavy removable components of the tool 1400. Without this elevated attachment between the upper support framework 1414 and the detachable hoist system 14116, the first example detachable hoist system 14116 would not be able to lift, move, or support the removable components and would instead fall over without support features that extend along the Fab floor, like the feet that extend from traditional lifting mechanisms, that may be larger than the allowable area between tools.

The first example detachable hoist system 14116 also includes a hoist arm 14130 that may be the same or similar to the first hoist arm described above. For instance, the hoist arm 14130 may include a hoist feature engagement interface as described above and may be configured to pivot about the vertical axis 1434 which is perpendicular to the second axis 1424 and the first axis 1406 and extends through the vertical member 14118. In some embodiments, the first example detachable hoist system 14116 may also include a vertical translation system 14132 that is configured to cause the hoist arm 14130 to translate along the vertical axis 1434 in the direction of arrow 1464, like described above. As stated above, the vertical load of the removable component is carried by the hoist arm 14130 and the vertical member 14118 which is transferred to the Fab floor by the first example detachable hoist system's 14116 connection with the Fab floor.

This vertical translation system 14132 may be motorized or manually powered, such as by a hand crank or cable and winch, as depicted in FIG. 15B. In some embodiments, once the complementary attachment point 14122 of the first example detachable hoist system 14116 is connected to the upper support framework 1414 at the attachment point 14112, the hoist arm 14130 is moveable such that the hoist feature engagement interface can be moved so as to be engaged with the hoisting features of one of the removable components of the first plurality 1402 of semiconductor processing chambers 1404. The movability of the hoist arm 14130 may be the same as described above, including as depicted in FIGS. 6A-6E, for instance, such that it can be moved horizontally or within a plane perpendicular to the vertical axis 1434.

In some embodiments, the first example detachable hoist system 14116 is configured to translate along the second axis 1424. In some such embodiments, the attachment system may have the guide rail 14114 and moveable attachment points 14112 that are connected to the guide rail 14114 and moveable along the second axis 1424, as described above, such that when the complementary attachment point 14122 of the first example detachable hoist system 14116 is connected to the upper support framework 1414 at the attachment point 14112, the first example detachable hoist system 14116 and the attachment point 14112 are simultaneously moveable together along the second the second axis 1424 as indicated by the arrow 1428 in FIG. 14. In FIGS. 15A and 15B, this movement may be considered into and out of the page. This movement enables the first example detachable hoist system 14116 to connect with, lift, move, and lower any of the removable components of the first plurality of semiconductor processing chambers 1402. In such embodiments, the movement mechanism 14124 is contacting the Fab floor 14128 and enables the vertical member 14118, along with the rest of the first example detachable hoist system 14116, to move along the second axis 1424.

Figure 16:
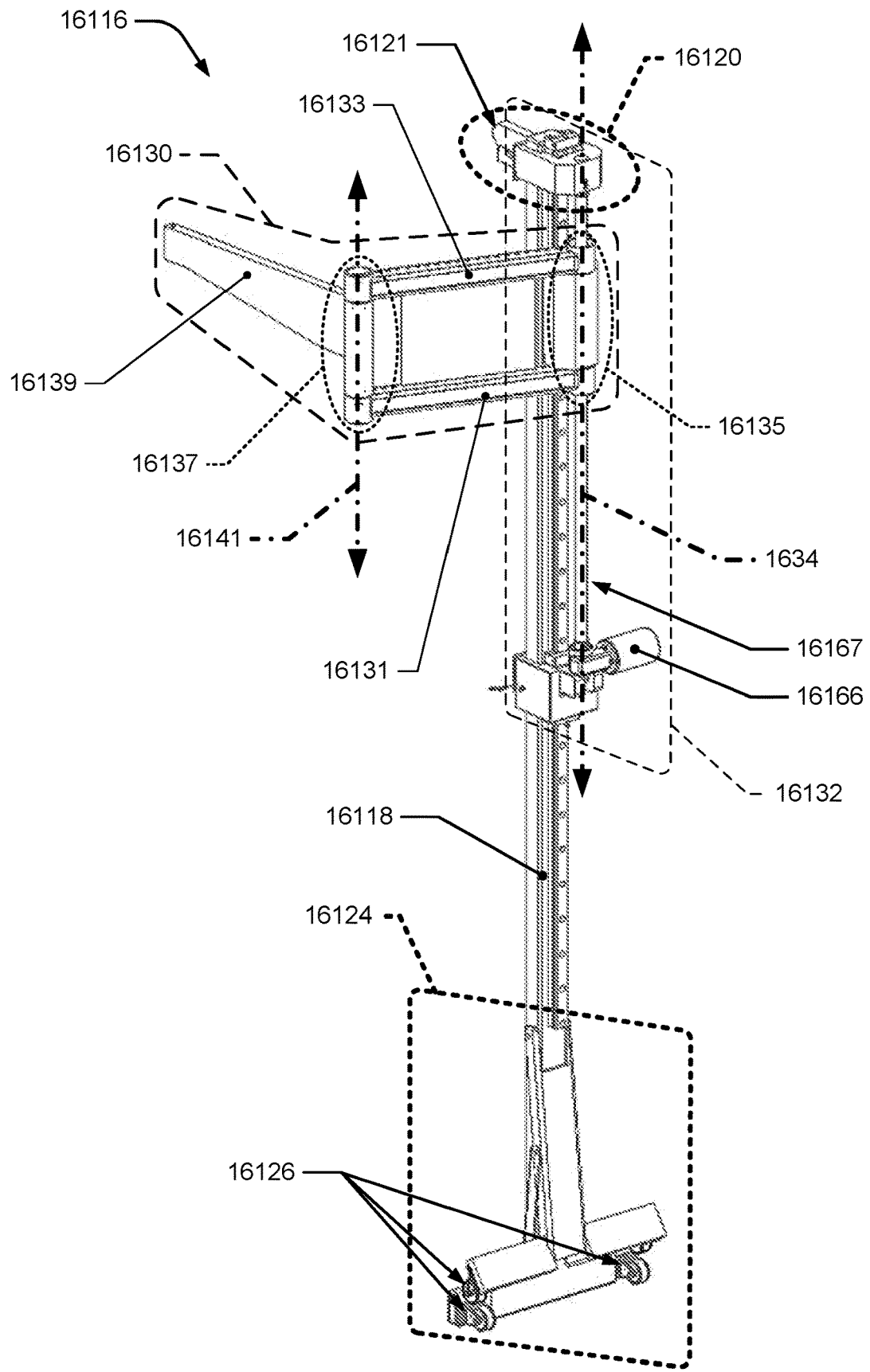
FIG. 16 depicts a perspective view of a second example detachable hoist system.

In some embodiments, a second example detachable hoist system may be provided which is configured similarly, but different in some respects, to the first example detachable hoist system. This second example detachable hoist system includes a vertical member, a hoist arm, at least one attachment point for connecting to the tool, wheels or rollers that allow it to be moved about a semiconductor processing facility, and additional features and configurations described herein. In some instances, the second example detachable hoist system may not be able to be freestanding on its own or able to support the load of a removable component without being connected to the tool. FIG. 16 depicts a perspective view of the second example detachable hoist system 16116 which includes a vertical member 16118 with a top end 16120 having an elevated attachment point 16121 (also referred to herein as the complementary attachment point) and a bottom end 16124 having a movement mechanism 16126, such as wheels or tracks, and further includes a hoist arm 16130 and a vertical translation system 16132.

Figure 21:
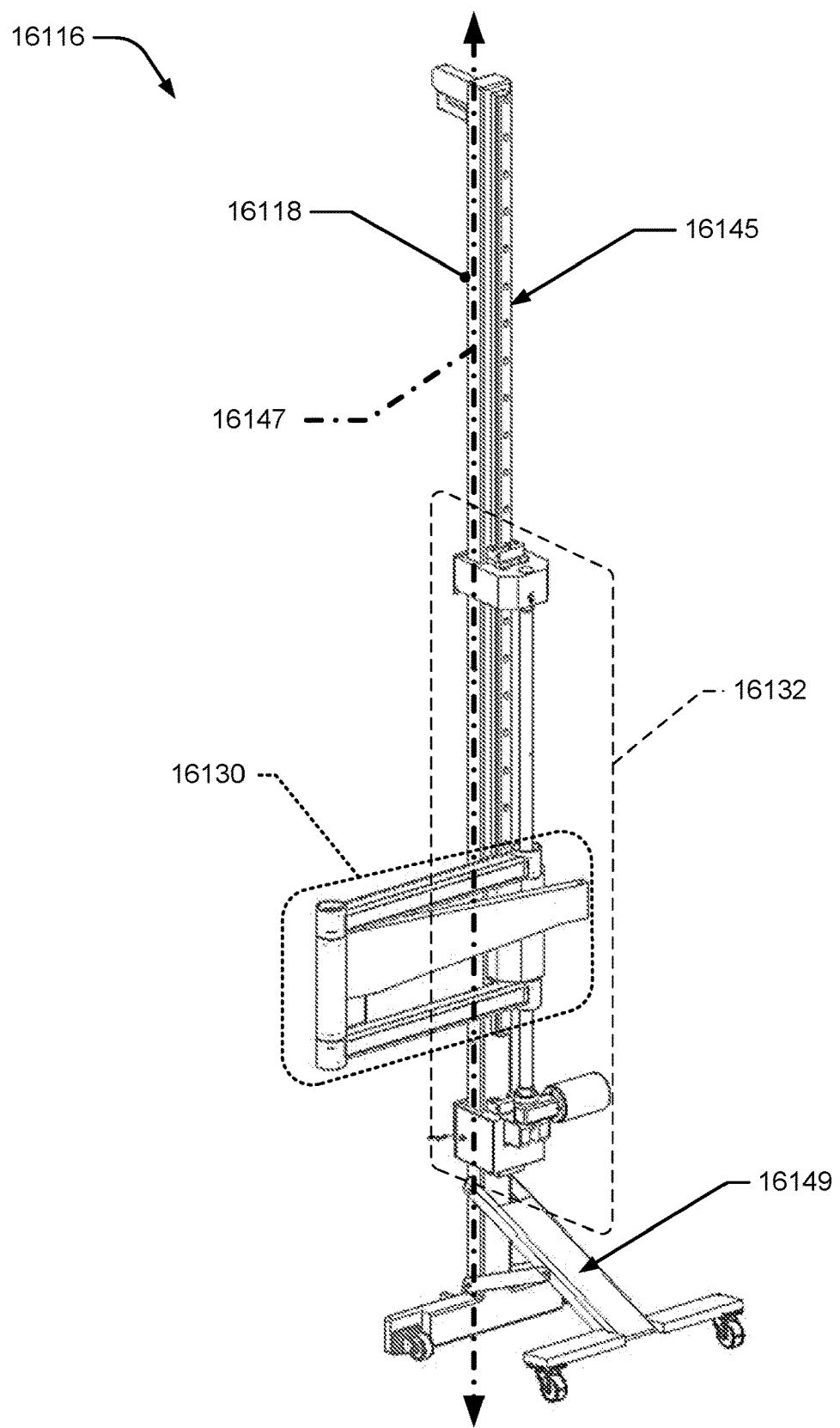
FIG. 21 depicts another configuration of the second example detachable hoist system of FIG. 16.

In some embodiments, the hoist arm 16130 may be the same or similar to the first hoist arm and the hoist arm 14130 described above. In some embodiments, the hoist arm 16130 may include two or more links as depicted in FIG. 16. Here, the hoist arm 16130 has three links, with a first link 16131 and a second link 16133 parallel to each other and forming a double shoulder joint 16135 and a double elbow joint 16137 with the third link 16139. The hoist arm 16130 is configured to pivot at the double shoulder joint 16135 about a vertical axis 1634 that is substantially parallel to a longitudinal axis of the vertical member 16118 (substantially means within, for example, about 5% or 1% of parallel). The longitudinal axis is depicted in FIG. 21, extends along the length of the vertical member 16118, and intersects the first end 16120 and second end 16124. The hoist arm 16130 is also configured to rotate, at the elbow joint 16137, about another axis 16141 that is parallel to the vertical axis 1634. The distal end of the third link 16139 of the hoist arm 16130 may have any of the hoist feature engagement interfaces described above such that it is configured to engage with the hoisting features of any of the removable components described herein. Depending on the configuration of the hoist arm, it may be moveable like described above, including as depicted in FIGS. 6A-6E, for instance, such that it can be moved horizontally or within a plane perpendicular to the vertical axis 1634. This movement is also illustrated in FIGS. 20A and 20B.

This vertical translation system 16132 may be motorized or manually powered, such as by a motor 16166 and drive screw 16167 as depicted in FIG. 16. The vertical translation system 16132 is configured to cause the hoist arm 16130 to translate along the vertical axis 1634. Like described above, this enables the hoist arm 16130 to lift and lower a removable component of the tool.

Figure 17:
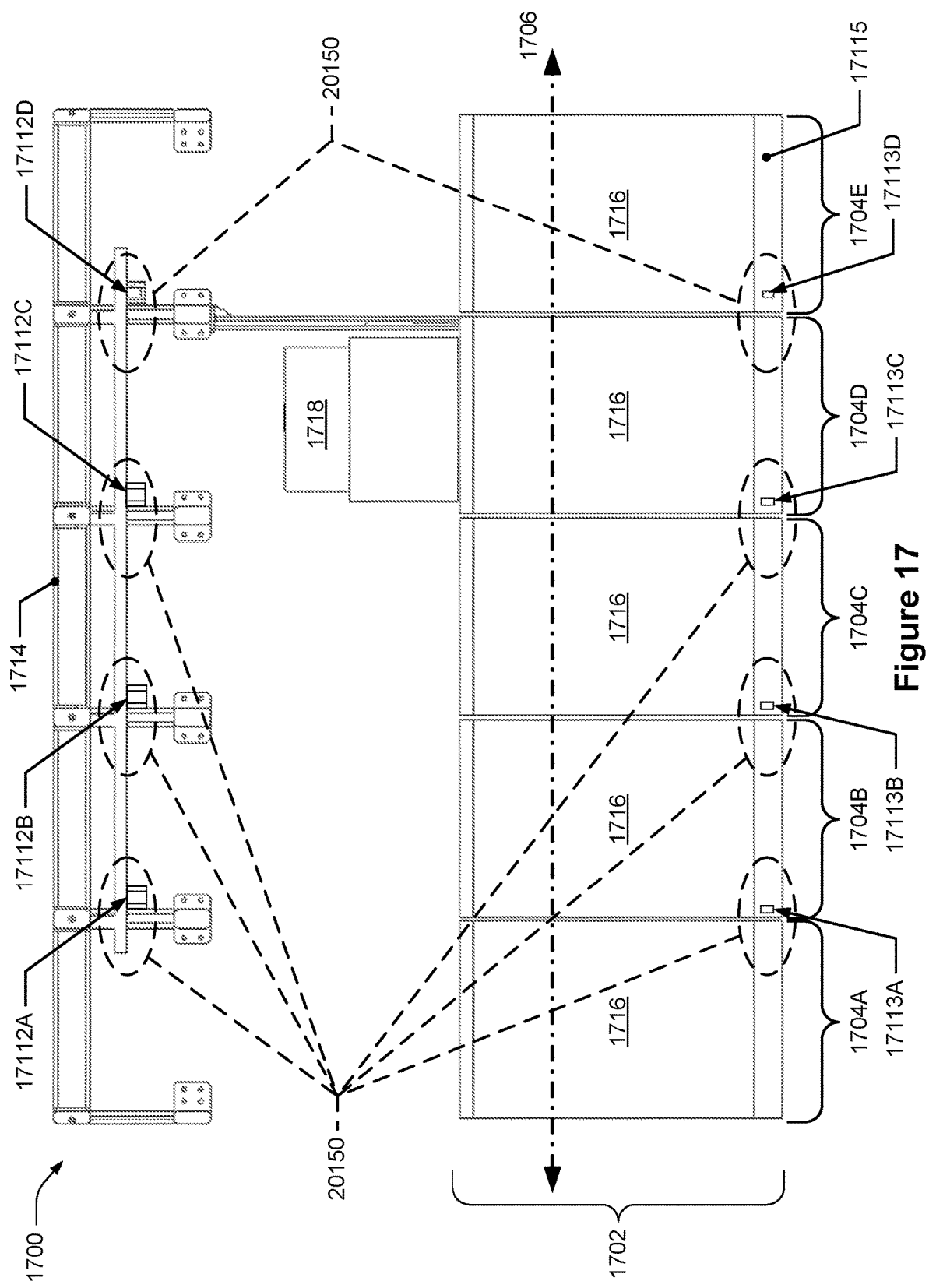
FIG. 17 depicts yet another example semiconductor processing tool.

The second example detachable hoist system may be attached to the tool in various ways. For example, like the first example detachable hoist system, the second example detachable hoist system may be connected to the tool at a single elevated attachment point while the bottom the second example detachable hoist system is positioned on and supported by the floor of the fabrication facility. In some embodiments, the second example detachable hoist system may be connected to the tool at two different attachment points, such as an upper and a lower attachment point. FIG. 17 depicts yet another example semiconductor processing tool. Similar to the other Figures above, the example tool 1700 includes the upper support framework 1714, the first plurality 1702 of semiconductor processing chambers 1704 arranged along the first axis 1706, base portions 1716 fixedly attached, directly or indirectly, to the upper support framework 1714, as well as removable components, such as removable top cover 1718, with hoisting features as described above. The tool also includes one or more upper attachment points 17112A-D that are fixedly attached to the upper support framework 1714, and one or more lower attachment points 17113A-D that are fixedly attached to a lower element of the tool, such as a lower frame or plate 17115. In some embodiments, as illustrated in FIG. 17, each upper attachment point has a corresponding lower attachment point and each pair may be positioned parallel to each other along an axis perpendicular to the first axis 1706, such as the vertical axis 1634.

Figure 18A:
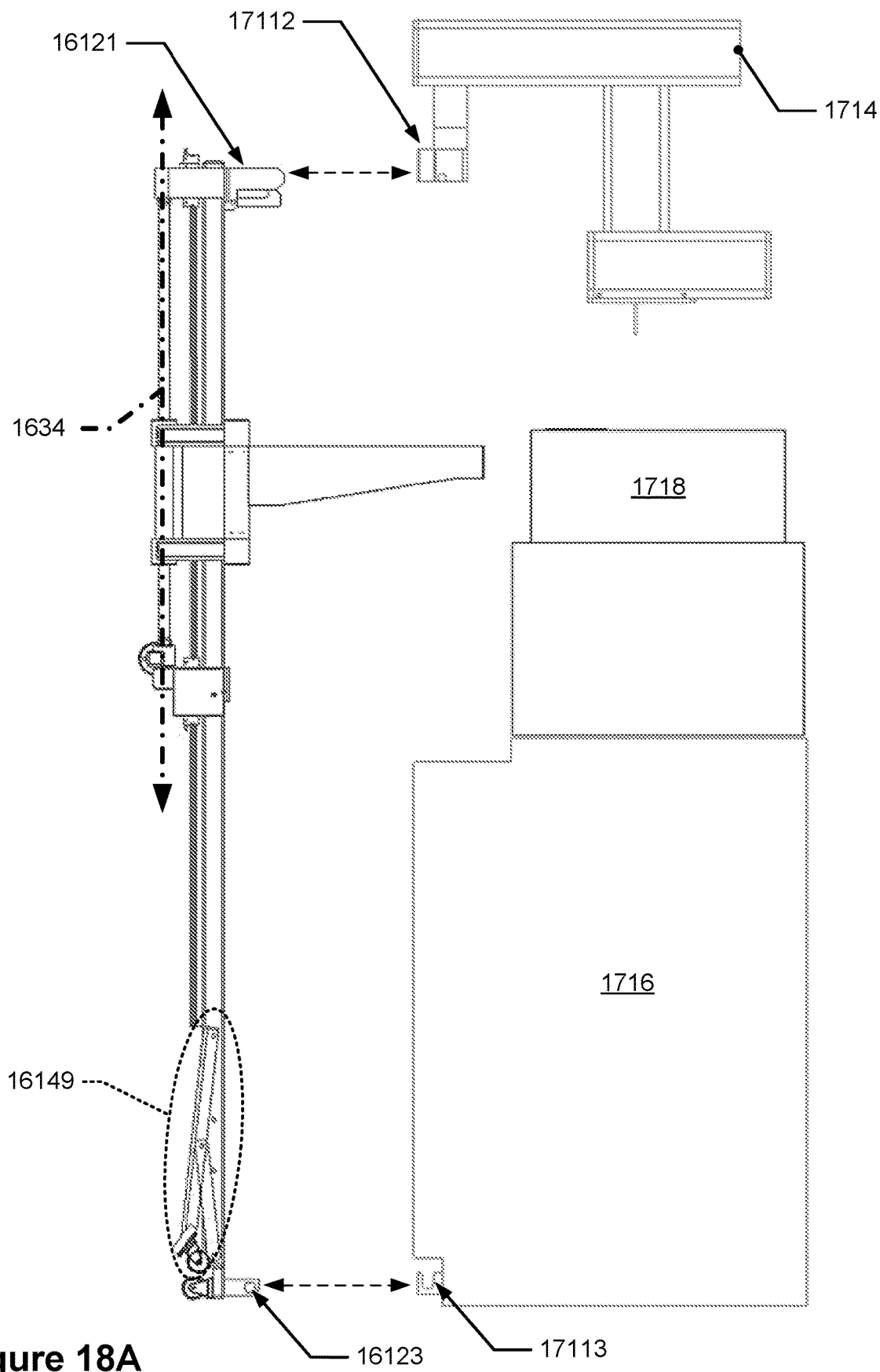
FIGS. 18A and 18B depict a side view of an attachment sequence between the tool and the second example detachable hoist system of FIGS. 16 and 17.
Figure 18B:
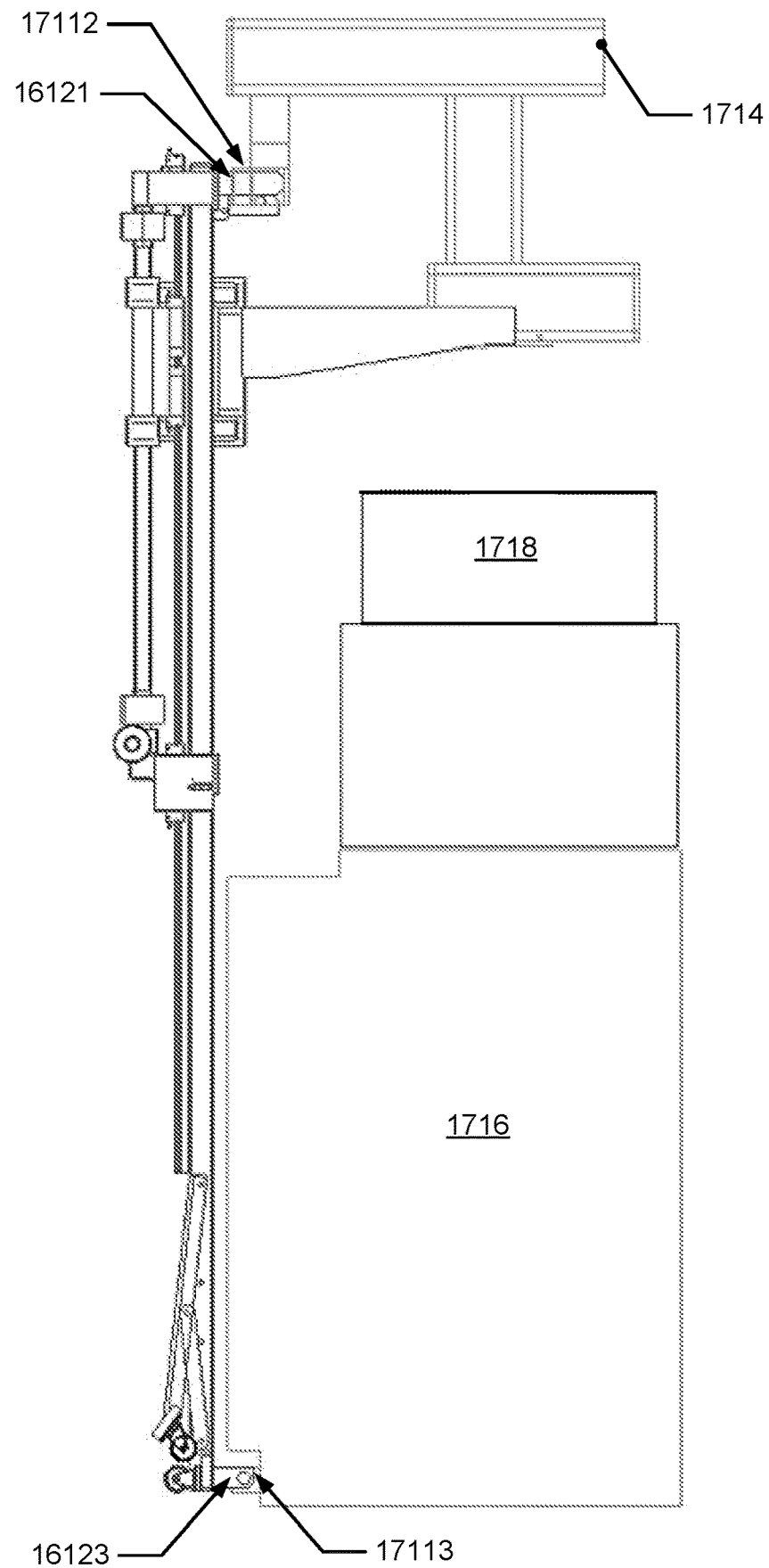

FIGS. 18A and 18B depict a side view of an attachment sequence between the tool and the second example detachable hoist system of FIGS. 16 and 17. In FIG. 18A, the second example detachable hoist system 16116 is separated from, but aligned with, the tool 1700 such that the upper attachment point 17112 of the tool 1700 can connect with the elevated attachment point 16121 of the second example hoist system 16116, and the lower attachment point 17113 of the tool can connected with a bottom attachment point 16123 of the second example detachable hoist system 16116, as indicated by the dashed double-sided arrows. The lower attachment point 17113 may be configured to support the weight of the second example hoist system 16116, such as having a U-shaped receptacle to receive a horizontal bar of the bottom attachment point 16123 as seen in FIG. 18A.

In FIG. 18B, the second example detachable hoist system 16116 is connected to the tool 1700 at the upper and lower attachment points 17112 and 17113 of the tool 1700. This attachment provides lateral and vertical support to the second example detachable hoist system 17116 which enables it to have a relatively small footprint that can fit within the service area and in close proximity to the tool 1700 and enables the second example detachable hoist system 17116 to lift, lower, and support heavy removable components of the tool 1700. Without these upper and lower attachments, the second example detachable hoist system 17116 would not be able to lift, move, or support the removable components without potentially falling over. In some embodiments, like depicted in FIG. 18B, when connected to the otool 1700, the second example detachable hoist system 16116 may not be directly contacted or supported by the floor of the fabrication facility. In some such embodiments, the vertical loads supported by the second example detachable hoist system 16116 are transferred to the tool 1700 through the upper and lower attachment points 17112 and 17113; these loads are not directly transferred to the floor through direct contact between the floor and the second example detachable hoist system 16116. In some other embodiments, the second example detachable hoist system 16116 may be directly contacted by and supported by the floor of the fabrication facility such that the vertical loads supported by the second example detachable hoist system 16116 are transferred directly to the floor.

Figure 19:
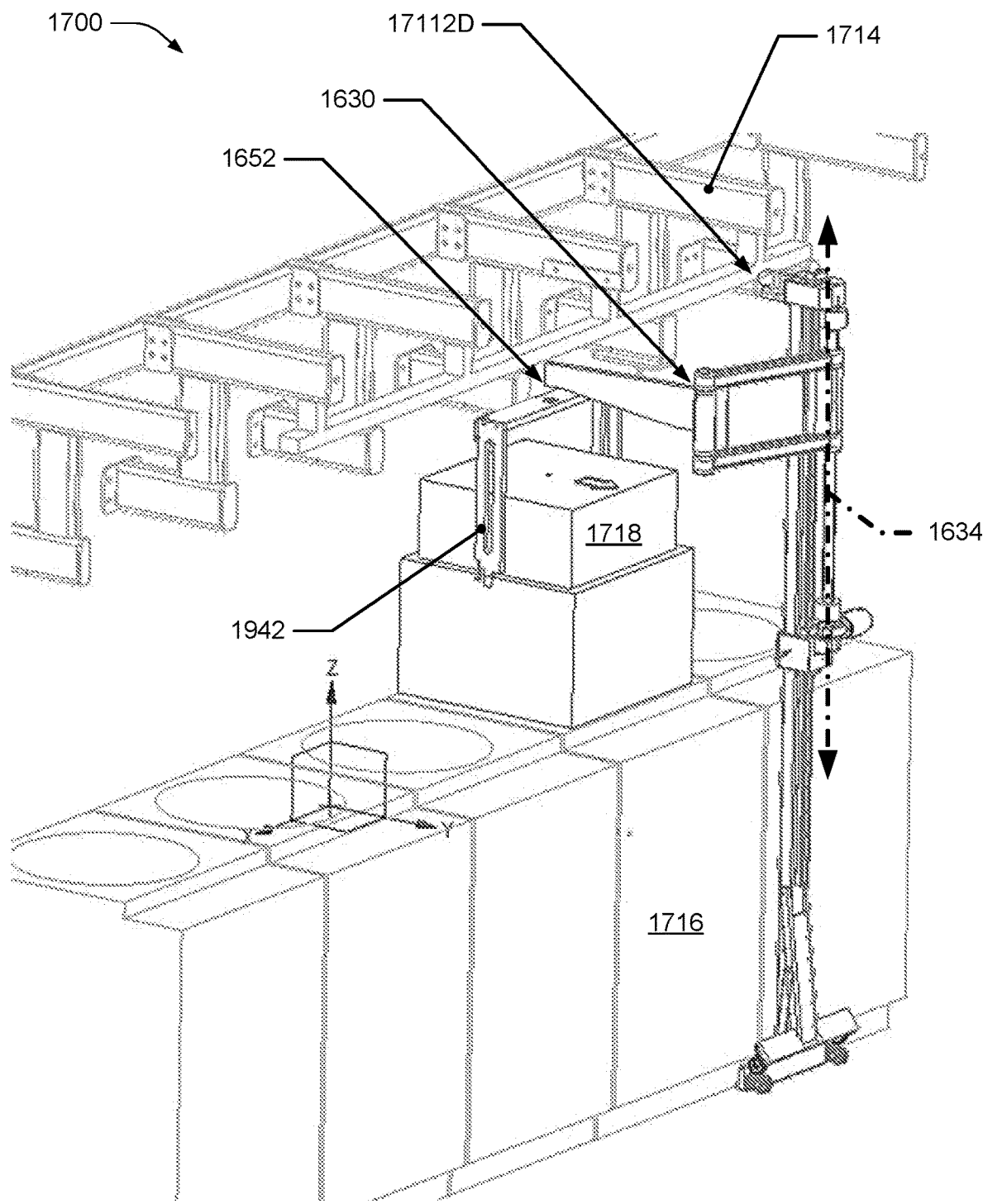
FIG. 19 depicts a perspective view of the second example detachable hoist system connected to the tool of FIGS. 17-18B.

Once connected to the tool, the hoist arm 16130 is moveable so that its hoist feature engagement interface can be moved to engage with the hoisting features of one of the removable components as described above. FIG. 19 depicts a perspective view of the second example detachable hoist system 16116 connected to the tool 1700 of FIGS. 17-18B. As depicted in FIG. 19, the hoist arm 16130 has been moved so that its hoist feature engagement interface 1652 can engage with the hoisting features 1942 of the removable component 1718. Once these items are engaged, the hoist arm 16130 can be moved in order to move the removable component 1718 in a plane horizontal to the vertical axis 1634, which is in the x- and y-axes depicted in the Figure. The vertical translation system 16132 can also raise and lower the removable component along the depicted z-axis or the vertical axis 1634 which may be substantially parallel to each other (e.g., within +/−5% of parallel).

FIGS. 20A and 20B depict a movement sequence of an example removable component by the second example detachable hoist system 16116. These Figures, like above with FIGS. 6A-6E, are a simplified top view of the tool of FIG. 1700 in FIGS. 17-19 with the second example detachable hoist system 16116 attached to the tool 1700; they are viewed at an angle parallel to the vertical axis 1634 of FIGS. 16, 18A, and 19, such that the vertical axis 1634 is perpendicular to and extends into the page. The first plurality 1702 of semiconductor processing chambers 1704 is also seen, along with the base portions 1716 of these chambers, the hoist arm 1730, and the hoist feature engagement interface 1752 engaged with the hoisting features 1742 of the removable component 1718. As seen in FIG. 20B, the hoist arm 16130 is moveable so that the removable component 1718 can be moved off of and away from the processing chamber 1704 in at least a direction perpendicular to the first axis 1706, as indicated by the arrow on the removable component 1718. This movement is enabled by the movement of the links and joints of the hoist arm 16130, including rotation about the vertical axis 1634 and the other axis 16141. In some embodiments, the hoist arm 16130 may only have one link and the removable component 1718 may still be moveable within the plane perpendicular to the vertical axis 1634 like described above, including the examples in which the first carriage remained stationary. This movement of the hoist arm also enables the removable component engaged with the hoist arm to be moved outside the envelope 20170 of the tool, like described above and partially depicted in FIG. 20B.

In some embodiments, the second example detachable hoist system may be configured such that the vertical translation system and the hoist arm are moveable together as a unit along the vertical member. This may allow the second example detachable hoist system to be easily moved around a fabrication facility and compactly stored when not in use. This may also advantageously allow the vertical translation system to be moved out of the way during installation and uninstallation to the tool so that the vertical translation system does not block or impede access to the elevated attachment point. FIG. 21 depicts another configuration of the second example detachable hoist system of FIG. 16. Here, the second example detachable hoist system 16116 includes a slide rail 16145 that is configured to allow the vertical translation system 16132 and the hoist arm 16130 to move together as a unit along the vertical member 16118 along the longitudinal axis 16147 of the vertical member 16118. As seen in FIG. 21, the vertical translation system 16132 and the hoist arm 16130 have been moved together towards the bottom end of the vertical member 16118. This movement may be unpowered in some embodiments while in others, it may be powered by a motor, linear actuator, or other mechanism described herein.

As stated above, the second example detachable hoist system 16116 is able to be moved about the floor of the fabrication facility by positioning the movement mechanism 16126 on the floor of the fabrication facility. In some embodiments, the movement mechanism 16126 may include a collapsible set of wheels 16149 seen in FIG. 21. Here, the collapsible set of wheels 16149 is unfolded which enables all four wheels of the second example detachable hoist system 16116 to be positioned on and supported by the floor so it can be moved around on the floor. The collapsible set of wheels 16149 is not intended to support the load of removable components of the tool but rather is intended to assist with moving the second example detachable hoist system 16116. In FIG. 18A, the collapsible set of wheels 16149 is seen collapsed or folded up in order to reduce the footprint of the installed second example detachable hoist system 16116.

As stated above, the tool may include additional upper and lower attachment points so that the second example detachable hoist system can be positioned at various locations of the tool in order to access all of the tool's semiconductor processing chambers. For example, referring to FIG. 20B, the tool 1700 may include additional upper and lower attachment points around some or all of the semiconductor processing chambers, such as around locations 20150. This enables the second example detachable hoist system 16116 to be detachably connected to the tool 1700 at each of these locations 20150 so that it can access removable components on all of the semiconductor processing chambers 1704A-E. In some embodiments, each pair of upper and lower attachment points may be positioned approximately in-between two side-by-side chambers so that the second example detachable hoist system 16116 can be positioned at one location and access removable components of both the side-by-side chambers. For instance, referring to FIG. 20A, the upper and lower attachment points where the second example detachable hoist system 16116 is attached allow it to access removable components of both semiconductor processing chambers 1704D and 1704E. Accordingly, in some such embodiments, the number of upper and lower attachment point pairs may be one less than the number of chambers in the plurality of semiconductor processing chambers. In FIGS. 20A and 20B, for instance, the plurality 1702 of semiconductor processing chambers has five chambers 1704A-E and there may be four pairs of upper and lower attachment points positioned approximately in-between each of these chambers as seen in FIG. 17 which depicts the four pairs of upper and lower attachment pairs, 17112A-D and 17113A-D, respectively, at locations 20150.

As stated above, the connection between the detachable hoist systems and the tool is reconfigurable which allows the systems to be attached and removed from the tool without destructive means. This may include using bolts, pins, screws, clamps, or other features that can be secured together and removed without destruction to the tool or systems, such as may be caused, for instance, by welding. The detachable hoist systems can therefore be moved into position and attached to the tool for a limited time, such as the time required for servicing or repair, and afterwards they can be detached and moved to other tools or to a separate storage location within the facility.

The detachable hoist systems may also include any of the safety features described above, such as the power cord routed along the hoist arm and safety interlocks.

In addition to the claims listed in this disclosure, the following additional implementations are to be understood to be within the scope of this disclosure:

Implementation 1: A semiconductor processing tool including: a support framework; a first plurality of semiconductor processing chambers arranged along a first axis; a first attachment point connected to the support framework; and a first detachable hoist system, in which each semiconductor processing chamber has a base portion fixedly mounted relative to the support framework and has a removable top cover with one or more hoisting features, the first detachable hoist system includes a vertical member with a top end having a complementary attachment point and with a bottom end having a movement mechanism, the complementary attachment point is detachably connected to first attachment point, the movement mechanism is supported by a floor, the first detachable hoist system further includes a hoist arm connected to the vertical member and having one or more links, the hoist arm is configured to pivot about a vertical axis that is substantially perpendicular to the first axis, and the hoist arm includes a hoist feature engagement interface configured to engage with the hoisting features of any of the removable top covers of the first plurality of semiconductor processing chambers.

Implementation 2: The semiconductor processing tool of implementation 1, in which the first detachable hoist system further includes a vertical translation system configured to cause the hoist arm to translate vertically, relative to the support framework, in a direction parallel to the vertical axis.

Implementation 3: The semiconductor processing tool of implementation 2, in which the first vertical translation system includes a motor configured to provide a first mechanical input to the first vertical translation system, and in which the first mechanical input causes the hoist arm to translate along the vertical member.

Implementation 4: The semiconductor processing tool of implementation 2, in which the first vertical translation system is configured to move, as a unit and together with the hoist arm, along the vertical member.

Implementation 5: The semiconductor processing tool of implementation 1, in which the movement mechanism includes collapsible wheels.

Implementation 6: A semiconductor processing tool including: a support framework having an upper attachment point; a lower attachment point vertically offset below the upper attachment point; a first plurality of semiconductor processing chambers arranged along a first axis; and a detachable hoist system, in which each semiconductor processing chamber has a base portion fixedly mounted relative to the support framework and has a removable component with one or more hoisting features, the detachable hoist system includes a vertical member with a top end having an elevated attachment point, a bottom end having a bottom attachment point, and a movement mechanism, the elevated attachment point is detachably connected to upper attachment point, the bottom attachment point is detachably connected to the lower attachment point, the detachable hoist system further includes: a hoist arm having one or more links and that is configured to pivot about a vertical axis that is substantially perpendicular to the first axis, and a vertical translation system configured to cause the hoist arm to translate vertically, relative to the support framework, in a direction parallel to the vertical axis, and the hoist arm includes a hoist feature engagement interface configured to engage with the hoisting features of any of the removable components of the first plurality of semiconductor processing chambers.

Implementation 7: The semiconductor processing tool of implementation 6, in which the vertical translation system includes a motor configured to provide a first mechanical input to the first vertical translation system, and in which the first mechanical input causes the hoist arm to translate in the direction parallel to the vertical axis.

Implementation 8: The semiconductor processing tool of implementation 7, further including a power source, in which the detachable hoist system further includes an electrical control cable that is connected to the power source, routed along the hoist arm, and terminated by a connector, each removable component further includes an electrical interface configured to be connectable with the connector, and the electrical control cable is of a length that the connector and the hoist feature engagement interface of the hoist arm are only simultaneously engageable with the electrical interface and hoisting features, respectively, of a single one of the semiconductor processing chambers at a time.

Implementation 9: The semiconductor processing tool of implementation 8, further including a controller comprising one or more processors and one or more non-transitory memory devices that store instructions for controlling the one or more processors to: receive information regarding an operational status of each semiconductor processing chamber, and cause a first actuation signal to cause the vertical translation system to operate to be provided by the electrical interface for one of the semiconductor processing chambers only when the information regarding operational status for that semiconductor processing chamber indicates that that semiconductor processing chamber is in a personnel-safe condition.

Implementation 10: The semiconductor processing tool of implementation 8, in which the removable component receives power from the power source through the electrical cable.

Implementation 11: The semiconductor processing tool of implementation 7, in which the vertical translation system is a linear ball screw actuator, a hydraulic actuator, a rack-and-pinion actuator, and a cable hoist.

Implementation 12: The semiconductor processing tool of implementation 6, in which the detachable hoist system further includes a first interlock that is configured to: engage with the hoisting features of any of the removable components of the first plurality of semiconductor processing chambers, and prevent, when not engaged with the hoisting features of one of the removable top covers of the first plurality of semiconductor processing chambers, the first vertical translation system from causing the first hoist arm to translate vertically.

Implementation 13: The semiconductor processing tool of implementation 6, in which the movement mechanism comprises four wheels.

Implementation 14: The semiconductor processing tool of implementation 6, in which the movement mechanism comprises a collapsible set of wheels.

Implementation 15: The semiconductor processing tool of implementation 6, in which the first vertical translation system is configured to move, as a unit and together with the hoist arm, along the vertical member.

Implementation 16: The semiconductor processing tool of implementation 15, in which the vertical member further includes a slide rail along which the first vertical translation system is configured to move.

Implementation 17: The semiconductor processing tool of implementation 6, in which the movement mechanism is not supported by a floor when connected to the lower attachment point and the upper attachment point.

Implementation 18: The semiconductor processing tool of implementation 6, in which the movement mechanism is supported by a floor when connected to the lower attachment point and the upper attachment point.

Implementation 19: The semiconductor processing tool of implementation 6, in which the lower attachment point is vertically offset below the base portions of the plurality of processing chambers.

Implementation 20: The semiconductor processing tool of implementation 6, in which: the support framework further includes a plurality of upper attachment points, the tool further comprises a plurality of lower attachment points offset below the plurality of upper attachment points, the plurality of semiconductor processing chambers includes N processing chambers, the plurality of upper attachment points includes N−1 upper attachment points, and the plurality of lower attachment points includes N−1 lower attachment points.

Implementation 21: The semiconductor processing tool of implementation 6, in which the hoist arm further includes three or more links, a double shoulder joint, and a double elbow joint.

Implementation 22: The semiconductor processing tool of implementation 6, in which the removable component is not a substrate.

Implementation 23: The semiconductor processing tool of implementation 6, in which the hoist arm is not configured to support a substrate.

Implementation 24: The semiconductor processing tool of implementation 23, in which the hoist feature engagement interface is not configured to support a substrate.

The features of the tools described herein provide numerous advantages for lifting and moving removable components over traditional lifting mechanisms. These features allow cluster tools to be positioned closer together because additional Fab floor space is not required to accommodate free-standing hoist mechanisms, the footprint of the tools is either not enlarged or is only marginally enlarged by the inclusion of these features, and removable components can be accessed easier and moved quicker thereby reducing the tool downtime for servicing and maintenance. The ability to control the movement of the carriage and the hoist arm using movement mechanisms and the controller may also enable more efficient, faster, and safer control and movement of the removable components.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein. The term "substantially" herein, unless otherwise specified, means within 5% of the referenced value. For example, substantially perpendicular means within +/−5% of perpendicular.

What is claimed is:

1. A semiconductor processing tool comprising:
an upper support framework;
a first plurality of semiconductor processing chambers arranged along a first axis;
a first linear guide system fixedly supported by the upper support framework and extending along a second axis substantially parallel to the first axis;
a first carriage; and
a controller comprising one or more processors and one or more non-transitory memory devices that store instructions for controlling the one or more processors to receive information regarding an operational status of each semiconductor processing chamber of the first plurality of semiconductor processing chambers, wherein:
each semiconductor processing chamber of the first plurality of semiconductor processing chambers has a base portion fixedly mounted relative to the upper support framework and has a removable top cover with one or more hoisting features,
the first carriage includes a first hoist arm with one or more links,
the first hoist arm is configured to pivot about a vertical axis that is substantially perpendicular to the second axis,
the first carriage is configured to movably engage with the first linear guide system and to translate along the second axis relative to the first linear guide system,
the first hoist arm includes a hoist feature engagement interface configured to engage with the hoisting features of any of the removable top covers of the first plurality of semiconductor processing chambers, and
the first carriage and first hoist arm are movable such that the hoist feature engagement interface can be moved so as to be engaged with the hoisting features of any of the removable top covers of the first plurality of semiconductor processing chambers.

2. The semiconductor processing tool of claim 1, wherein the first carriage further includes a first vertical translation system configured to cause the first hoist arm to translate vertically, relative to the first linear guide system, in a direction parallel to the vertical axis.

3. The semiconductor processing tool of claim 2, further comprising a power source, wherein:
the first vertical translation system includes a motor configured to provide a first mechanical input to the first vertical translation system, wherein the first mechanical input causes the first hoist arm to translate vertically in the direction parallel to the vertical axis,
the first carriage further includes an electrical control cable that is connected to the power source, routed along the first hoist arm, and terminated by a connector,
each removable top cover further includes an electrical interface configured to be connectable with the connector, and
the electrical control cable is of a length that the connector and the hoist feature engagement interface of the first hoist arm are only simultaneously engageable with the electrical interface and hoisting features, respectively, of a single semiconductor processing chamber of the first plurality of semiconductor processing chambers at a time.

4. The semiconductor processing tool of claim 3, wherein the one or more non-transitory memory devices store further instructions for further controlling the one or more processors to
cause a first actuation signal to cause the first vertical translation system to operate to be provided by the electrical interface for one semiconductor processing chamber of the first plurality of semiconductor processing chambers only when the information regarding operational status for that semiconductor processing chamber indicates that that semiconductor processing chamber is in a personnel-safe condition.

5. The semiconductor processing tool of claim 3, further comprising:
a first carriage position sensor configured to generate data about the position of the first carriage along the first linear guide system; and
a controller comprising one or more processors and one or more non-transitory memory devices that store instructions for controlling the one or more processors to:
determine, based on the data generated by the first carriage position sensor, the position of the first carriage along the first linear guide system, and
cause, based on the determination of the position of the first carriage, only the electrical interface of one semiconductor processing chamber of the first plurality of semiconductor processing chambers at a time to be powered.

6. The semiconductor processing tool of claim 5, further comprising an arm position sensor configured to generate data about the position the first hoist arm relative to the semiconductor processing chambers of the first plurality of semiconductor processing chambers, wherein the one or more non-transitory memory devices stores further instructions for controlling the one or more processors to:
- determine, based on the data generated by the arm position sensor, the position of the first hoist arm with respect to each semiconductor processing chamber of the first plurality of semiconductor processing chambers, and
- cause, based on the determination of the position of the first hoist arm and on the determination of the position of the first carriage, only the electrical interface of the semiconductor processing chamber of the first plurality of semiconductor processing chambers that is closest to the hoist feature engagement interface of the first hoist arm to be powered.

7. The semiconductor processing tool of claim 5, wherein the one or more non-transitory memory devices stores further instructions for controlling the one or more processors to cause the first hoist arm to move only on a first side of a vertical plane that passes through the first carriage, is parallel to the vertical axis, and is perpendicular to the second axis.

8. The semiconductor processing tool of claim 3, further comprising:
- an engagement sensor configured to generate data about whether the hoist feature engagement interface of the first hoist arm is engaged with the hoisting features of one of the removable top covers,
- a controller comprising one or more processors and one or more non-transitory memory devices that store instructions for controlling the one or more processors to:
  - determine, based on the data generated by the engagement sensor, whether the hoist feature engagement interface of the first hoist arm is engaged with the hoisting features of one of the removable top covers of the first plurality of semiconductor processing chambers, and
  - cause, in response to determining that the hoist feature engagement interface is engaged with the hoisting features of one of the removable top covers of the first plurality of semiconductor processing chambers, only the electrical interface of the semiconductor processing chamber of the first plurality of semiconductor processing chambers that contains that removable top cover to be powered.

9. The semiconductor processing tool of claim 3, wherein the removable top cover receives power from the power source through the electrical cable.

10. The semiconductor processing tool of claim 2, wherein the first carriage further includes a first interlock that is configured to:
- engage with the hoisting features of any of the removable top covers of the first plurality of semiconductor processing chambers, and
- prevent, when not engaged with the hoisting features of one of the removable top covers of the first plurality of semiconductor processing chambers, the first vertical translation system from causing the first hoist arm to translate vertically.

11. The semiconductor processing tool of claim 2, wherein the first vertical translation system is selected from the group consisting of: a linear ball screw actuator, a hydraulic actuator, a rack-and-pinion actuator, and a cable hoist.

12. The semiconductor processing tool of claim 2, further comprising a controller comprising one or more processors and one or more non-transitory memory devices, wherein:
- the first linear guide system further includes a carriage translation system that is configured to cause the first carriage to translate along the second axis,
- the first carriage further includes a hoist arm movement system that is configured to move the first hoist arm in a plane perpendicular to the vertical axis, and
- the one or more non-transitory memory devices store instructions for controlling the one or more processors to:
  - cause the carriage translation system to move the first carriage along the second axis,
  - cause the hoist arm movement system and the first vertical translation system to move the first hoist arm to engage the hoist feature engagement interface with the hoisting features of one of the removable top covers of the first plurality of semiconductor processing chambers,
  - cause, when the hoist feature engagement interface is engaged with the hoisting features of one of the removable top covers, the first vertical translation system to translate that removable top cover vertically, and
  - cause, when the hoist feature engagement interface is engaged with the hoisting features of one of the removable top covers, the hoist arm movement system to translate that removable top cover in the plane perpendicular to the vertical axis.

13. The semiconductor processing tool of claim 12, wherein the one or more non-transitory memory devices store further instructions for controlling the one or more processors to:
- cause, when the hoist feature engagement interface is engaged with the hoisting features of one of the removable top covers, the hoist arm movement system and the first vertical translation system to move the first hoist arm to disengage the hoist feature engagement interface from the hoisting features of the that removable top cover.

14. The semiconductor processing tool of claim 12, wherein the one or more non-transitory memory devices store further instructions for controlling the one or more processors to:
- cause, when the hoist feature engagement interface is engaged with the hoisting features of one of the removable top covers, the carriage translation system and the hoist arm movement system to translate that removable top cover in the plane perpendicular to the vertical axis.

15. The semiconductor processing tool of claim 1, wherein:
- the semiconductor processing chambers in the first plurality of semiconductor processing chambers are all located within a tool envelope, and
- the first hoist arm is movable such that any of the removable top covers of the first plurality of semiconductor processing chambers can be moved outside the tool envelope.

16. The semiconductor processing tool of claim 1, wherein:
- the first linear guide system further includes a first rail and a second rail that are parallel to each other and offset from each other in a direction parallel to the vertical axis, and
- the first carriage is configured to simultaneously engage with the first rail and the second rail, and to translate along the second axis relative to the first linear guide system while simultaneously engaged with the first rail and the second rail.

17. The semiconductor processing tool of claim 16, wherein the first carriage further includes a first vertical translation system configured to cause the first hoist arm to translate vertically, relative to the first linear guide system, in a direction parallel to the vertical axis below the first linear guide system and above the base portions of the first plurality of semiconductor processing chambers.

18. The semiconductor processing tool of claim 17, wherein the first vertical translation system is further configured to cause the first hoist arm to translate vertically above the first linear guide system.

19. The semiconductor processing tool of claim 1, wherein,
- the first linear guide system is vertically offset above the first plurality of semiconductor processing chambers in a direction parallel to the vertical axis, and
- the first carriage is vertically offset underneath the first linear guide system.

20. The semiconductor processing tool of claim 1, wherein the hoist feature engagement interface is connected with a distal end of the first hoist arm using a joint configured to allow the hoist feature engagement interface to rotate about two or more axes that are perpendicular to the vertical axis.

21. The semiconductor processing tool of claim 20, wherein the joint is a spherical joint.

22. The semiconductor processing tool of claim 20, wherein the joint is further configured to allow the hoist feature engagement interface to rotate about an axis parallel to the vertical axis.

23. The semiconductor processing tool of claim 1, wherein:
- the hoisting feature of each removable top cover includes a pair of saddle posts,
- each saddle post includes a pair of vertical riser rods and a saddle plate capping, and spanning between, the vertical riser rods,
- each saddle plate includes a first mechanical interface feature,
- the saddle posts of each hoisting feature are positioned such that the first mechanical interface features are spaced apart from each other by a first distance,
- the hoist feature engagement interface includes a beam with two second mechanical interface features spaced apart by the first distance, and
- each first mechanical interface feature is complementary to one of the second mechanical interface features.

24. The semiconductor processing tool of claim 1, wherein:
- each semiconductor processing chamber of the first plurality of semiconductor processing chambers includes a removable component that is selected from the group consisting of: one of a radio frequency (RF) generator, a pump, and a cryopump,
- each removable component includes one or more second hoisting features,
- the hoist feature engagement interface of the first hoist arm is further configured to engage with the second hoisting features of any of the removable components of the first plurality of semiconductor processing chambers, and
- the first carriage and first hoist arm are movable such that the hoist feature engagement interface can be moved so as to be engaged with the second hoisting features of any of the removable components of the first plurality of semiconductor processing chambers.

25. The semiconductor processing tool of claim 1, wherein the first hoist arm includes a linear section that is perpendicular to the vertical axis and that includes the hoist feature engagement interface.

26. The semiconductor processing tool of claim 25, wherein:
- the first hoist arm includes a pivot section where the first hoist arm is configured to pivot about the vertical axis, and
- the first hoist arm includes an angled section that spans between the pivot section and the linear section, and that is oriented at an oblique angle with respect to the vertical axis.

27. The semiconductor processing tool of claim 1, wherein the first plurality of semiconductor processing chambers comprises two semiconductor processing chambers.

28. The semiconductor processing tool of claim 27, wherein the first plurality of semiconductor processing chambers comprises three semiconductor processing chambers.

29. The semiconductor processing tool of claim 28, wherein the first plurality of semiconductor processing chambers comprises five semiconductor processing chambers.

30. The semiconductor processing tool of claim 1, further comprising:
- a second plurality of semiconductor processing chambers arranged along a third axis substantially parallel to and offset from the first axis;
- an interior region located in between the first plurality of semiconductor processing chambers and the second plurality of semiconductor processing chambers;
- a second linear guide system fixedly supported by the upper support framework and extending along a fourth axis substantially parallel to the third axis; and
- a second carriage, wherein:
  - the first linear guide system and the second linear guide system are positioned outside of the interior region,
  - each semiconductor processing chamber of the second plurality of semiconductor processing chambers has a second base portion fixedly mounted relative to the upper support framework and has a second removable top cover with one or more second hoisting features,
  - the second carriage includes a second hoist arm with one or more links,
  - the second hoist arm is configured to pivot about a second vertical axis that is perpendicular to the fourth axis,
  - the second carriage is configured to moveably engage with the second linear guide system and to translate along the fourth axis relative to the second linear guide system,
  - the second hoist arm includes a second hoist feature engagement interface configured to engage with the second hoisting features of any of the second removable top covers of the semiconductor processing chambers of the second plurality of semiconductor processing chambers, and the second carriage and the second hoist arm are movable such that the second hoist feature engagement interface can be moved so as to be engaged with the hoisting features of any of the second removable top covers of the semiconductor processing chambers of the second plurality of semiconductor processing chambers.

31. The semiconductor processing tool of claim 30, wherein:

the base portions of the first plurality of semiconductor processing chambers, the second base portions of the second plurality of semiconductor processing chambers, and the interior region are all located within a second envelope, the first hoist arm is movable such that the removable top cover of any of the first plurality of semiconductor processing chambers can be moved outside the second envelope, and the second hoist arm is movable such that the second removable top cover of any of the second plurality of semiconductor processing chambers can be moved outside the second envelope.

32. The semiconductor processing tool of claim 30, wherein:

the second removable top covers are of the same type as the removable top covers, the second hoist feature engagement interface is of the same type as the hoist feature engagement interface, and the second hoisting features are of the same type as the hoisting features.

33. The semiconductor processing tool of claim 1, further comprising a bellows that creates a seal at an interface of the first carriage and the first linear guide system when the first carriage is engaged with the first linear guide system.

34. The semiconductor processing tool of claim 1, further comprising a second carriage, wherein:

the second carriage includes a second hoist arm with one or more links, and the second hoist arm is configured to pivot about a second vertical axis that is perpendicular to the second axis, the second carriage is configured to movably engage with the first linear guide system and to translate along the second axis relative to the first linear guide system, the second hoist arm includes a second hoist feature engagement interface configured to engage with the hoisting features of any of the removable top covers of the first plurality of semiconductor processing chambers, the second carriage and the second hoist arm are movable such that the second hoist feature engagement interface of the second hoist arm can be moved so as to be engaged with the hoisting features of any of the removable top covers of the first plurality of semiconductor processing chambers, and the first linear guide system is further configured so that the first carriage and the second carriage can be simultaneously engaged to the first linear guide system and moveable along the second axis.

35. The semiconductor processing tool of claim 1, wherein the removable top cover is not a substrate.

36. The semiconductor processing tool of claim 1, wherein the first hoist arm is not configured to support a substrate.

37. The semiconductor processing tool of claim 36, wherein the hoist feature engagement interface is not configured to support a substrate.

* * * * *